(12) United States Patent
Nishi

(10) Patent No.: US 7,126,689 B2
(45) Date of Patent: Oct. 24, 2006

(54) EXPOSURE METHOD, EXPOSURE APPARATUS, AND METHOD FOR PRODUCING DEVICE

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 203 days.

(21) Appl. No.: 09/782,062

(22) Filed: Feb. 14, 2001

(65) Prior Publication Data

US 2001/0028456 A1    Oct. 11, 2001

(30) Foreign Application Priority Data

Feb. 15, 2000  (JP) .............................. 2000-041435
Feb. 5, 2001   (JP) .............................. 2001-027940

(51) Int. Cl.
*G01B 11/00*    (2006.01)
*G01B 11/14*    (2006.01)
*G03B 27/32*    (2006.01)
*G03B 27/42*    (2006.01)
*G03F 9/00*     (2006.01)
*G01B 11/02*    (2006.01)

(52) U.S. Cl. ........................ 356/400; 356/614; 355/53; 355/77; 430/22

(58) Field of Classification Search ........ 356/399–401, 356/614; 355/53, 67, 77, 55; 414/222.01, 414/217.01; 378/34; 430/5, 22, 30; 250/548
See application file for complete search history.

(56) References Cited

U.S. PATENT DOCUMENTS

| | | | |
|---|---|---|---|
| 4,776,745 A | * | 10/1988 | Foley .......................... 414/217 |
| 4,897,553 A | | 1/1990 | Nishi |
| 4,980,896 A | * | 12/1990 | Forsyth et al. .............. 372/101 |
| 4,989,031 A | * | 1/1991 | Kamiya ....................... 355/30 |
| 4,999,671 A | * | 3/1991 | Iizuka |
| 5,197,089 A | * | 3/1993 | Baker .......................... 378/34 |
| 5,364,219 A | * | 11/1994 | Takahashi et al. |
| 5,442,163 A | * | 8/1995 | Nakahara et al. |
| 5,498,118 A | * | 3/1996 | Nakahara |
| 5,508,518 A | * | 4/1996 | Kendall .................... 250/492.2 |
| 5,559,584 A | * | 9/1996 | Miyaji et al. ................. 355/73 |
| 5,648,854 A | | 7/1997 | McCoy et al. |

(Continued)

FOREIGN PATENT DOCUMENTS

EP          0 278 462 B1     8/1988

(Continued)

OTHER PUBLICATIONS

U.S. Appl. No. 09/666,407, filed Sep. 20, 2000, Nishi et al.

(Continued)

*Primary Examiner*—Hwa (Andrew) Lee
*Assistant Examiner*—Gordon J. Stock, Jr.
(74) *Attorney, Agent, or Firm*—Oliff & Berridge PLC

(57) ABSTRACT

An exposure apparatus for exposing a substrate with an exposure light beam passing through a mask comprises a movable stage for moving the substrate, a stage chamber for accommodating the movable stage, a transport system for transporting the substrate into the stage chamber, and a first alignment system for performing positional adjustment for the substrate with respect to the movable stage in the stage chamber. The position of an exposure objective delivered from the transport system into the stage chamber can be subjected to positional adjustment by using the first alignment system. The stage chamber and the movable stage can be assembled to a frame of the exposure apparatus in accordance with the module system. The exposure apparatus includes a second alignment system for performing positional adjustment for the substrate installed on the movable stage at an exposure position.

22 Claims, 29 Drawing Sheets

U.S. PATENT DOCUMENTS

| | | | |
|---|---|---|---|
| 5,677,758 A * | 10/1997 | McEachern et al. | 355/75 |
| 5,696,623 A * | 12/1997 | Fujie et al. | 359/350 |
| 5,740,034 A * | 4/1998 | Saeki | 700/59 |
| 5,784,799 A * | 7/1998 | Kato et al. | |
| 5,812,420 A | 9/1998 | Takahashi | |
| 5,825,470 A | 10/1998 | Miyai et al. | |
| 5,909,030 A * | 6/1999 | Yoshitake et al. | 250/492.2 |
| 6,136,168 A * | 10/2000 | Masujima et al. | |
| 6,351,684 B1 * | 2/2002 | Shirley et al. | |
| 6,356,338 B1 * | 3/2002 | Arakawa | 355/30 |
| 6,400,441 B1 | 6/2002 | Nishi et al. | |
| 6,472,840 B1 | 10/2002 | Takahashi | |
| 6,473,157 B1 * | 10/2002 | Nakahara | |
| 6,697,145 B1 * | 2/2004 | Aoyama | 355/53 |
| 6,707,545 B1 * | 3/2004 | Hunter | 356/237.5 |
| 6,777,697 B1 * | 8/2004 | Yui et al. | 250/492.22 |
| 6,842,221 B1 * | 1/2005 | Shiraishi | 355/30 |

FOREIGN PATENT DOCUMENTS

| | | |
|---|---|---|
| EP | 0 439 052 A1 | 7/1991 |
| EP | 0 846 983 A2 | 6/1998 |
| EP | 0 866 374 A2 | 9/1998 |
| EP | 0 867 773 A2 | 9/1998 |
| EP | 0 951 054 A1 | 10/1999 |
| GB | A 2 046 955 | 11/1980 |
| GB | A 2 333 849 | 8/1999 |
| JP | A-2-199814 | 8/1990 |
| JP | A-7-74084 | 3/1995 |
| JP | A-7-240366 | 9/1995 |
| JP | 08083750 A * | 3/1996 |
| JP | A-9-297408 | 11/1997 |
| JP | A-10-55954 | 2/1998 |
| WO | WO 98/40791 | 9/1998 |
| WO | WO 99/53217 | 10/1999 |

OTHER PUBLICATIONS

U.S. Appl. No. 08/395,315.

* cited by examiner

Fig. 9A
Fig. 9C
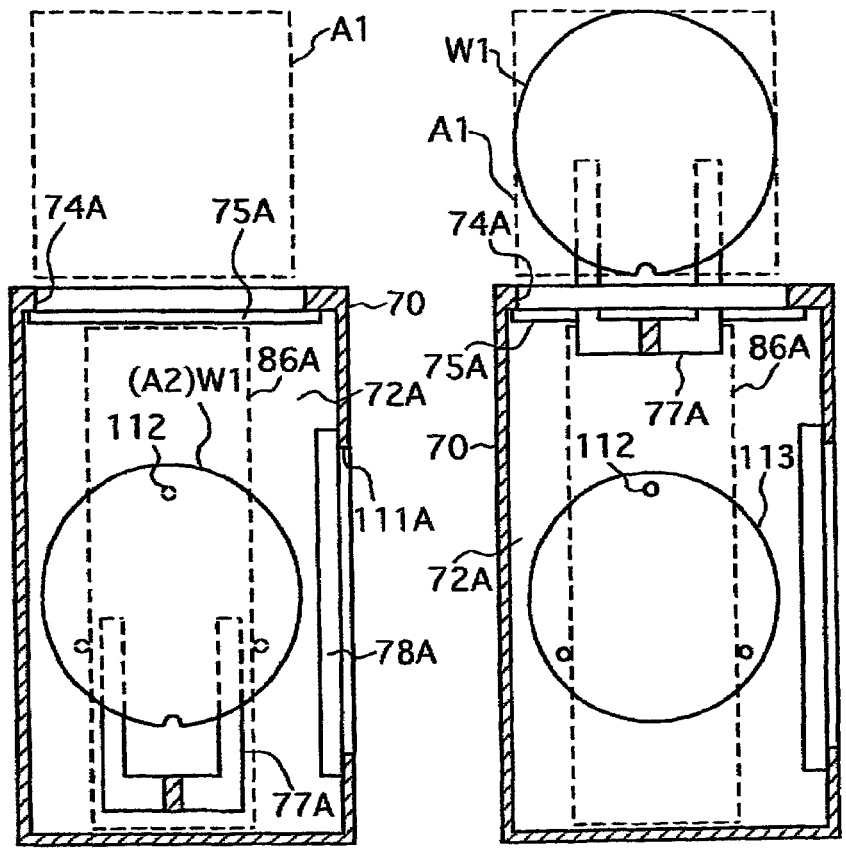
Fig. 9B
Fig. 9D
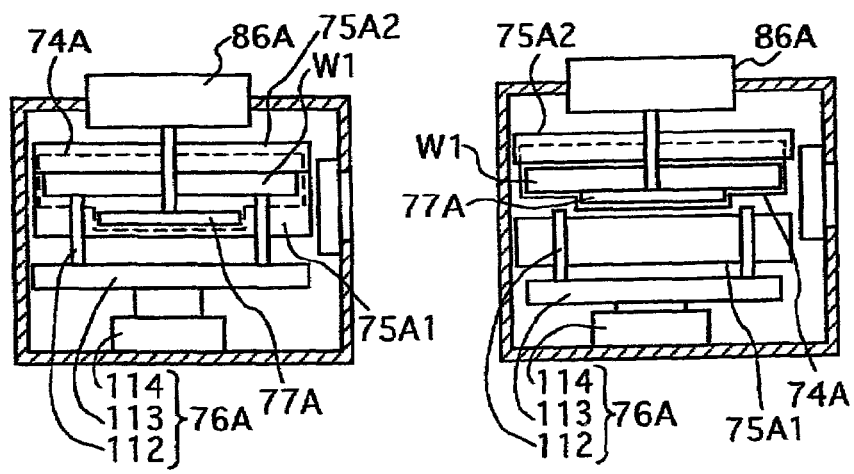

EXPOSURE METHOD, EXPOSURE APPARATUS, AND METHOD FOR PRODUCING DEVICE

BACKGROUND OF THE INVENTION

1. Field of the Invention

The present invention relates to an exposure method and an exposure apparatus to be used when a mask pattern is transferred onto a substrate in the lithography step for producing devices including, for example, semiconductor elements, liquid crystal display elements, plasma display elements, and thin film magnetic heads. The present invention also relates to techniques in relation to the above.

2. Description of the Related Art

High exposure accuracy is required for the exposure apparatus of the full field exposure type (stepper type) or the scanning exposure type (for example, the step-and-scan system) to be used in order to produce semiconductor elements or the like. Therefore, the exposure apparatus adopts arrangements which make it possible to perform highly accurate positioning or highly accurate scanning for the reticle stage system for positioning the reticle as a mask and for the wafer stage system for two-dimensionally moving the wafer as a substrate respectively. The reticle stage system and the wafer stage system have been hitherto assembled successively and directly on a predetermined frame mechanism.

In order to further enhance the resolution, the recent exposure apparatus uses the exposure light beam of the ArF excimer laser (wavelength: 193 nm) having the wavelength shorter than that of the KrF excimer laser (wavelength: 248 nm). Further, it has been investigated to use, for example, the $F_2$ laser beam (wavelength: 157 nm) having the shorter wavelength. However, the vacuum ultraviolet light (VUV light) as described above, which has the wavelength of not more than about 200 nm, has a high absorptance for ordinary air (especially oxygen). Therefore, when the vacuum ultraviolet light is used as the exposure light beam, it is necessary to adopt the following procedure. That is, respective stage systems are tightly enclosed in stage chambers (sub-chambers) respectively, and the gas such as nitrogen gas or helium gas, which has a high transmittance with respect to the vacuum ultraviolet light, is supplied into the stage chambers. Alternatively, the optical path of the exposure light beam at the inside of the stage chambers is substantially in vacuum. Such a procedure is also adopted in the same manner as described above for the space between adjacent lenses which are arranged at the inside of the projection optical system. Accordingly, it is necessary to adopt the following procedure for the exposure apparatus which uses the vacuum ultraviolet light as the exposure light beam. That is, the projection optical system is installed to the frame mechanism, and the respective stage systems are successively assembled. After that, the corresponding stage chambers are installed so as to surround the respective stage systems while maintaining the air-tightness.

The exposure apparatus, which uses, for example, the vacuum ultraviolet light as the exposure light beam as described above, is assembled by installing the stage chambers for maintaining the air-tightness after successively assembling the projection optical system and the respective stage systems with respect to the frame mechanism. However, the method, in which the respective stage systems, the stage chambers, and other components are successively assembled with respect to the single flame mechanism as described above, requires a considerable period of time to assemble and adjust the apparatus. Further, a long period of time is required, for example, to adjust the relative positions between the respective stage systems and the projection optical system. Therefore, an inconvenience arises such that the production cost of the exposure apparatus is increased. Further, the method, in which the respective stage systems, the respective stage chambers, and other components are successively assembled as described above, involves the following inconvenience as well. That is, the adjusting process is also complicated when the maintenance is performed for the exposure apparatus. As a result, the time and the cost required for the maintenance are increased.

Further, when it is intended to easily assemble and adjust the exposure apparatus with the arrangement in which the gas having a high transmittance with respect to the exposure light beam is supplied, for example, to the inside of the respective stage chambers, the following fear occurs. That is, the amount of leak of the gas having the high transmittance is increased, the concentration of the gas is decreased on the optical path of the exposure light beam, and the intensity of the exposure light beam is lowered on the substrate to be exposed therewith. When the gas having the high transmittance is an expensive gas such as helium gas, it is necessary to utilize the gas as effectively as possible in order to suppress the running cost.

Further, for example, when the helium gas is supplied to the optical path of the exposure light beam, the following fear also arises, because the refractive index differs relatively greatly between the helium gas and the atmospheric air (air). That is, if the contamination ratio of the atmospheric air changes on the optical path of the exposure light beam, the measurement accuracy of the laser interferometer for measuring the position of the stage system is lowered. Therefore, even when the assembling and the adjustment for the exposure apparatus are made easy, sufficient air-tightness is required for the optical path of the exposure light beam.

On the other hand, when the assembling and the adjustment for the exposure apparatus are made easy, it is also desirable that the respective stage systems and other components are miniaturized to be as small as possible in order to decrease the installation area (foot print) of the exposure apparatus.

Taking the foregoing problems into consideration, a first object of the present invention is to provide an exposure technique in which stage systems and other components are easily assembled and adjusted.

A second object of the present invention is to provide an exposure technique in which stage systems and other components are easily assembled and adjusted, and a gas, which transmits an exposure light beam, is supplied to at least a part of an optical path of the exposure light beam, wherein the gas is effectively utilized to make it possible to maintain a high concentration of the gas (maintain high air-tightness) on the optical path.

A third object of the present invention is to provide an exposure technique in which stage systems and other components are easily assembled and adjusted, the stage systems and other components can be miniaturized, and positions of movable sections and other components can be correctly measured.

Another object of the present invention is to provide a method for producing devices which makes it possible to produce a variety of devices at the low cost or at the high throughput by using such an exposure technique.

SUMMARY OF THE INVENTION

According to a first aspect of the present invention, there is provided an exposure method for exposing one of a first object and a second object with an exposure light beam passing through the other of them by using an exposure apparatus provided with an airtight stage chamber in which a movable stage is provided, the exposure method comprising:

importing the second object into the stage chamber;

adjusting a position of the second object with respect to the movable stage in the stage chamber;

installing, on the movable stage, the second object which position has been adjusted;

moving the movable stage to adjust the position of the second object with respect to an exposure position; and exposing one of the first object and the second object with the exposure light beam passing through the other of the first object and the second object.

According to the present invention as defined above, the stage chamber and the movable stage accommodated at the inside thereof can be assembles, for example, in accordance with the module system with ease. However, when the stage chamber and the movable stage are incorporated into the exposure apparatus in accordance with the module system, it is feared that the positional relationship between the movable stage and the transport system installed at the outside thereof may be deviated relatively largely from a target positional relationship. Accordingly, the position of the exposure objective (second object, for example, a substrate), which is delivered from the transport system into the stage chamber, is measured, for example, on the contour basis. The positional determination (prealignment) is performed for the exposure objective with respect to the movable stage on the basis of an obtained result of the measurement. Accordingly, the exposure objective can be installed approximately in the target positional relationship with respect to the movable stage. After that, the position of the positional adjustment mark on the exposure objective is detected. The positional adjustment is performed with respect to the exposure position, for example, the projection position of an image of a mask pattern on the basis of the detected result. The second object may be a mask on which a pattern is formed, or a substrate to which an image of the pattern is transferred. Further, the exposure apparatus may include another movable stage which is different from the movable stage, and another airtight stage chamber which is different from the stage chamber and which accommodates the another stage; and the exposure method may further comprise importing the first object into the another stage chamber; performing positional adjustment for the first object with respect to the another movable stage in the another stage chamber; installing, on the another movable stage, the first object which position has been adjusted; and moving the another movable stage to adjust the position of the first object with respect to the exposure position.

In this case, the exposure apparatus may include a transport system for importing the exposure objective into the stage chamber, and an airtight transport chamber for accommodates the transport system; a space between the stage chamber and the transport chamber may be substantially isolated from outside air; a gas, through which the exposure light beam is transmitted, may be supplied into the stage chamber and the transport chamber; and management may be made so that an allowable value of a concentration of an impurity in the gas is higher in the transport chamber than the stage chamber. Accordingly, it is possible to enhance the efficiency of the use of the gas.

According to a second aspect of the present invention, there is provided an exposure method for exposing one of a first object and a second object with an exposure light beam passing through the other of the first object and the second object, the exposure method comprising:

transporting the second object to a movable stage by the aid of a transport system;

adjusting a position of the second object with respect to the transport system on a contour basis during the transport of the second object to the movable stage by the aid of the transport system; and exposing one of the first object and the second object transported to the movable stage with the exposure light beam passing through the other of the first object and the second object.

In the exposure method of the present invention, the positional determination is performed for the second object with respect to the transport system during the transport of the second object. For example, when the movable stage for moving the second object for the purpose of exposure is assembled in accordance with the module system, even if the positional relationship between the movable stage and the transport system is deviated relatively greatly, then the second object is positioned with relatively high accuracy with respect to the transport system in accordance with the method of the present invention. Therefore, the second object can be delivered toward the movable stage in a substantially correct positional relationship as a whole.

In the method of the present invention, the positional adjustment for the second object with respect to the transport system can be performed, for example, on the contour basis. For example, when the second object is a substrate having a notch, the positional adjustment can be performed on the basis of the position of the notch.

The exposure method according to the second aspect may further comprise adjusting the position of the second object with respect to the movable stage on a contour basis to place the second object on the movable stage after the positional adjustment with respect to the transport system; and adjusting the position of the second object placed on the movable stage with respect to the exposure light beam on the basis of a positional adjustment mark formed on the second object. In this case, the positional adjustment (prealignment) is performed on the contour basis during both of the transport and the installation onto the movable stage of the second object as the exposure objective, for example, a substrate. Therefore, even when the movable stage is constructed, for example, in accordance with the module system, the exposure objective can be loaded on the movable stage in a substantially predetermined positional relationship.

In the present invention, it is desirable that when the first object is a mask formed with a pattern, and the second object (exposure objective) is a photosensitive substrate to which the pattern is transferred, then temperature adjustment is performed for the second object during a period between the positional adjustment for the second object with respect to the transport system and the positional adjustment for the second object with respect to the movable stage. For example, when the exposure is performed for the first sheet of the photosensitive substrate on the movable stage, and the second sheet of the photosensitive substrate waits on the transport system, it is feared that the temperature of the photosensitive material on the second sheet of the photosensitive substrate may be gradually changed. In such a case, the temperature of the photosensitive substrate is heated or cooled to obtain a target temperature. Accordingly, it is possible to effectively make the use of the waiting time, and it is possible to use the photosensitive material at a high resolution.

According to a third aspect of the present invention, there is provided an exposure apparatus for exposing one of a first object and a second object with an exposure light beam passing through the other of the first object and the second object, the exposure apparatus comprising:

a movable stage which moves the second object;

a stage chamber in which the movable stage is accommodated;

a transport system which transports the second object into the stage chamber;

a first alignment system which adjusts a position of the second object with respect to the movable stage in the stage chamber; and a second alignment system which adjusts a position of the second object installed on the movable stage with respect to an exposure position.

In the exposure apparatus, the position of the exposure objective delivered from the transport system into the stage chamber can be subjected to the positional adjustment by the aid of the first alignment system. Therefore, when the exposure apparatus is assembled, it is unnecessary to highly accurately adjust the positional relationship between the transport system and the stage chamber. The exposure apparatus is easily assembled. The stage chamber and the movable stage can be also assembled to a frame of the exposure apparatus in accordance with the module system. The second object may be, for example, a photosensitive substrate.

In this arrangement, for example, the first alignment system may include a contour-detecting system which detects position information on a contour of the second object; the second alignment system may include a mark-detecting system which detects position information on a positional adjustment mark on the second object; and the transport system may include a third alignment system which performs positional determination for the second object on a contour basis.

It is desirable that the first alignment system further comprises an importing first arm and an exporting second arm; and each of the first and second arms has a holding section which is slidable in a movement direction of the movable stage. When the second object is placed on the movable stage, the first arm is moved downwardly to place the second object on the movable stage. After that, the first arm is further moved downwardly to allow the holding section to slide outwardly, and then the movable stage is moved. Accordingly, the second object can be easily placed on the movable stage. In order to facilitate the placement of the second object on the movable stage, a holder which holds the second object may be provided on the movable stage, and the holder may be formed with a cutout corresponding to the holding section of the arm.

The exposure apparatus may further comprise a support plate for the second object, wherein when the second object is exported, then the movable stage, on which the second object is placed and which is moved, is suddenly stopped, and thus the second object may be exported onto the support plate.

In place of the first arm and the exporting second arm, the exposure apparatus may further comprise a holding ring which includes pawls for holding the second object at predetermined spacing distances, and a transport arm which supports and transports the holding ring.

The second object may include a first substrate and a second substrate. In this arrangement, the movable stage may include a first movable stage which moves the first substrate, and a second movable stage which moves the second substrate. The first alignment system may have alignment sensors respectively for the first and second movable stage respectively, and the second alignment system may have alignment sensors for the first and second movable stages respectively. When the double-stage structure is provided as described above, it is possible to enhance the throughput in the exposure step.

It is desirable that the exposure apparatus further comprises a transport chamber which accommodates the transport system; a cover member having flexibility which substantially isolates, from atmospheric air, a space between the stage chamber and the transport chamber; and a gas supply unit which supplies, to the inside of the stage chamber and the transport chamber, a gas through which the exposure light beam is transmitted. In this arrangement, the exposure apparatus may further comprise an oxygen concentration sensor arranged for at least one of the stage chamber and the transport chamber.

According to a fourth aspect of the present invention, there is provided an exposure apparatus for exposing one of a first object and a second object with an exposure light beam passing through the other of the first object and the second object, the exposure apparatus comprising:

a movable stage which positions the second object; and a transport system which transports the second object onto the movable stage, wherein the transport system includes:

a handling mechanism which has two or more degrees of freedom of displacement for incorporating the second object from the outside;

a contour-detecting system which detects position information on a contour of the second object held by the handling mechanism; and an arm mechanism which has at least one degree of freedom of displacement for transporting the second object delivered from the handling mechanism in a direction toward the movable stage. In the exposure apparatus described above, the transport system includes the handling mechanism, the contour-detecting system, and the arm mechanism. Accordingly, the second object can be subjected to the positional adjustment with respect to the transport system during the transport of the second object to the movable stage. Therefore, the second object can be delivered to the movable stage in the stage chamber in a desired positional relationship. Further, it is unnecessary to highly accurately adjust the positional relationship between the transport system and the stage chamber when the exposure apparatus is assembled. It is easy to assemble the exposure apparatus. It is also possible to assemble the stage chamber and the movable stage to a frame of the exposure apparatus in accordance with the module system. The second object may be, for example, a photosensitive substrate.

In this arrangement, for example, the handling mechanism may include a rotary stand, a first hand which is rotatably fixed on the rotary stand, and a second hand which is rotatably provided at a tip of the first hand and which has its tip at which the second object is held. The arm mechanism may include an arm which holds the second object, and a driving unit which drives the arm in a direction toward the movable stage.

The exposure apparatus may further comprise an airtight stage chamber which accommodates the movable stage; an airtight first transport chamber which accommodates the handling mechanism; and an airtight second transport chamber which accommodates the arm mechanism; wherein closable openings may be formed respectively between the first transport chamber and a transport line for the second object, between the first transport chamber and the second transport chamber, and between the second transport chamber and the stage chamber. A shutter may be provided for each of the openings. The exposure apparatus may further comprise a temperature control unit which adjusts temperature of the second object, in the second transport chamber.

In order to decrease the concentration of the contaminant in the stage chamber, it is preferable that the opening formed between the second transport chamber and the stage chamber is smaller than the opening formed between the first transport chamber and the second transport chamber.

According to a fifth aspect of the present invention, there is provided an exposure method for exposing a second object with an exposure light beam passing through a first object, the exposure method comprising:

measuring a position of a second substrate as the second object in a second area including an alignment position, concurrently with a procedure of performing positional measurement and exposure for a first substrate as the second object in a first area including an exposure position;

moving the second substrate to the first area so that the first substrate and the second substrate are exchanged with each other; and performing positional measurement and exposure for the second substrate.

According to the exposure method as described above, the first substrate and the second substrate can be moved by using a stage system assembled, for example, in accordance with the module system. In this case, the system is adopted, in which the first substrate and the second substrate are exchanged with each other to perform the exposure. Accordingly, it is possible to miniaturize the stage system, and it is possible to decrease the foot print (installation area).

According to a sixth aspect of the present invention, there is provided an exposure apparatus for exposing a first substrate and a second substrate with an exposure light beam passing through a first object, the exposure apparatus comprising:

a first movable stage on which the first substrate is placed;

a second movable stage on which the second substrate is placed;

a first measuring system which performs positional measurement for the first movable stage or the second movable stage in a first area including an exposure position;

a first driving system which drives the first movable stage or the second movable stage in the first area;

a second measuring system which performs positional measurement for the first movable stage or the second movable stage in a second area including an alignment position;

a second driving system which drives the first movable stage or the second movable stage in the second area; and a stage exchange system which exchanges at least a part of the first movable stage and at least a part of the second movable stage with each other between the first driving system and the second driving system.

According to the exposure apparatus as described above, the first movable stage (or the holding section for the first substrate) and the second movable stage (or the holding section for the second substrate) are exchanged with each other to move the second substrate to the exposure position. Accordingly, the exposure method according to the fifth aspect of the present invention can be carried out.

The stage exchange system may be constructed, for example, as follows. That is, the first movable stage and the second movable stage may be detachable with respect to the first driving system and the second driving system respectively, for example, by the aid of the mechanical connecting force or the magnetic force. For example, an electromagnet may be installed to the inside of one of or both of the first movable stage and the second movable stage or the first driving system and the second driving system. Accordingly, when the stages are exchanged, then the predetermined driving system and the movable stage corresponding thereto may be connected to one another, or they may be separated from each other. Alternatively, the exposure apparatus may further comprise first and second movable exchange tables which place the first movable stage and the second movable stage respectively, and the first and second movable exchange tables may be detachable with respect to the first driving system and the second driving system as described above.

When the first and second movable stages are exchangeable as in the exposure apparatus of the present invention, and interferometers are used for the first measuring system or the second measuring system, then movement mirrors of the interferometers may be provided at opposing ends of the respective stages respectively, in order to reliably measure the positions of the stages. Alternatively, in order that the measuring beam of the first measuring system or the second measuring system is not intercepted during the exchange of the first and second movable stages, at least a part of the first or second measuring system may be provided between the first area and the second area.

The exposure apparatus may further comprise a movable base on which the first movable stage and the second movable stage are slidably placed by the aid of air bearings; and a base plate on which the movable base is slidably placed by the aid of an air bearing. In this arrangement, the movable base may be moved so that the law of conservation of momentum is satisfied with respect to the first movable stage and the second movable stage when the first movable stage and the second movable stage are moved. When the exposure apparatus comprises first and second movable exchange tables on which the first movable stage and the second movable stage are placed respectively, the movable exchange tables are slidably placed on the movable base by the aid of air bearings.

According to a seventh aspect of the present invention, there is provided an exposure apparatus for exposing a second object with an exposure light beam passing through a first object, the exposure apparatus comprising:

a movable stage which positions the second object;

a projection system which projects an image of a pattern on the first object onto the second object;

a mark-detecting system which detects a position of a positional adjustment mark on the second object; and a first measuring system which is arranged integrally with the mark-detecting system and which measures a position of the movable stage in a predetermined direction on the basis of a reference object.

In the exposure apparatus, for example, the first measuring system composed of a laser interferometer is arranged integrally with the mark-detecting system. Therefore, the measuring system can be miniaturized. For example, it is possible to make incorporation into a stage system based on the module system with ease.

In this arrangement, it is desirable that the reference object (reference member) is the projection system. Accordingly, the position of the movable stage can be measured in the predetermined direction on the basis of the exposure position. The exposure apparatus may further comprise a second measuring system which is arranged integrally with the mark-detecting system and which measures a position of the movable stage in a direction intersecting the predetermined direction on the basis of the mark-detecting system. When the movable stage is based on the double-stage system, the mark-detecting system and the first measuring system may include two sets of detectors and measuring units corresponding to the two movable stages. Accordingly, the throughput is improved. Each of the first measuring system and the second measuring system may be an interferometer based on a double-pass system. In order to make it unnecessary to measure the pitching amount of the movable stage, a measuring beam, which is radiated from the interferometer of one of the first measuring system and the second measuring system, is radiated onto a position at the same height as that of the second object placed on the movable stage.

According to an eighth aspect of the present invention, there is provided an exposure apparatus for exposing a second object with an exposure light beam passing through a first object and a projection system, the exposure apparatus comprising:

a base member which is supported by at least one vibration-preventive pedestal;

a movable stage which is slidably placed on the base member and which moves the first object;

a detecting system which detects relative displacement between the base member and the projection system; and a control unit which controls the vibration-preventive pedestal on the basis of a result of detection obtained by the detecting system.

According to the exposure apparatus as described above, when the movable stage is assembled, for example, in accordance with the module system, it is possible to maintain a predetermined state of the relative position between the projection system and the movable stage, especially the base member which moves the movable stage while placing the movable stage thereon. Therefore, it is possible to obtain a high exposure accuracy (for example, positioning accuracy and overlay accuracy). Especially, when the active type vibration-preventive pedestal is adopted, if the base member is vibrated, then the control unit successfully controls the vibration-preventive pedestal to suppress the vibration actively and quickly. Therefore, it is possible to highly accurately control the position of the movable stage which is movable on the base member, especially the position in the direction (Z direction) perpendicular to the movement direction of the stage.

The detecting system may be an interferometer unit including a reflecting mirror which is arranged on an upper surface of the base member, and a reference mirror which is supported by the projection system. The signal, which is detected by the interferometer unit, is processed, for example, by an attitude control system, and the control signal is supplied to the vibration-preventive pedestal.

According to a ninth aspect of the present invention, there is provided an exposure apparatus for exposing a second object with an exposure light beam passing through a first object and a projection system, the exposure apparatus comprising:

a base member;

a movable stage which is movably placed on the base member and which drives the second object;

a stage chamber which accommodates the movable stage;

a support plate which is arranged on the base member via at least one vibration-preventive pedestal and which supports the projection system;

a detecting system which detects relative displacement between the stage chamber and the projection system; and a control unit which controls the vibration-preventive pedestal on the basis of a result of detection obtained by the detecting system.

Also in the exposure apparatus as described above, when the movable stage is assembled, for example, in accordance with the module system, it is possible to maintain a predetermined state of the relative position between the projection system and the air-tight chamber and consequently the movable stage. Therefore, a high exposure accuracy (for example, positioning accuracy and overlay accuracy) is obtained. Especially, when the active type vibration-preventive pedestal is adopted, if the movable stage is vibrated, then the control unit (attitude control system) successfully controls the vibration-preventive pedestal to suppress the vibration actively and quickly.

The detecting system may be an interferometer unit which includes a reflecting mirror provided on an upper surface of the stage chamber and a reference mirror supported by the projection system.

According to a tenth aspect of the present invention, there is provided an exposure apparatus for exposing one of a first object and a second object with an exposure light beam passing through the other of them, the exposure apparatus comprising:

a projection system which projects an image of one of the first object and the second object onto the other;

a movable stage which drives the second object;

a stage chamber which accommodates the movable stage;

a first interferometer at least a part of which is provided in the stage chamber and which detects position information or velocity information on the movable stage; and a second interferometer which detects displacement between the projection system and the part of the first interferometer provided in the stage chamber.

Also in the exposure apparatus as described above, when the movable stage is assembled, for example, in accordance with the module system, it is possible to measure the relative position between the projection system and the movable stage highly accurately. Therefore, a high exposure accuracy (for example, positioning accuracy and overlay accuracy) is obtained.

The exposure apparatus according to the tenth aspect may further comprise another movable stage which drives the first object; another stage chamber which accommodates the movable stage for driving the first object; a third interferometer at least a part of which is provided in the another stage chamber and which detects position information or velocity information on the movable stage; and a fourth interferometer which detects displacement between the projection system and the part of the third interferometer provided in the stage chamber. In the case of the arrangement as described above, when both of the first object (for example, a mask) and the second object (for example, a wafer) are moved by the movable stages accommodated in the stage chambers having air-tightness, any one of the stage chambers can be incorporated into the exposure apparatus in accordance with the module system.

In this arrangement, it is assumed that the measured value of the first interferometer is represented by AA, and the measured value of the second interferometer is represented by A. The position B of the movable stage, which is based on the projection system, can be determined by adding the both measured values as follows.

$$B = A + \Delta A \tag{1}$$

A method for producing a device according to the present invention comprises a step of transferring a mask pattern onto a workpiece by using any one of the exposure methods of the present invention. According to the present invention, a variety of devices can be produced at low cost or at a high throughput.

BRIEF DESCRIPTION OF THE DRAWINGS

FIGS. 9A to 9D illustrate the operation for transporting the wafer effected by a slide arm 77A shown in FIG. 3.

DESCRIPTION OF THE PREFERRED EMBODIMENTS

An exemplary embodiment of the present invention will be explained below with reference to the drawings. In this embodiment, the present invention is applied to a projection exposure apparatus of the scanning exposure system based on the step-and-scan system.

Figure 1:
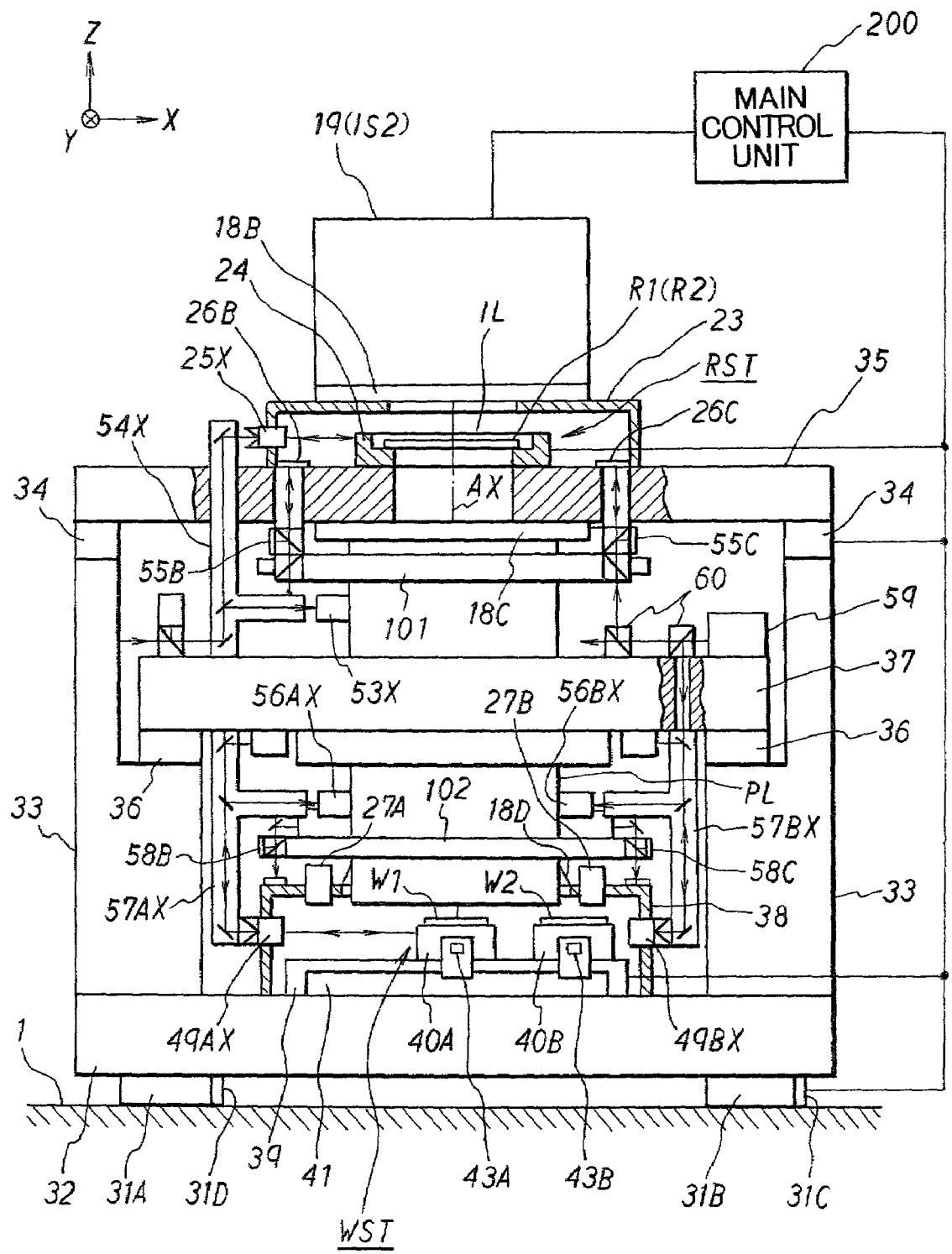
FIG. 1 shows, with partial cutout, a schematic arrangement illustrating an exemplary projection exposure apparatus according to an embodiment of the present invention.
Figure 2:
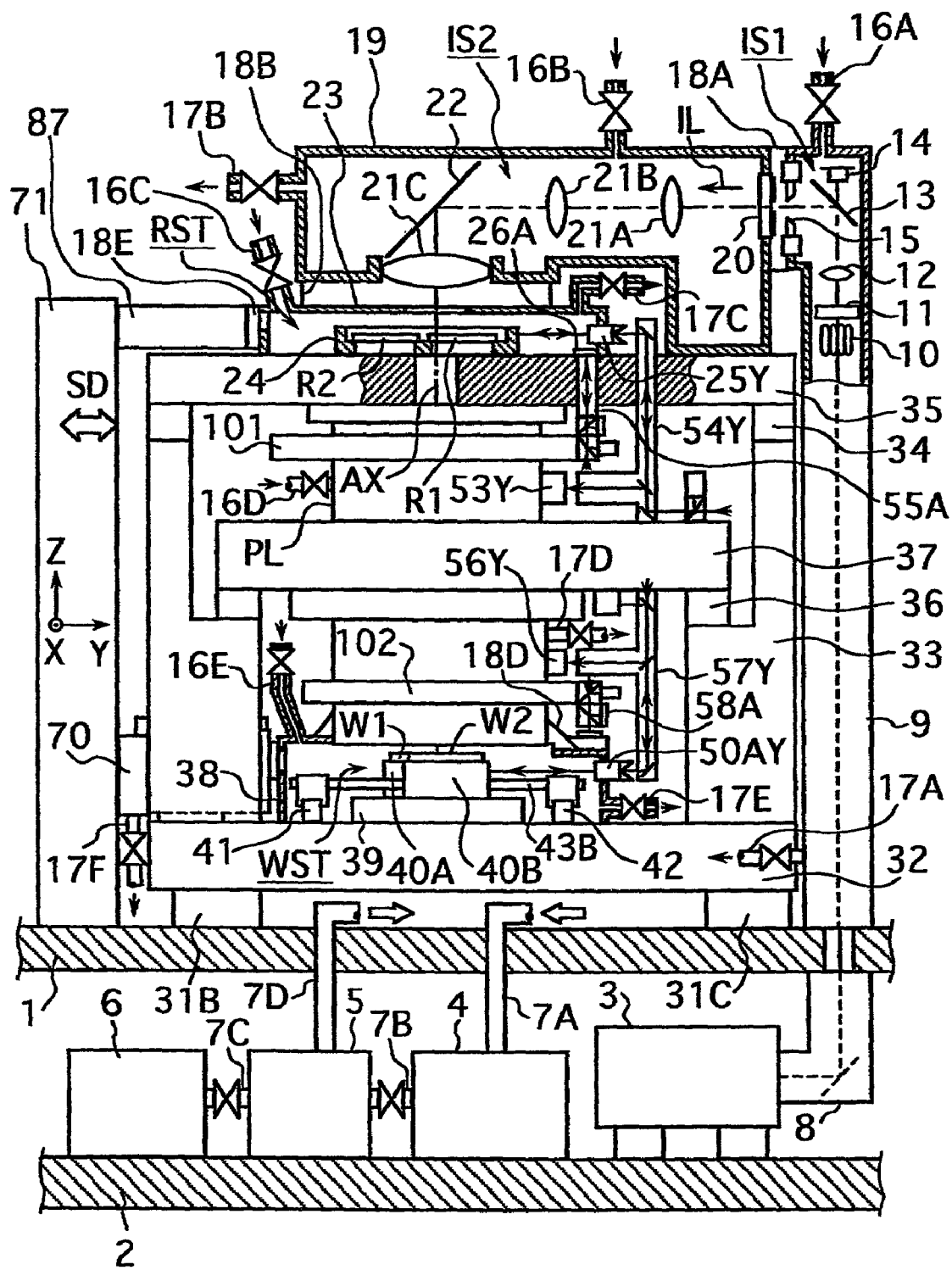
FIG. 2 shows, with partial cutout, a right side view illustrating the projection exposure apparatus shown in FIG. 1.

FIG. 1 shows a front view illustrating the projection exposure apparatus according to this embodiment, and FIG. 2 shows a side view illustrating the projection exposure apparatus. With reference to FIGS. 1 and 2, for example, the major portion of the projection exposure apparatus of this embodiment is installed in a clean room on a floor 1 of a semiconductor-producing factory. An exposure light source 3 of the projection exposure apparatus is installed on a floor 2 in a semi-clean room of a machine room disposed under the floor 1. An ArF excimer laser light source (wavelength: 193 nm) is used as the exposure light source 3. However, it is also possible to use other light sources for emitting the vacuum ultraviolet light (light having a wavelength of not more than 200 nm in this embodiment) including, for example, an $F_2$ laser light source (wavelength: 157 nm), a $Kr_2$ laser light source (wavelength: 146 nm), a high harmonic wave generator of YAG laser, and a high harmonic wave generator of semiconductor laser. However, the present invention is also applicable, for example, even when a KrF excimer laser light source (wavelength: 248 nm) or a mercury lamp (i-ray or the like) is used as the exposure light source 3.

When the vacuum ultraviolet light is used as the exposure light beam as in this embodiment, the vacuum ultraviolet light is greatly absorbed by any light-absorbing substance (impurity) such as oxygen, steam, hydrocarbon gas (for example, carbon dioxide), organic matter, and halide existing in the ordinary atmospheric air. Therefore, in order to avoid the attenuation of the exposure light beam, it is desirable that the concentration of the gas of the light-absorbing substance as described above is suppressed to be not more than about 10 ppm to 100 ppm in average on the optical path of the exposure light beam. Therefore, in this embodiment, the gas on the optical path of the exposure light beam is substituted with a gas through which the exposure light beam is transmitted, i.e., a gas (hereinafter referred to as "purge gas" as well) such as nitrogen ($N_2$) gas or a rare gas including, for example, helium (He), neon (Ne), argon (Ar), krypton (Kr), xenon (Xe), or radon (Rn) which has a high transmittance with respect to the exposure light beam, which is chemically stable, and from which the light-absorbing substance is highly removed. The nitrogen gas and the rare gas are collectively referred to as "inert gas" as well.

The concentration (or its allowable value) of the light-absorbing substance (impurity) may differ depending on the type of the light-absorbing substance existing on the optical path of the exposure light beam. For example, the following procedure may be available. That is, the concentration of the organic light-absorbing substance is managed most strictly so that the concentration is not more than about 1 to 10 ppm. The concentration is mitigated or loosened to follow the above in an order from steam to other substances.

The nitrogen gas can be used in the vacuum ultraviolet region as the gas (purge gas) through which the exposure light beam is transmitted up to a wavelength of about 150 nm. However, the nitrogen gas substantially acts as the light-absorbing substance with respect to the light having a wavelength of not more than about 150 nm. Therefore, it is desirable that the rare gas is used as the purge gas for the exposure light beam having a wavelength of not more than about 150 nm. In view of, for example, the stability of the refractive index and the high coefficient of thermal conductivity, it is desirable to use the helium gas among the rare gases. However, it is allowable that any other rare gas is used when the running cost or the like is considered to be important, because helium is expensive. As for the purge gas, there is no limitation to the supply of the gas of a single type. It is also preferable to supply a mixed gas such as a gas obtained, for example, by mixing nitrogen and helium at a predetermined ratio.

In this embodiment, giving much weight, for example, to the stability of the refractive index (stability of the image formation characteristics) and the high coefficient of thermal conductivity, the helium gas is used as the purge gas. When the helium gas is used, the fluctuation of the refractive index is decreased. Therefore, the measurement accuracy is also improved for various sensors such as alignment sensors and laser interferometers. Accordingly, a main body section of a gas supply apparatus is installed on the floor 2 in order to supply the high purity purge gas to a plurality of air-tight chambers in the projection exposure apparatus and apparatuses provided therewith, and recover and reuse the gas flowing through the air-tight chambers. Further, in this embodiment, the same gas as the purge gas is also used as the gas which is used for the purpose of buffering action for air bearings (air pads) to be used for respective stage systems. The same gas as the purge gas is also supplied to optical paths of measuring beams of laser interferometers to be used as measuring systems, for example, for the respective stage systems. This arrangement is provided with a mechanism for measuring the refractive index of the gas (purge gas) on the optical path of the measuring beam. The measured value obtained by the laser interferometer is corrected on the basis of the measured value obtained by the mechanism for measuring the refractive index.

Even in the case of an identical light-absorbing substance, it is also preferable that its concentration (upper limit value) is allowed to differ in a plurality of air-tight chambers. For example, the following procedure may be available. That is, the concentration is managed most strictly (so that the concentration is low) in the air-tight chambers for accommodating the projection optical system and the illumination system, and the concentration is managed relatively loosely (so that the concentration is high) in other air-tight chambers. In this procedure, the following arrangement may be also available. That is, at least a part of the purge gas, which has been supplied to at least one of the air-tight chambers for the projection optical system and the illumination system, is continuously supplied to another air-tight chamber such as the stage chamber and the air pad described above. In this arrangement, when the concentration of the light-absorbing substance in the another chamber arranged on the downstream side exceeds the upper limit value, it is also preferable that a chemical filter for removing the light-absorbing substance from the purge gas is provided on the upstream side of the another air-tight chamber.

As shown in FIG. 2, the main body section of the gas supply apparatus comprises, for example, a recovery unit 4 including a vacuum pump for recovering the purge gas containing impurities, an accumulating unit 6 for accumulating the high purity purge gas, and a gas-feeding unit 5 for adjusting the temperature of the purge gas and supplying the purge gas to the outside thereof. The recovery unit 4 aspirates the gas in the desired air-tight chamber at a slightly low gas pressure by the aid of a gas discharge tube 7A in accordance with the gas flow control based on a substantially steady flow. The recovery unit 4 separates the purge gas from the aspirated gas, and it temporarily accumulates the separated purge gas. The accumulated purge gas is supplied to the gas-feeding unit 5 via a piping 7B, if necessary. The purge gas, which is compressed at a high pressure at the inside of accumulating unit 6 or which is liquefied and accumulated, is supplied by the accumulating unit 6 to the gas-feeding unit 5 via a piping 7C, if necessary.

The gas-feeding unit 5 adjusts the temperature of the purge gas supplied via pipings 7B, 7C. The gas-feeding unit 5 removes the light-absorbing substance and other components from the purge gas by the aid of a filter section including, for example, a dust-removing filter such as a HEPA filter (high efficiency particulate air-filter), and a chemical filter for removing the light-absorbing substance described above containing minute amounts of organic substances or the like. The purge gas, which is adjusted for the temperature and from which dust is removed, is supplied by the gas-feeding unit 5 at a gas pressure (positive pressure) slightly higher than the atmospheric pressure to the desired air-tight chamber via a gas feed tube 7D.

The following procedure may be adopted. That is, the purge gas, which is recovered by the recovery unit 4, is supplied only to the air-tight chamber in which no trouble occurs even when the concentration of the organic light-absorbing substance or the like is managed relatively loosely, for example, only to the air-tight chamber in which the reticle loader system or the wafer loader system is accommodated. The new purge gas, which is supplied from the accumulating unit 6, is always supplied into the air-tight chamber through which the exposure light beam passes. Accordingly, the concentration of the light-absorbing substance can be accurately controlled to be the preset concentration for each of the air-tight chambers, on condition that the efficiency of use of the purge gas is increased. The embodiment of the present invention is described provided that the purge gas, which is supplied to the exposure apparatus, is recovered. However, the recovering mechanism for the purge gas is not necessarily provided depending on, for example, the type of the purge gas.

The arrangement of the projection exposure apparatus of the embodiment of the present invention will be explained in detail below. At first, with reference to FIG. 2, the exposure light beam (illumination light beam for the exposure) IL, which is composed of a pulse laser beam having a wavelength of 193 nm as the exposure beam radiated from the exposure light source 3 on the floor 2, passes along a mirror disposed in an auxiliary chamber 8, and it is reflected upwardly. The exposure light beam is adjusted for the optical axis by the aid of a beam matching unit (not shown) disposed in a first sub-chamber 9 on the floor 1 located thereover, and it comes into a first illumination system IS1. The cross-sectional configuration of the exposure light beam IL is shaped by the aid of a beam-shaping optical system (not shown). The pulse energy is adjusted by a light-reducing filter section (not shown) capable of switching the transmittance. The exposure light beam IL comes into a fly's eye lens 10 which serves as an optical integrator (uniformizer, or homogenizer) for uniformizing the illuminance distribution.

The outgoing plane of the fly's eye lens 10 is arranged to coincide with the optical Fourier transformation plane (pupil plane of the illumination optical system) with respect to the pattern plane (hereinafter referred to as "reticle plane") of the reticle R1 (or R2) as an object to be illuminated, by the aid of the succeeding optical system. A diaphragm-switching member 11 for determining the numerical aperture of the exposure light beam is arranged on the pupil plane. A plurality of aperture diaphragms (σ diaphragms) for the illumination system including, for example, an aperture diaphragm for normal illumination, an aperture diaphragm for the small coherence factor (σ value), an aperture diaphragm for zonal illumination, and an aperture diaphragm for modified illumination having a plurality of apertures are exchangeably arranged for the diaphragm-switching member 11. The σ diaphragm, which corresponds to the illumination condition, is installed on the optical path of the exposure light beam IL by means of the control performed by a main control system 200 which collectively manages and controls the operation of the entire apparatus.

Alternatively, at least one of optical members including, for example, a diffraction optical element, a zoom lens, and an axicon (conical prism) may be arranged on the side deviated toward the exposure light source from the optical integrator (fly's eye lens 10), in place of the diaphragm-switching member 11 or in combination with the diaphragm-switching member 11 so that the light amount distribution of the illumination optical system on the pupil plane may be variable. Accordingly, it is possible to increase the efficiency of use of the exposure light beam IL.

The exposure light beam IL, which has passed through the (σ diaphragm, passes through a first relay lens system 12, and it comes into a beam splitter 13 having a large reflectance and a small transmittance. The light beam, which is transmitted through the beam splitter 13, is received by an integrator sensor 14 composed of a photoelectric detector. The pulse energy of the exposure light beam IL is controlled so that the proper exposure energy is obtained on the wafer, on the basis of a detection signal obtained by the integrator sensor 14. On the other hand, the illumination light beam IL, which is reflected by the beam splitter 13, substantially horizontally comes into a variable field diaphragm 15 which is arranged at the outgoing plane of the first illumination system IS1. The arrangement plane of the variable field diaphragm 15 is substantially conjugate with the reticle plane. The variable field diaphragm 15 plays a role to open/close the field so that any pattern other than the original circuit pattern is not subjected to exposure upon the start and the end of the scanning exposure for each shot area on the wafer W1 (or W2) as the substrate to be exposed. The first illumination system IS1, which is arranged with the variable field diaphragm 15 with a fear of generating any vibration when the field is opened or closed, is supported in the first sub-chamber 9 separately from the main exposure apparatus body. Therefore, the exposure accuracy for the main exposure apparatus body (for example, the overlay accuracy and the transfer faithfulness) is improved.

The variable field diaphragm 15 is constructed as follows. That is, the field is not only opened/closed upon the start and the end of the scanning exposure, i.e., the width of the field concerning the scanning direction is not only changed, but also the width of the field in the non-scanning direction can be changed depending on the size of the circuit pattern as the transfer objective concerning the non-scanning direction. The first illumination system IS1 is constructed by the components ranging from the beam-shaping optical system (not shown) to the variable field diaphragm 15. The first illumination system IS1 is accommodated in the first sub-chamber 9 having a box-shaped configuration with high air-tightness.

The exposure light beam IL, which has passed through the variable field diaphragm 15, comes into a second illumination system IS2 in a second sub-chamber 19 which is attached to a frame mechanism of the main exposure apparatus body. A fixed field diaphragm 20 is arranged on the incoming plane of the second illumination system IS2, i.e., on the plane which is defocused by a predetermined amount from the conjugate plane with respect to the reticle plane. The fixed field diaphragm 20 is formed with an aperture for defining the illumination area on the reticle plane to be a slender slit-shaped area in the non-scanning direction perpendicular to the scanning direction. The exposure light beam IL, which has passed through the fixed field diaphragm 20, passes through a second relay lens system 21A, a lens system 21B, an optical path-bending mirror 22, and a condenser lens system 21C disposed in the second illumination system IS1, and it illuminates an illumination area on the pattern plane of the reticle R1 as the mask. The second illumination system IS2 is constructed by the components ranging from the fixed field diaphragm 20 to the condenser lens system 21C. The second illumination system IS2 is accommodated in the second sub-chamber 19 having a box-shaped configuration with high air-tightness. The illumination optical system is constructed by the first illumination system IS1 and the second illumination system IS2. The fixed field diaphragm 20 may be arranged on a plane which is separated from the reticle plane by a predetermined spacing distance, not on the plane which is defocused from the conjugate plane with respect to the reticle plane as described above.

Alternatively, a rod lens (inner surface reflection type integrator) may be used as the optical integrator in place of the fly's eye lens 10. The light-outgoing plane of the rod lens is substantially conjugate with the pattern plane of the reticle. Therefore, at least one of the fixed field diaphragm 20 and the movable field diaphragm 15 may be arranged closely to the light-outgoing plane.

With reference to FIG. 1, when the illumination light beam IL is radiated, the image of the pattern in the illumination area of the reticle R1 (or R2) is projected onto the slit-shaped exposure area on the wafer W1 (or W2) applied with photoresist as the photosensitive substrate (sensitive substrate or substrate to be exposed) at a projection magnification $\beta$ ($\beta$ is, for example, ¼-fold or ⅕-fold) via the projection optical system PL as the projection system. In this state, the reticle R1 and the wafer W1 are synchronously moved in the predetermined scanning direction while using the projection magnification $\beta$ as the velocity ratio. Accordingly, the image of the pattern on the reticle R1 is transferred to one shot area on the wafer W1. Upon the exposure, images of patterns on a plurality of reticles may be stitched in accordance with the step-and-stitch system to perform the exposure. The reticles R1, R2 and the wafers W1, W2 correspond to the first object and the second object of the present invention respectively. Each of the wafers W1, W2 is a disk-shaped substrate having, for example, a diameter of 200 mm or 300 mm made of, for example, a semiconductor (silicon or the like) or SOI (silicon on insulator). The reticles R1, R2 and the wafers W1, W2 may be also commonly regarded as the exposure objective.

Those usable as the projection optical system PL include, for example, a cata-dioptric system of the normal cylinder type which is constructed by arranging a plurality of refractive lenses and two concave mirrors having apertures in the vicinity of the optical axis respectively along one optical axis, and a refractive system of the normal cylinder type which is constructed by arranging refractive lenses along one optical axis, as disclosed, for example, in International Publication WO00/39623. Further, for example, as disclosed in Japanese Patent Application No. 2000-59268, it is also allowable to use a cata-dioptric system which includes an optical system having an optical axis directed from the reticle to the wafer and a cata-dioptric optical system having an optical axis substantially perpendicular to the optical axis, for forming an intermediate image at the inside, or a cata-dioptric system of the double-cylinder type as the projection optical system PL. The following explanation will be made assuming that the Z axis extends in parallel to the optical axis AX of the projection optical system PL, the Y axis extends in the scanning direction for the reticle R1 and the wafer W1 during the scanning exposure (i.e., in the direction perpendicular to the plane of paper of FIG. 1) in the plane (substantially coincident with the horizontal plane in this embodiment) perpendicular to the Z axis, and X axis extends in the non-scanning direction (i.e., in the direction parallel to the plane of paper of FIG. 1).

Explanation will now be made for the overall structure of the main exposure apparatus body of this embodiment including the stage system for supporting the reticles R1, R2, the projection optical system PL, and the stage system for supporting the wafers W1, W2. That is, a base plate 32 having high rigidity is installed by the aid of vibration-preventive pedestals 31A to 31D at four places (they may be placed at three places as well) approximately arranged at apexes of a square on the floor 1. A wafer base 39 is installed at a central portion of the base plate 32. The base plate 32 and the wafer base 39 may be regarded to be the first base member. An electric level (not shown) is installed on the base plate 32. Each of the vibration-preventive pedestals 31A to 31D is a vibration-preventive apparatus of the active type including a mechanical damper such as an air damper or a hydraulic pressure damper which endures the heavy weight, and an electromagnetic damper composed of an actuator such as a voice coil motor. For example, the electromagnetic dampers in the four vibration-preventive pedestals 31A to 31D are driven so that the angle of inclination (angle of inclination about two axes) of the base plate 32 with respect to the horizontal plane, which is detected by the level, is included in an allowable range. The hydraulic pressure, the oil pressure or the like of the mechanical damper is controlled, if necessary. In this arrangement, the vibration from the floor, which has a high frequency, is attenuated before transmission to the main exposure apparatus body. The remaining vibration, which has a low frequency, is attenuated by the electromagnetic dampers. In place of the level, it is also preferable to use, for example, a detector (for example, a laser interferometer) for optically detecting the inclination of the corresponding member, or a sensor of the electrostatic capacity type.

Four columns 33 are fixed on the upper surface of the base plate 32 so that they are approximately positioned at four apexes of a square. A support plate 35, which is provided at its central portion with an opening for allowing the exposure light beam IL to pass therethrough, is fixed on the upper surfaces of the four columns 33 by the aid of vibration-preventive pedestals 34 disposed at four places. The vibration-preventive pedestal 34 is an active type vibration-preventive apparatus constructed in the same manner as each of the vibration-preventive pedestals 31A to 31D (however, the resistance to load is small). The columns 33, the vibration-preventive pedestals 34, and the vibration-preventive pedestals 31A to 31D may be arranged at three places so that they are approximately positioned at apexes of a regular triangle. As shown in FIG. 2, the second sub-chamber 19, in which the second illumination system IS2 is accommodated, is installed on the support plate 35.

With reference to FIG. 1 again, the support plate 35 may be also regarded to be the second base member. The upper surface of the support plate 35 is finished into a guide surface which has an extremely excellent flatness. The reticle stage 24 is placed on the guide surface so that the reticle stage 24 is smoothly slidable two-dimensionally by the aid of air bearings. The reticle R1 is held on the reticle stage 24 by means of, for example, vacuum attraction. As shown in FIG. 2, another reticle R2 is held in an area on the reticle stage 24 adjoining the reticle R1 in the scanning direction SD. The apparatus is constructed, for example, so that the double exposure is efficiently executed. As described above, the reticle stage 24 of this embodiment is based on the double-holder system. However, it is also preferable to adopt the double-stage system in which a movable stage is used for each of the reticles. Alternatively, the single-stage system in which one sheet of reticle is held may be adopted.

The reticle stage 24 comprises, for example, a finely movable stage for holding the reticle R1, R2, and a frame-shaped coarsely movable stage for surrounding the finely movable stage. The latter coarsely movable stage is driven in the Y direction (scanning direction) by using an unillustrated linear motor. The former finely movable stage is finely moved in the X direction, the Y direction, and the rotation direction with respect to the coarsely movable stage by using, for example, three actuators. Accordingly, the reticle R1, R2 can be driven highly accurately at a desired scanning velocity in the +Y direction or in the −Y direction, and it is possible to correct the synchronization error. During this process, the reticle stage 24 is driven so that the law of conservation of momentum is satisfied with respect to the Y direction by using an unillustrated driving member. Thus, little vibration is generated during the scanning exposure. An X axis reticle interferometer 25X, which is composed of a laser interferometer, is arranged in order to detect the position information on the reticle stage 24 in the X direction. As shown in FIG. 2, a Y axis reticle interferometer 25Y is arranged in order to detect the position information on the reticle stage 24 in the Y direction. The reticle interferometers 25X, 25Y measure the position of the reticle stage 24 on the basis of internal reference mirrors (not shown) respectively, and they include interferometers having a plurality of axes respectively. Accordingly, they also measure the angle of rotation of the reticle stage 24 about the X axis (pitching amount), the angle of rotation about the Y axis (rolling amount), and the angle of rotation about the Z axis (yawing amount).

In this embodiment, the reticle stage system RST is constructed, for example, by the reticle stage 24 (corresponding to movable stage), a driving unit therefor (not shown), and the reticle interferometers 25X, 25Y. The reticle stage system RST is covered with a box-shaped reticle chamber 23 (first stage chamber) having high air-tightness. A window for allowing the exposure light beam IL to pass therethrough is formed at a central portion of the upper plate of the reticle chamber 23. The positional relationship (positions in the X direction and the Y direction and the angle of rotation) of the reticle stage 24 (reticles R1, R2) with respect to the reticle chamber 23 is measured by the reticle interferometers 25X, 25Y. Parts of the reticle interferometers 25X, 25Y are embedded in the side surface of the reticle chamber 23 respectively. A movement mirror of the corner cube type is provided on the back surface of the reticle interferometer 25X, 25Y. All of the units of the reticle interferometer 25X, 25Y may not be accommodated in the reticle chamber 23. That is, at least a part of the reticle interferometer 25X, 25Y, for example, a part of the optical element may be provided in the reticle chamber 23. This arrangement may be adopted in the same manner, for example, for the wafer interferometer 49AX described later on.

With reference to FIG. 1, a support plate 37, which serves as the third base member, is fixed at four stepped sections at an approximately intermediate height of the four columns 33 by the aid of vibration-preventive pedestals 36. The projection optical system PL is installed by the aid of a flange to a U-shaped cutout (not shown) which is provided for the support plate 37. That is, the projection optical system PL is supported by the support plate 37 so that it may be inserted and withdrawn in the +Y direction (rightward direction in FIG. 2) with respect to the support plate 37. The vibration-preventive pedestal 36 is an active type vibration-preventive apparatus which is constructed in the same manner as the vibration-preventive pedestal 31A to 31D (however, the endurable load is small). When the columns 33 are arranged at three places, the vibration-preventive pedestals 36 are also arranged at three places. In this embodiment, the assembly (32 to 37) of the base plate 32, the wafer base 39, the column 33, the vibration-preventive pedestals 34, the support plate 35, the vibration-preventive pedestals 36, and the support plate 37 may be regarded to be the frame mechanism.

A first fiducial plate 101 and a second fiducial plate 102, each of which has a ring-shaped configuration, are fixed to the upper end portion and the lower end portion of the projection optical system PL so that the support plate 37 is interposed therebetween. A light source unit 59 for the laser interferometers is installed at the end of the upper surface of the support plate 37. The laser beam, which is radiated from the light source unit 59 and which is stabilized for the wavelength (for example, the He-Ne laser beam having a wavelength of 633 nm), is branched into measuring laser beams having a plurality of axes (about eleven axes in this embodiment) by the aid of a branching optical system 60. The first and second laser beams of them are supplied to interferometer units 55B, 55C which are arranged on the first fiducial plate 101 so that the projection optical system PL is interposed therebetween in the X direction. The third laser beam is supplied to an interferometer unit 55A which is arranged at the end of the first fiducial plate 101 in the Y direction (see FIG. 2).

Each of the interferometer units 55A to 55C comprises an optical system for radiating the laser beam onto an internal reference mirror and a plane mirror 26A to 26C (corresponding to a movement mirror (reflecting mirror attached to a movable object, i.e., an object having a position which is intended to be determined) of an ordinary interferometer) arranged on the bottom surface (upper surface of the support plate 35) of the reticle chamber 23, a photoelectric conversion section for photoelectrically converting an interference light beam of the two laser beams from the plane mirror and the reference mirror, and a signal-processing section for determining the displacement amount in the Z direction of the plane mirror with respect to the reference mirror, for example, with a resolution of about 10 nm to 100 nm from a photoelectric conversion signal supplied from the photoelectric conversion section. The information on the displacement amount is supplied to an unillustrated attitude control system. The interferometer units, which will be described later on, are constructed in the same manner as described above. The attitude control unit determines the displacement amount in the Z direction and the angle of inclination about the two axes, i.e., about the X axis and the Y axis, of the guide surface of the reticle stage 24, from the displacements in the Z direction of the plane mirrors 26A to 26C disposed at the three places. The expansion/contraction amounts of the electromagnetic dampers of the four vibration-preventive pedestals 34 are controlled so that the displacement amounts and the angle of inclination are included within allowable ranges. Accordingly, for example, when the support plate 35 is vibrated, for example, by any slight vibration upon the driving of the reticle stage 24, it is possible to suppress the vibration at a high speed. Thus, the exposure accuracy is improved.

With reference to FIGS. 1 and 2, an X axis interferometer unit 54X and a Y axis interferometer unit 54Y for the reticle, which are composed of laser interferometers respectively, are installed at the end in the −X direction and the end in the +Y direction on the upper surface of the support plate 37 respectively. The two laser beams, which are branched by the branching optical system 60, are also supplied to the interferometer units 54X, 54Y. Reference mirrors 53X, 53Y are fixed to the side surfaces in the X direction and the Y direction of the projection optical system PL corresponding thereto. In this arrangement, the interferometer units 54X, 54Y correspond to a part of the main measuring system. The X axis interferometer unit 54X measures the displacement amount in the X direction of a corner cube type movement mirror fixed to the back surface of the reticle interferometer 25X on the basis of the reference mirror 53X. The Y axis interferometer unit 54Y measures the displacement amount in the Y direction of a corner cube type movement mirror fixed to the back surface of the reticle interferometer 25Y on the basis of the reference mirror 53Y. Measured values are supplied to the main control system 200. The interferometer units 54X, 54Y have measuring axes of a plurality of axes. The main control system 200 calculates, based on the supplied measured values, the positional discrepancy amounts ($\Delta XR1$, $\Delta YR1$) in the X direction and the Y direction and the angle of rotation $\Delta\theta R1$ of the reticle interferometers 25X, 25Y, and consequently those of the reticle chamber 23 on the basis of the projection optical system PL.

The positions of the reticle stage 24 (reticles R1, R2) in the X direction and the Y direction and the angle of rotation $\theta R1$ thereof, which are measured by the reticle interferometers 25X, 25Y and which are based on the reticle chamber 23, are also supplied to the main control system 200. The main control system 200 calculates the positions (XR2, YR2) in the X direction and the Y direction and the angle of rotation $\theta R2$ of the reticle stage 24 on the basis of the projection optical system PL in accordance with the following arithmetic operation.

$$XR2 = XR1 + \Delta XR1, \quad YR2 = YR1 + \Delta YR1 \quad (2A)$$

$$\theta R2 = \theta R1 + \Delta\theta R1 \quad (2B)$$

The main control system 200 controls the position and the velocity of the reticle stage 24 on the basis of the positions (XR2, YR2) and the angle of rotation $\theta R2$ calculated as described above. Accordingly, the reticle stage 24 can be driven highly accurately on the basis of the projection optical system PL, irrelevant to the structure in which the reticle stage 24 is tightly enclosed in the reticle chamber 23.

In order to perform the alignment for the wafer, alignment sensors 27A, 27B, which are based on the off-axis system and based on the image formation system, are fixed on the side surfaces in the −X direction and the +X direction at the lower end of the projection optical system PL. Although not shown, a reticle alignment microscope is arranged over the reticle stage 23 in order to perform the alignment for the reticle. All of the reticle alignment microscope or a part of the reticle alignment microscope may be arranged in the reticle chamber 23. However, all of the reticle alignment microscope may be arranged at the outside of the reticle chamber 23. When the alignment light beam having the same wavelength as that of the exposure light beam is used, it is desirable that all of the optical paths for the alignment light beam of the reticle alignment microscope are substituted with the purge gas.

Those of the type other than the image formation system may be used as the alignment sensor 27A, 27B. That is, it is possible to use a sensor based on, for example, the two-light flux interference system for performing detection by allowing at least a pair of diffracted light beams (for example, in the same order) generated from a diffraction grating-shaped mark to interfere (for example, the LIA system) or the laser step alignment system (LSA system) for relatively scanning a slit-shaped mark and a slit beam.

With reference to FIGS. 1 and 2, the upper surface of the wafer base 39 fixed on the base plate 32 is machined into a guide surface having an extremely excellent flatness. A first wafer stage 40A and a second wafer stage 40B as the movable stage are placed on the guide surface so that they are slidable smoothly by the aid of air bearings respectively and two-dimensionally along X axis guide members 41, 42 and Y axis guide member 43A, 43B respectively. The first wafer W1 and the second wafer W2 are held on the wafer stages 40A, 40B respectively by means of, for example, vacuum attraction. The wafer stages 40A, 40B are movable continuously in the Y direction, for example, by the aid of linear motors, and they are movable in a stepping manner in the X direction and in the Y direction. During this process, the wafer stages 40A, 40B are driven so that the law of conservation of momentum is satisfied in the X direction and the Y direction by the aid of the X axis guide members 41, 42 and the Y axis guide members 43A, 43B to be moved in opposite directions respectively. Thus, the apparatus is constructed such that little vibration is generated during the stepping movement and during the scanning exposure.

A Z leveling mechanism (sample stand), which is disposed in each of the wafer stages 40A, 40B, is constructed so that it is capable of making displacement in the Z direction of the wafer W1, W2 and inclination about the two axes (i.e., about the X axis and the Y axis) in order to perform the leveling and the focusing. As described above, the wafer stage of this embodiment is based on the double-wafer stage system. In order to detect the position information in the X direction on the wafer stages 40A, 40B, X axis wafer interferometers 49AX, 49BX, which are composed of laser interferometers, are arranged so that they are opposed to one another as shown in FIG. 1. In order to detect the position information in the Y direction on the wafer stages 40A, 40B, a Y axis wafer interferometer 50AY is arranged as shown in FIG. 2. As for the Y axis interferometer, those corresponding to three axes are actually arranged while being separated from each other by predetermined spacing distances in the X direction (as described in detail later on).

Each of the wafer interferometers 49AX, 49BX, 50AY measures the position of the wafer stage 40A, 40B on the basis of an internal reference mirror (not shown), and each of them is provided with the interferometer having a plurality of axes. Accordingly, the angle of rotation about the X axis (pitching amount), the angle of rotation about the Y axis (rolling amount), and the angle of rotation about the Z axis (yawing amount) of the wafer stage 40A, 40B are also measured thereby. As for the reticle stage 24 and the wafer stages 40A, 40B, it is also preferable that the angle of rotation thereof (pitching amount or rolling amount) is measurable only in the direction in which any Abbe error is generated, or in the direction (axis) in which it is feared that the measurement error exceeds a predetermined allowable value.

In this embodiment, the wafer stage system WST is constructed, for example, by the wafer stages 40A, 40B, the driving units therefor (for example, X axis guide members 41, 42, and Y axis guide members 43A, 43B), and the wafer interferometers 49AX, 49BX, 50AY. The wafer stage system WST is covered with the box-shaped wafer chamber 38 (second stage chamber) having high air-tightness. The tip of the projection optical system PL is inserted into a central opening of the upper plate of the wafer chamber 38. The positional relationship of the wafer stages 40A, 40B (wafers W1, W2) (positions in the X direction and the Y direction and angle of rotation) with respect to the wafer chamber 38 is measured by the wafer interferometers 49AX, 49BX, 50AY. Parts of the wafer interferometers 49AX, 49BX, 50AY are embedded in the side surface of the wafer chamber 38 respectively.

With reference to FIGS. 1 and 2, the sixth and seventh laser beams of the plurality of laser beams, which are branched by the branching optical system 60, are supplied to interferometer units 58B, 58C which are arranged on the second fiducial plate 102 so that the projection optical system PL is interposed therebetween in the X direction. The eighth laser beam is supplied to an interferometer unit 58A which is arranged at the end in the Y direction of the second fiducial plate 102.

Each of the interferometer units 58A to 58C measures the displacement amount in the Z direction of a plane mirror (corresponding to a movement mirror of an ordinary interferometer) arranged on the upper surface of the wafer chamber 38 with respect to an internal reference mirror, i.e., the displacement amount in the Z direction of the projection optical system PL with respect to the wafer stage 40A, 40B. The information on the displacement amount is supplied to the unillustrated attitude control system. The attitude control system determines the displacement amount in the Z direction and the angle of rotation about the two axes, i.e., about the X axis and the Y axis of the projection optical system PL from the displacement in the z direction at the three places. The expansion/contraction amounts of the electromagnetic dampers of the four vibration-preventive pedestals 36 are controlled so that the displacement amount and the angle of inclination are included within allowable ranges. Accordingly, for example, when the support plate 37 (projection optical system PL) is vibrated by any slight vibration from the outside, it is possible to suppress the vibration at a high speed. Thus, the exposure accuracy is improved.

With reference to FIGS. 1 and 2, interferometer units 57AX, 57BX for the X axis and an interferometer unit 57Y for the Y axis for the wafer, which are composed of laser interferometers respectively, are installed at the ends in the ±X direction and at the end in the +Y direction on the bottom surface of the support plate 37. The three laser beams, which are branched by the branching optical system 60, are also supplied to the interferometer units 57AX, 57BX, 57Y. Reference mirrors 56AX, 56BX, 56Y are fixed on the side surfaces in the X direction and the Y direction of the projection optical system PL corresponding thereto. In this arrangement, the interferometer units 57AX, 57BX, 57Y correspond to a part of the main measuring system. The X axis interferometer units 57AX, 57BX measure the displacement amounts in the X direction of corner cube type movement mirrors fixed to the back surfaces of the wafer interferometers 49AX, 49BX on the basis of the reference mirrors 56AX, 56BX respectively. The Y axis interferometer unit 57Y measures the displacement amount in the Y direction of a corner cube type movement mirror fixed to the back surface of the wafer interferometer 50AY on the basis of the reference mirror 56Y. Measured values are supplied to the main control system 200. The interferometer units 57AX, 57BX, 57Y have a plurality of measuring axes. Based on the supplied measured values, the main control system calculates the positional discrepancy amounts ($\Delta XW1$, $\Delta YW1$) in the X direction and the Y direction and the angle of rotation $\Delta \theta W1$ of the wafer interferometer 49AX, 50AY, and consequently those of the wafer chamber 38 on the basis of the projection optical system PL. Concurrently therewith, the positional discrepancy amounts ($\Delta XW2$, $\Delta YW2$) in the X direction and the Y direction and the angle of rotation $\Delta \theta W2$ of the wafer interferometer 49BX, 50AY are also calculated.

The positions (XW1, YW1) in the X direction and the Y direction of the first wafer stage 40A (wafer W1) and the angle of rotation $\theta W1$, which are based on the wafer chamber 38 to be measured by the certain wafer interferometers 49AX, 50AY, are also supplied to the main control system 200. The main control system 200 calculates the positions (XW3, YW3) in the X direction and the Y direction and the angle of rotation $\theta W3$ of the wafer stage 40A on the basis of the projection optical system PL in accordance with the following arithmetic operation.

$$XW3 = XW1 + \Delta XW1, \quad YW3 = YW1 + \Delta YW1 \tag{3A}$$

$$\theta W3 = \theta W1 + \Delta \theta W1 \tag{3B}$$

The main control system 200 controls the position and the velocity of the wafer stage 40A on the basis of the positions (XW3, YW3) and the angle of rotation $\theta W3$ calculated as described above. Similarly, the positions (XW2, YW2) in the X direction and the Y direction and the angle of rotation $\theta W2$ of the second wafer stage 40B (wafer W2) based on the wafer chamber 38, which are measured by the other wafer interferometers 49BX, 50AY, are corrected with the positional discrepancy amounts ($\Delta XW2$, $\Delta YW2$) and the angle of rotation $\Delta \theta W2$ to obtain the coordinate on the basis of which the position and the velocity of the second wafer stage 40B are controlled. Accordingly, it is possible to highly accurately drive the wafer stages 40A, 40B on the basis of the projection optical system PL, irrelevant to the structure in which the wafer stages 40A, 40B are tightly enclosed in the wafer chamber 38.

As having been already explained above, the reticle stage 24 in the reticle chamber 23 is also driven highly accurately on the basis of the projection optical system PL. Therefore, in this embodiment, all of the reticle stage 24 in the reticle chamber 32 and the wafer stages 40A, 40B in the wafer chamber 38 are driven while highly accurately maintaining the relative positional relationship on the basis of the projection optical system PL, i.e., on the basis of the identical reference. Accordingly, the high exposure accuracy (for example, the overlay accuracy and the transfer faithfulness) is obtained when the wafer W1, W2 is exposed with the image of the pattern on the reticle R1, R2. The wafer stage system WST of this embodiment is based on the double-wafer stage system. For example, it is possible to perform the exchange and the alignment for the wafer W2 on the side of the second wafer stage 40B during the scanning exposure for the wafer W1 on the side of the first wafer stage 40A. Therefore, it is possible to obtain the high throughput.

For example, the optical paths of the interferometer units 54X, 54Y at the outside of the reticle chamber 23 described above and the interferometer units 57AX, 57BX, 57Y at the outside of the wafer chamber 38 are actually tightly enclosed by an unillustrated cylindrical cover. The purge gas is supplied to the inside thereof.

The light source unit 59 shown in FIG. 1 may be provided on the support plate 37 with a heat-insulating material intervening therebetween in order to prevent the heat from the light source unit 59 from transmission to the projection optical system PL. Further, in order to reduce the influence of the heat, for example, the light source unit 59 may be installed at the outside of the main exposure body section. This arrangement may be adopted in the same manner, for example, for the receiver (light-receiving element) of the interferometer unit. Further, the number of the light source unit 59 is not limited to one. Two or more of the light source units 59 may be provided so that they are separately used, for example, for the reticle chamber 23 (reticle stage system RST) and for the wafer chamber 38 (wafer stage system WST).

With reference to FIG. 2, an interface column 71, in which, for example, a reticle library and a wafer cassette are arranged in the same environment as that of the atmospheric air (i.e., air in the clean room), is installed on the floor 1 at the side surface in the −Y direction of the base plate 32 of the projection exposure apparatus. A box-shaped reticle loader chamber 87 having high air-tightness is arranged between the upper end of the interface column 71 and the reticle chamber 23 disposed on the support plate 35. A box-shaped wafer loader chamber 70 having high air-tightness is arranged between the lower end of the interface column 71 and the wafer chamber 38 disposed on the base plate 32. A reticle loader system (not shown), which is used to deliver the reticle between the reticle library and the reticle stage system RST, is installed in the reticle loader chamber 87. A wafer loader system, which is used to deliver the wafer between the wafer cassette and the wafer stage system WST, is installed in the wafer loader chamber 70.

When the cassette (reticle library) for accommodating the reticle and the cassette (wafer cassette) for accommodating the wafer are those of the tightly closed type, it is also preferable that the inside of the cassette is substituted with the purge gas. In this arrangement, it is desirable that the reticle or the wafer in the cassette is capable of being imported into the air-tight chamber (reticle chamber 23, wafer chamber 38) substituted with the purge gas, without allowing the reticle or the wafer in the cassette to make contact with the atmospheric air (air). It is desirable that the inner wall of the member for forming the space (air-tight chamber) to which the purge gas is supplied is formed of a material involving little gas release, or it may be coated with a material involving little gas release. This arrangement may be also adopted in the same manner for the inside of the reticle loader chamber 87 and the wafer loader chamber 70. It is also desirable that the constitutive members of the mechanical sections installed in the air-tight chambers are formed of a material involving little gas release, or they are coated with a material involving little gas release.

The vacuum ultraviolet light is used as the exposure light beam IL in the projection exposure apparatus of this embodiment. Therefore, in order to increase the illuminance on the wafer W1, W2 by increasing the transmittance of the exposure light beam IL so that the high throughput is obtained, the purge gas (helium gas in this embodiment) having a high transmittance is supplied to the optical path of the exposure light beam IL. That is, with reference to FIG. 2, the high purity purge gas, which has passed through the gas-feeding unit 5 and the gas feed tube 7D, is supplied via valve-equipped gas feed tubes 16A, 16B, 16C, 16D, 16E to the inside of the first sub-chamber 9 (which communicates with the auxiliary chamber), the second sub-chamber 19, the reticle chamber 23, the projection optical system PL, and the wafer chamber 38 respectively. The purge gas containing any impurity, which has flown through the inside of the first sub-chamber 9, the second sub-chamber 19, the reticle chamber 23, the projection optical system PL, and the wafer chamber 38, passes through the gas discharge tube 7A via valve-equipped gas discharge tubes 17A, 17B, 17C, 17D, 17E respectively, and it is recovered in the recovery unit 4.

In this arrangement, the valves, which are provided for the gas feed tubes 16A to 16E and the gas discharge tubes 17A to 17E, are valves which are electromagnetically openable and closable respectively. The opening/closing operations of them are controlled mutually independently by a purge gas control system (not shown) composed of a computer. The operations of the recovery unit 4, the gas-feeding unit 5, the accumulating unit 6 are also controlled by the purge gas control system. The apparatus is constructed so that the purge gas may be supplied at a desired flow rate to any one of the inside of the sub-chamber 9, 19, the inside of the reticle chamber 23, the inside of the wafer chamber 39, and the inside of the projection optical system PL (for example, a plurality of lens chambers) in accordance with the supply operation for the purge gas from the gas-feeding unit 5, the recovery operation for the gas effected by the recovery unit 4, and the selective opening/closing operations for the valves. The temperature, the pressure, and optionally the humidity of the purge gas can be controlled, for example, in accordance with the output of an environment sensor arranged in the vicinity of the blow port communicating with each of the air-tight chambers.

In this arrangement, the space between the first sub-chamber 9 and the second sub-chamber 19, the space between the second sub-chamber 19 and the reticle chamber 23, the space between the reticle chamber 23 and the upper end of the projection optical system PL, and the space between the projection optical system PL and the wafer chamber 38 are tightly closed by film-shaped soft shield members 18A, 18B, 18C, 18D each of which has large flexibility to be isolated from the atmospheric air and each of which has high shielding performance for the gas. For example, the soft shield member 18A corresponds to the covering member of the present invention. For example, the soft shield member 18A is formed as follows. That is, a protective film having good expansion/contraction property (for example, polyethylene) and a film material having good gas barrier property (for example, ethylene vinyl alcohol resin (EVOH resin)) are subjected to the laminate processing (multilayered processing) to attach, to the inner surface thereof, a stabilized film involving extremely small amount of gas release (for example, film of metal such as aluminum). Accordingly, the optical path for the exposure light beam IL, which ranges from the exposure light source 3 to the wafer W1, W2 as the substrate to be exposed, is tightly enclosed approximately completely. Accordingly, the gas containing the light-absorbing substance from the outside scarcely makes contamination with respect to the optical path for the exposure light beam IL. The attenuation amount of the exposure light beam is suppressed to be extremely low.

An oxygen concentration sensor for detecting the concentration of oxygen gas in the light-absorbing substance is installed at the inside of each of the sub-chambers 9, 19, the reticle chamber 23, the projection optical system PL, and the wafer chamber 38. The oxygen concentration is continuously measured at a predetermined sampling rate, and it is supplied to the purge gas control system. In this arrangement, the concentration of the light-absorbing substance is representatively measured by measuring the oxygen concentration. Those usable as the oxygen concentration sensor include, for example, an oxygen concentration meter based on the polarograph, an oxygen concentration meter based on zirconia, and an oxygen sensor based on the yellow phosphorus light emission. However, it is also preferable to measure the concentration of the light-absorbing substance such as steam and carbon dioxide singly or together therewith. The measured value of the concentration of the light-absorbing substance in each of the air-tight chambers is supplied to the purge gas control system. When the light-absorbing substance, which is at a concentration of not less than a predetermined allowable concentration, is detected in any one of the air-tight chambers, the purge gas is supplied into the air-tight chamber in which the light-absorbing substance has been detected in accordance with the command of the purge gas control system until the concentration of the light-absorbing substance is not more than the allowable concentration.

Each of the soft shield members 18A to 18D is made of, for example, synthetic resin, and it has large flexibility. Therefore, no vibration is mutually transmitted between the adjacent air-tight chambers, for example, between the sub-chamber 19 and the reticle chamber 23, between the reticle chamber 23 and the projection optical system PL, and between the projection optical system PL and the wafer chamber 38. Therefore, the influence of the vibration is mitigated on condition that the air-tightness is maintained.

Further, in this embodiment, the soft shield member 18E is provided so that the space between the reticle chamber 23 and the reticle loader chamber 87 is tightly closed. The reticle loader chamber 87 is also filled with a part of the purge gas which is supplied to the reticle chamber 23. Therefore, when the reticles R1, R2 are exchanged by the aid of the reticle loader system, the concentration of the purge gas in the reticle chamber 23 is not greatly lowered, even when the shutter at the transport port of the reticle loader chamber 87 is opened. In this arrangement, a concentration sensor for the light-absorbing substance is also arranged at the inside of the reticle loader chamber 87, and the allowable concentration of the light-absorbing substance in the reticle loader chamber 87 is set to be higher (looser) than the allowable concentration of the light-absorbing substance in the reticle chamber 23. Even if the concentration of the light-absorbing substance in the reticle chamber 23 is not more than the allowable concentration, when the concentration of the light-absorbing substance in the reticle loader chamber 87 exceeds the allowable concentration, then the purge gas is supplied from the gas-feeding unit 5 to the reticle chamber 23. Accordingly, the concentration of the purge gas in the reticle chamber 23 is maintained to be high even when the reticle is exchanged. Further, it is possible to decrease the amount of use of the purge gas. The reticle loader chamber 87 may be divided into a plurality of air-tight chambers along the transport passage for the reticle R1, R2. Constitutive components of the reticle loader system may be arranged in the plurality of air-tight chambers. In this arrangement, it is also preferable that the concentration of the light-absorbing substance or the allowable value thereof in each of the plurality of air-tight chambers differs.

Similarly, the soft shield member is provided so that the space between the wafer chamber 38 and the wafer loader chamber 70 is tightly closed. The wafer loader chamber 70 is also filled with a part of, or almost all of (when the valve of the gas discharge tube 17E is closed) the purge gas supplied into the wafer chamber 38. The purge gas, which has flown through the inside of the wafer loader chamber 70, is recovered by the recovery unit 4 via the valve-equipped gas discharge tube 17F and the gas discharge tube 7A. A concentration sensor for the light-absorbing substance is also arranged in the wafer loader chamber 70, and the allowable concentration of the light-absorbing substance in the wafer loader chamber 70 is set to be higher than that in the wafer chamber 38. Even if the concentration of the light-absorbing substance in the wafer chamber 38 is not more than the allowable concentration, when the concentration of the light-absorbing substance in the wafer loader chamber 70 exceeds the allowable concentration, then the purge gas is supplied from the gas-feeding unit 5 to the wafer chamber 38. Accordingly, the concentration of the purge gas in the wafer chamber 38 is maintained to be high even when the wafer is exchanged. Further, it is possible to decrease the amount of use of the purge gas.

Next, the arrangements of the wafer stage system based on the double-wafer stage system and the wafer loader system of this embodiment will be explained in detail with reference to FIGS. 3 to 5.

Figure 3:
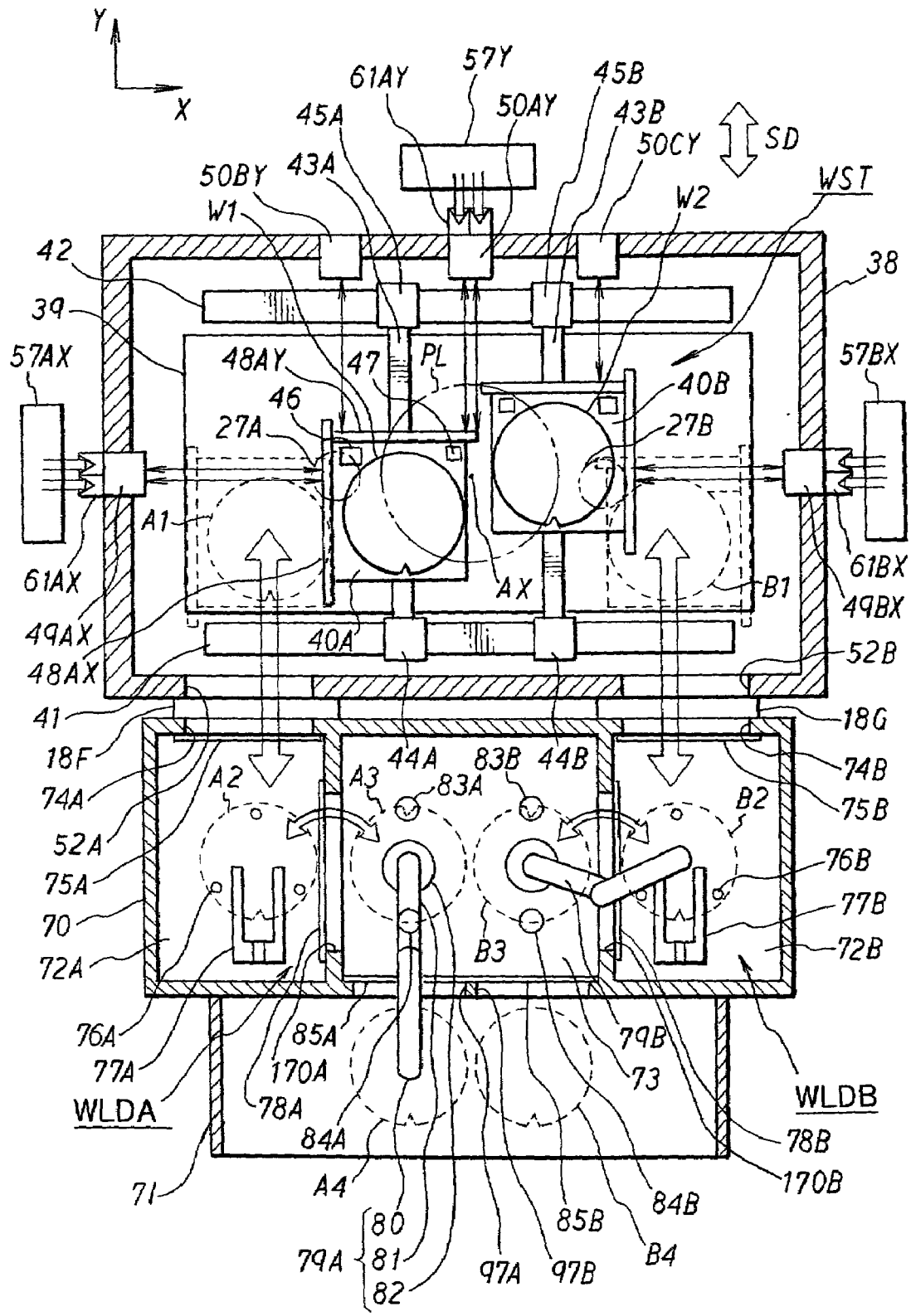
FIG. 3 shows, with partial cutout, a plan view illustrating a wafer stage system and a wafer loader system disposed at the inside of a wafer chamber 38 and a wafer loader chamber 70 shown in FIG. 2.

FIG. 3 shows, with partial cross section, a plan view illustrating the wafer stage system WST and the wafer loader system shown in FIG. 1. As shown in FIG. 3, the wafer stage system WST, which is disposed in the wafer chamber 38 of this embodiment, comprises two wafer stages 40A, 40B which are supported over the guide surface of the wafer base 39 in a floating manner by the aid of air bearings and which are movable independently in the X direction and the Y direction, driving systems therefor, and interferometer systems for measuring their positions. The wafers W1, W2 are held on the wafer stages 40A, 40B respectively by the aid of unillustrated wafer holders. This arrangement will be described in further detail below. A pair of X axis guide members 41, 42, which are parallel to the X axis, are arranged so that the wafer base 39 is interposed therebetween in the scanning direction SD (Y direction) during the scanning exposure. First X axis sliders 44A, 45A and second X axis sliders 44B, 45B, which are slidable in the X direction by the aid of air pads, are placed on the X axis guide members 41, 42.

A first Y axis guide 43A is arranged by the aid of an air pad slidably in the Y direction with respect to the first X axis sliders 44A, 45A. A second Y axis guide 43B is arranged by the aid of an air pad slidably in the Y direction with respect to the second X axis sliders 44B, 45B. The wafer stages 40A, 40B are arranged by the aid of air pads slidably in the Y direction with respect to the Y axis guides 43A, 43B. First and second linear motors (not shows) are provided in order to relatively drive the first X axis sliders 44A, 45A and the second X axis sliders 44B, 45B with respect to the X axis guide members 41, 42 while substantially satisfying the law of conservation of momentum. Tow linear motors (not shows) are provided in order to relatively drive the wafer stages 40A, 40B in the Y direction with respect to the Y axis guides 43A, 43B while substantially satisfying the law of conservation of momentum.

A fiducial mark member 47, on which a fiducial mark for measuring the base line of the alignment sensor 27A is formed, is fixed to the upper surface of the first wafer stage 40A on the side in the +X direction. A measuring member 46 for measuring, for example, the amount of light of the exposure light beam and the uneven illuminance is fixed to the upper surface of the wafer stage 40A on the side in the −X direction. The same fiducial mark member and the same measuring member as those described above are also fixed to the upper surface of the second wafer stage 40B.

An example of the measuring system of the wafer stage system WST of this embodiment will now be explained. With reference to FIG. 3, an X axis movement mirror 48AX and a Y axis movement mirror 48AY are fixed to the side surfaces of the first wafer stage 40A in the −X direction and the +Y direction. An X axis movement mirror and a Y axis movement mirror are also fixed to the side surfaces of the wafer stage 40B in the +X direction and the +Y direction. Besides the movement mirrors 48AX, 48AY are used as described above, it is also preferable that the side surfaces of the wafer stages 40A, 40B are mirror-finished, and the measuring laser beams are radiated onto the obtained mirror surfaces.

In this embodiment, the optical axis AX (center of the exposure area) of the projection optical system PL, the optical axis (detection center) of the first alignment sensor 27A, and the optical axis (detection center) of the second alignment sensor 27B are arranged on a straight line (hereinafter referred to as "minimum error axis") which is parallel to the X axis. X axis wafer interferometers 49AX, 49BX are installed so that they are opposed to one another in the −X direction and the +X direction on the minimum error axis. Two measuring beams from the first wafer interferometer 49AX are radiated along the minimum error axis onto the X axis movement mirror 48AX of the first wafer stage 40A. Symmetrically therewith, two measuring beams from the first wafer interferometer 49BX are radiated along the minimum error axis onto the X axis movement mirror of the second wafer stage 40B. In addition to the two measuring beams, a measuring beam separated in the Z direction is actually radiated, for example, onto the movement mirror 48AX. Each of the wafer interferometers 49AX, 49BX measures the position in the X direction, the angle of rotation about the Z axis (yawing amount), and the angle of rotation about the Y axis (rolling amount) of the wafer stage 40A, 40B.

A measuring beam, which passes through the optical axis AX and which is parallel to the Y axis, is radiated from the Y axis wafer interferometer 50AY onto the Y axis movement mirror 48AY of the wafer stage 40A. Further, wafer interferometers 50BY, 50CY are also provided. The wafer interferometers 50BY, 50CY have measuring beams which pass through the respective detection centers of the alignment sensors 27A, 27B and which are parallel to the Y axis respectively. The central wafer interferometer 50AY is provided with measuring beams having two axes in the X direction and two axes in the Z direction as well (not shown). Therefore, it is possible to measure the position in the Y direction, the angle of rotation about the Z axis (yawing amount), and the angle of rotation about the X axis (pitching amount) of the wafer stage 40A, 40B. In this embodiment, the projection optical system PL is commonly used for the exposure for the wafers W1, W2 on the wafer stages 40A, 40B. However, the alignment sensor 27A for the −X direction is used during the alignment for the wafer W1 on the first wafer stage 40A, while the alignment sensor 27B for the +X direction is used during the alignment for the wafer W2 on the second wafer stage 40B. In order to measure the position in the Y direction of the wafer stage 40A, 40B during the exposure based on the use of the projection optical system PL, the measured value obtained by the central wafer interferometer 50AY is used. In order to measure the position in the Y direction of the wafer stage 40A or 40B during the use of the alignment sensor 27A or 27B, each of the measured values obtained by the laser interferometers 50BY, 50CY is used.

In this embodiment, as described above, the plurality of Y axis wafer interferometers 50AY to 50CY are provided in the X direction (non-scanning direction), and thus any one of the Y axis measuring beams is radiated, for example, onto the Y axis movement mirror 48AY of the wafer stage 40A, 40B. Accordingly, the following advantage is obtained. That is, it is possible to miniaturize the individual wafer stages 40A, 40B and drive them at high speeds based on the double-wafer stage system. Further, it is possible to highly accurately detect the positions of the respective wafer stages 40A, 40B.

For example, when the first wafer stage 40A is moved to the exposure position after the alignment effected by the first alignment sensor 27A, or when the second wafer stage 40B is moved to the exposure position after the alignment effected by the second alignment sensor 27B, then it is necessary to deliver the measured value between the central wafer interferometer 50AY for the Y axis and the wafer interferometers 50BY, 50CY for the Y axis disposed on the both sides. For example, the delivery of the measured value is performed as follows. That is, when the first wafer stage 40A is moved in the −X direction starting from the state shown in FIG. 3, an offset may be added to the measured value of the next wafer interferometer 50BY so that the measured value of the next wafer interferometer 50BY is coincident with the measured value of the wafer interferometer 50AY having been previously used, in a state in which the yawing amount of the wafer stage 40A measured by the wafer interferometer 49AX is zero.

With reference to FIG. 3, two-axis movement mirrors 61AX, 61BX, which are composed of corner cubes respectively, are fixed to the back surfaces of the X axis wafer interferometers 49AX, 49BX. The positions in the X direction and the angles of rotation about the Z axis of the movement mirrors 61AX, 61BX are measured by the interferometer units 57AX, 57BX described above on the basis of the projection optical system PL. A two-axis movement mirror 61AY, which is composed of corner cubes respectively, is also fixed to the back surface of the central wafer interferometer 50AY for the Y axis. The position in the Y direction and the angle of rotation about the Z axis of the movement mirror 61AY are measured by the interferometer unit 57Y described above on the basis of the projection optical system PL.

In this embodiment, the first measuring system, which manages the two-dimensional coordinate positions and the angles of rotation about the three axes of the wafer stages 40A, 40B in the wafer chamber 38, is constructed by the total five interferometers composed of the wafer interferometers 49AX, 49BX, 50AY to 50CY. The second measuring system (main measuring system), which manages the two-dimensional coordinate positions and the angles of rotation about the Z axis of the wafer interferometers 49AX, 49BX, 50AY (wafer chamber 38) with respect to the projection optical system PL, is constructed by the interferometer units 57AX, 57BX, 57Y. The positions in the X direction and the Y direction and the angles of rotation about the X axis, the Y axis, and the Z axis of the respective two wafer stages 40A, 40B are highly accurately measured by the first measuring system and the second measuring system on the basis of the projection optical system PL. The positioning during the alignment and the control of the position and the velocity during the scanning exposure are highly accurately performed on the basis of the obtained measured values.

Figure 4:
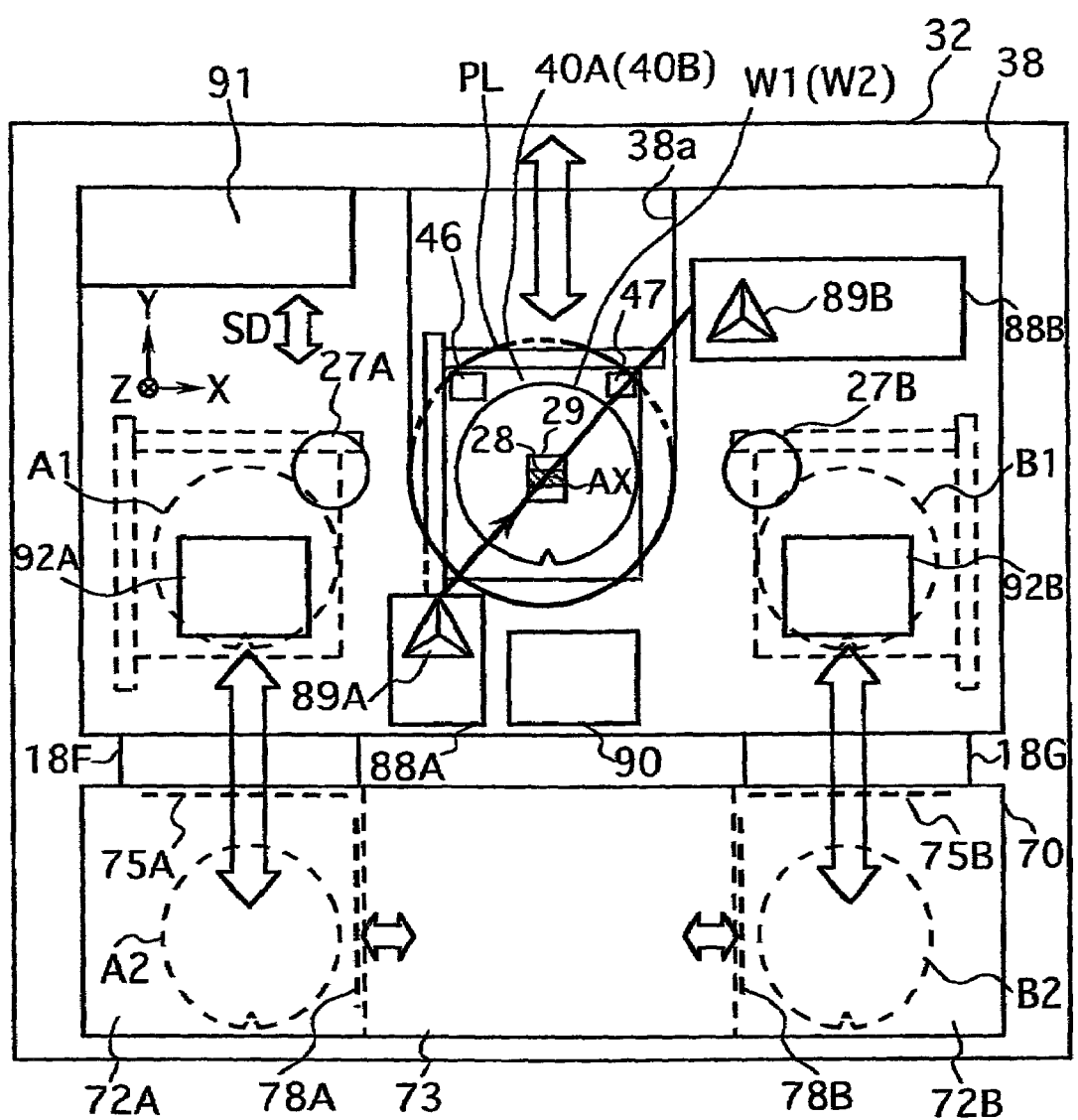
FIG. 4 shows a plan view illustrating the contours of the wafer chamber 38 and the wafer loader chamber 70 shown in FIG. 3.

In this embodiment, in addition to the measuring systems, as shown in FIG. 4, for example, a variety of sensors are provided.

FIG. 4 shows a plan view illustrating the wafer chamber 38 and the wafer loader chamber 70 shown in FIG. 3. With reference to FIG. 4, the wafer chamber 38 is formed with a groove 38a which is open in the +Y direction so that the projection optical system PL may be inserted and withdrawn in the Y direction. A multi-point autofocus sensor (AF sensor) 88A, 88B based on the oblique incidence system is installed on the upper plate of the wafer chamber 38, which is composed of a projecting system 88A for projecting a slit image obliquely with respect to the optical axis AX onto the slit-shaped exposure area 28 formed by the projection optical system PL or a plurality of measuring points on the wafer W1 (or W2) disposed in an area (pre-reading area) located in front of the exposure area 28 in the scanning direction SD (Y direction), and a light-receiving system 88B for receiving the reflected light from the measured surface and detecting the focus position (position in the Z direction) at each of the measuring points. The information on the focus position FZn (n=1, 2, ...) detected by the AF sensor 88A, 88B is supplied to the stage-driving system (not shown).

Corner cube type movement mirrors 89A, 89B are fixed to the upper surfaces of the projecting system 88A and the light-receiving system 88B respectively. Interferometer units (not shown), which are constructed in the same manner as the interferometer unit 58A and which highly accurately detect the displacement amounts FZA, FZB of the movement mirrors 89A, 89B with respect to the projection optical system PL, are installed on the second fiducial plate 102 disposed under the projection optical system PL shown in FIG. 2. Detection results FZA, FZB thereof are also supplied to the stage-driving system. In this arrangement, the stage-driving system calculates the defocus amount of the projection optical system PL from the image plane at each of the measuring points on the wafer W1 (W2) from the value which is obtained by correcting the focus position FZn detected by the AF sensor 88A, 88B with the displacement amount FZA, FZB. The Z leveling mechanism in the wafer stage 40A (40B) is controlled so that the defocus amount is included in an allowable range. Accordingly, with reference to FIG. 4, when one shot area 29 on the wafer W1 (or W2) is scanned with respect to the exposure area 28, the entire surface of the shot area 29 is included in the range of the depth of focus. Therefore, a reduced image of the reticle pattern is projected onto the entire surface of the shot area 29 at a high resolution.

Those provided at the upper portion of the wafer chamber 38 are a laser light source unit 91 for branching and supplying the laser beam to the wafer interferometers 49AX, 49BX, 50AY to 50CY shown in FIG. 3, a sensor unit 90 for measuring the characteristics of the wafer W1, W2 on the wafer stage 40A, 40B, and first and second prealignment mechanisms 92A, 92B for performing the prealignment for the wafers W1, W2 in the wafer chamber 38. In this arrangement, the prealignment for the wafer W1 on the first wafer stage 40A is performed at a position A1 at the end in the −X direction in the wafer chamber 38. The prealignment for the wafer W2 on the second wafer stage 40B is performed at a position B1 at the end in the +X direction. Therefore, the prealignment mechanisms 92A, 92B are arranged over the positions A1, B1 (prealignment positions) respectively. Positions for the wafer alignment effected by the alignment sensors 27A, 27B are set between the positions A1, B1 and the exposure area 28 (optical axis AX) in which the exposure is performed.

Returning to FIG. 3, in this embodiment, one of the wafer stages 40A, 40B executes the exposure sequence, during which the other executes the wafer alignment sequence after exchanging the wafer with respect to the wafer loader system WLDA, WLDB. Accordingly, the box-shaped wafer loader chamber 70 having high air-tightness is installed on the side in the −Y direction of the wafer chamber 38 with a predetermined spacing distance intervening therebetween. The wafer loader systems WLDA, WLDB are accommodated in the wafer loader chamber 70. In the wafer chamber 38, the first wafer stage 40A (wafer W1) is moved to the position A1 in the −X direction as indicated by dotted lines after the exposure. The second wafer stage 40B (wafer W2) is moved to the position B1 in the +X direction as indicated by dotted lines after the exposure. Slit shaped transport ports 52A, 52B are formed in the vicinity of the positions A1, B1 at the side surface of the wafer chamber 38. Slit-shaped transport ports 74A, 74B are also formed at the side surface of the wafer loader chamber 70 so that the transport ports 74A, 74B are opposed to the transport ports 52A, 52B. The inside of the wafer loader chamber 70 is divided into a first waiting chamber 72A which contacts with the first transport port 74A, a second waiting chamber 72B which contacts with the second transport port 74B, and a preparatory chamber 73 which is disposed at the middle of the two waiting chambers 72A, 72B.

Shutters 75A, 75B are provided openably/closably at the inside of the transport ports 74A, 74B. Transport ports 170A, 170B are also formed between the waiting chambers 72A, 72B and the preparatory chamber 73 respectively. Shutters 78A, 78B for opening/closing the transport ports 170A, 170B are provided. Further, two transport ports 97A, 97B are formed in parallel in the X direction at the side surface of the preparatory chamber 73 in the −Y direction. Shutters 85A, 85B for opening/closing the transport ports 97A, 97B are provided. The interface column 71 is installed to make contact with the wafer loader chamber 70 in the −Y direction. Wafer cassettes (not shown), each of which accommodates one lot of wafer, are installed at the position A4 and the position B4 disposed in the vicinity of the transport ports 97A, 97B to be opened/closed by the shutters 85A, 85B of the preparatory chamber 73 in the same environment as that of the atmospheric air in the interface column 71.

Cylindrical film-shaped soft shield members 18F, 18G, each of which has high flexibility in the same manner as the soft shield member 18D shown in FIG. 1, are installed to shield the spaces between the transport ports 52A, 52B of the wafer chamber 38 and the transport ports 74A, 74B of the wafer loader chamber 70 from the atmospheric air. Accordingly, the vibration in the wafer loader chamber 70 is not transmitted to the inside of the wafer chamber 38. The space ranging from the interior of the wafer chamber 38 to the interior of the wafer loader chamber 70 can be filled with the high purity purge gas.

In order to control the temperature of the wafer transported to the central position A2 (temperature control position) in the first waiting chamber 72, a temperature-adjusting unit 76A including a three-point contact type heater is installed. In order to deliver the wafer between the position A2 and the position A1 through the transport ports 52A, 74A, a first slide arm 77A is arranged. A transport unit (not shown) for finely moving the slide arm 77A in the Z direction and moving the slide arm 77A in the Y direction is arranged at an upper portion at the inside of the waiting chamber 72A. A first transport robot 79A for delivering the wafer between the interface column 71 and the inside of the waiting chamber 72A is arranged on the side in the −X direction in the preparatory chamber 73. The transport robot 79A comprises a rotary shaft 82 for making rotation and vertical movement, a first arm 81 for making rotation on the rotary shaft 82, and a second arm 80 for making rotation at the tip of the first arm 81. The wafer as the transport objective is attracted and held at the tip of the second arm 80.

In the air-tight chamber (preparatory chamber 73 in this embodiment) which is connected to the interface column 71 (atmospheric air), the purge gas may outflow to the outside when the wafer or the like is transported, and the concentration of the light-absorbing substance may be deteriorated (increased) due to any inflow of the atmospheric air. Accordingly, it is desirable to decrease the size (opening area) of the transport port 97A, 97B (hereinafter referred to as "IF opening") between the interface column 71 and the preparatory chamber 73 defined by the shutter 85A, 85B when the wafer is transported. For example, it is desirable to make the size of the IF opening to be small as compared with the transport port (hereinafter referred to as "main body opening") 52A, 52B or 74A, 74B between the wafer chamber 38 and the waiting chamber 72A, 72B defined by the shutter 75A, 75B. In this case, it is unnecessary to restrict the size of the transport port (hereinafter referred to as "intermediate opening") 170A, 170B between the waiting chamber 72A, 72B and the preparatory chamber 73 defined by the shutter 78A, 78B. However, it is desirable that the size of the intermediate opening is equivalent to or larger than that of the IF opening, or the size is equivalent to or smaller than that of the main body opening (52A, 52B or 74A, 74B) described above, or the size satisfies both of the foregoing conditions.

In this embodiment, the two air-tight chambers (preparatory chamber 73 and waiting chamber 72A or 72B) are provided between the wafer chamber 38 and the interface column 71, i.e., one intermediate opening exists between the IF opening and the main body opening. However, three or more air-tight chambers may be provided between the wafer chamber 38 and the interface column 71. Two or more intermediate openings, which exist between the IF opening and the main body opening, may have an equivalent size or different sizes. However, it is desirable that the relationship with respect to the size of the IF opening or the main body opening satisfies the foregoing condition.

It is enough that only one air-tight chamber is provided between the wafer chamber 38 and the interface column 71. In this case, it is enough that the IF opening is merely allowed to have a small size as compared with the main body opening. When at least two air-tight chambers are provided between the wafer chamber 38 and the interface column 71, it is also preferable that the size of the transport port is increased as the arrangement position approaches the wafer chamber. That is, it is also preferable that the main body opening is larger than the intermediate opening and the IF opening, and the intermediate opening is larger than the IF opening. This arrangement is effective especially when the concentration of the light-absorbing substance is restricted most strictly in the wafer chamber 38, and the concentration of the light-absorbing substance is loosely managed in the respective air-tight chambers as approaching to the interface column 71. That is, when the concentration of the light-absorbing substance differs before and after a certain air-tight chamber other than the wafer chamber 38, and the concentration in the certain air-tight chamber is equivalent to or not less than the strict concentration of the concentrations therebefore and thereafter, then the transport port with the loose concentration is made smaller than the transport port with the strict concentration in the certain air-tight chamber.

The IF opening, the intermediate opening, and the main body opening may have an equal size, and the opening size may be made different by the aid of the shutters when the wafer or the like is transported. Alternatively, the respective openings (transport ports) may have different sizes, and the shutters are used only for opening/closing the transport passage. In this embodiment, the wafer loader supports the back surface of the wafer. Therefore, the lateral width of each of the openings (transport ports) is approximately identical depending on the size of the wafer. Therefore, when the height is adjusted for each of the openings (transport ports), the size (opening area) differs. However, when the size of the wafer loader (transport arm) passing through each of the openings (transport ports) differs, then the height may be adjusted in consideration of the size, or the size of each of the transport arms may be set so that the foregoing condition is satisfied.

When at least one air-tight chamber is provided between the interface column 71 and the wafer chamber 38 separately from the wafer chamber 38, it is desirable that the pressure is made higher than that of the atmospheric air in the air-tight chamber connected to the interface column 71 in order to avoid any inflow of the atmospheric air. It is enough that the pressure of the wafer chamber 38 is equivalent to the pressure of the concerning air-tight chamber. However, it is desirable that the pressure is highest in the wafer chamber 38. In this case, it is also preferable that the pressure of the air-tight chamber is increased as approaching to the wafer chamber 38. Especially, when the concentration of the light-absorbing substance differs between the mutually adjacent two air-tight chambers, it is desirable that the pressure in one of the air-tight chambers in which the concentration is strictly managed is made higher than that of the other air-tight chamber. Accordingly, it is possible to avoid any inflow of the purge gas from the air-tight chamber in which the concentration management is loose (allowable concentration of the light-absorbing substance is high) to the air-tight chamber in which the concentration management is strict (allowable concentration of the light-absorbing substance is low).

A part or the whole of the reticle loader 87 may be arranged in at least one air-tight chamber which is different from the reticle chamber 23. The size of the transport port and the pressure may be set in the same manner as described above in a plurality of air-tight chambers including the reticle chamber 23. In this case, the reticle may be accommodated in a tightly closed cassette (for example, bottom open type Smif pod), and the reticle may be imported into the at least one air-tight chamber without making contact with the atmospheric air. One of the plurality of air-tight chambers may be provided with a buffer cassette (storage shelf) for holding at least one sheet of reticle.

The transport robot 79A, which serves as the handling mechanism, installs, at the position A3 on the rotary shaft 82, the wafer imported into the preparatory chamber 73 through the transport port 97A having the shutter 85A from the position A4 in the interface column 71 during the import of the wafer. Two image pickup devices 83A, 84A are arranged so as to have visual fields at two positions separated by 180° at the outer circumferential portion of the wafer installed at the position A3. Image pickup signals obtained by the image pickup devices 83A, 84A to serve as the contour-detecting system are supplied to the unillustrated wafer loader control system. The wafer loader control system processes the image pickup signals to detect the notch (cutout) at the outer circumferential portion of the wafer disposed at the position A3 and the central position thereof. The operation of the transport robot 79A is controlled so that the position of the notch is located at a predetermined position (for example, in the +Y direction) and the central position of the wafer is located at a predetermined position. Accordingly, the first prealignment is performed for the wafer.

The first wafer loader system WLDA is constructed by the temperature-adjusting unit 76A, the slide arm 77A, the transport unit (not shown), the transport robot 79A, and the image pickup devices 83A, 84A. Symmetrically with the first wafer loader system WLDA, the second wafer loader system WLDB is arranged in order to deliver the wafer among the position B1 in the wafer chamber 38, the position B2 in the waiting chamber 72B, the position B3 in the preparatory chamber 73, and the position B4 in the interface column 71. The wafer loader system WLDB is also constructed by the temperature-adjusting unit 76B, the slide arm 77B, the transport unit (not shown), the second transport robot 79B, and the image pickup devices 83B, 84B. The wafer loader systems WLDA, WLDB correspond to the transport system. The first prealignment for the wafer may be regarded to be the alignment on the contour basis for the wafer with respect to the transport system.

In the illustrative arrangement shown in FIG. 3, only one transport robot 79A may be arranged in the preparatory chamber 73, and the transport robot 79A (handling mechanism) may be shared by the two wafer loader systems WLDA, WLDB. In this arrangement, only one set of the image pickup devices 83A, 84A may be arranged for the contour-detecting system. The exposure is performed by the projection optical system PL alternately for the wafer stages 40A, 40B. Therefore, the throughput is scarcely decreased even when the foregoing arrangement is used. Further, it is possible to miniaturize the wafer loader system as a whole.

Figure 5:
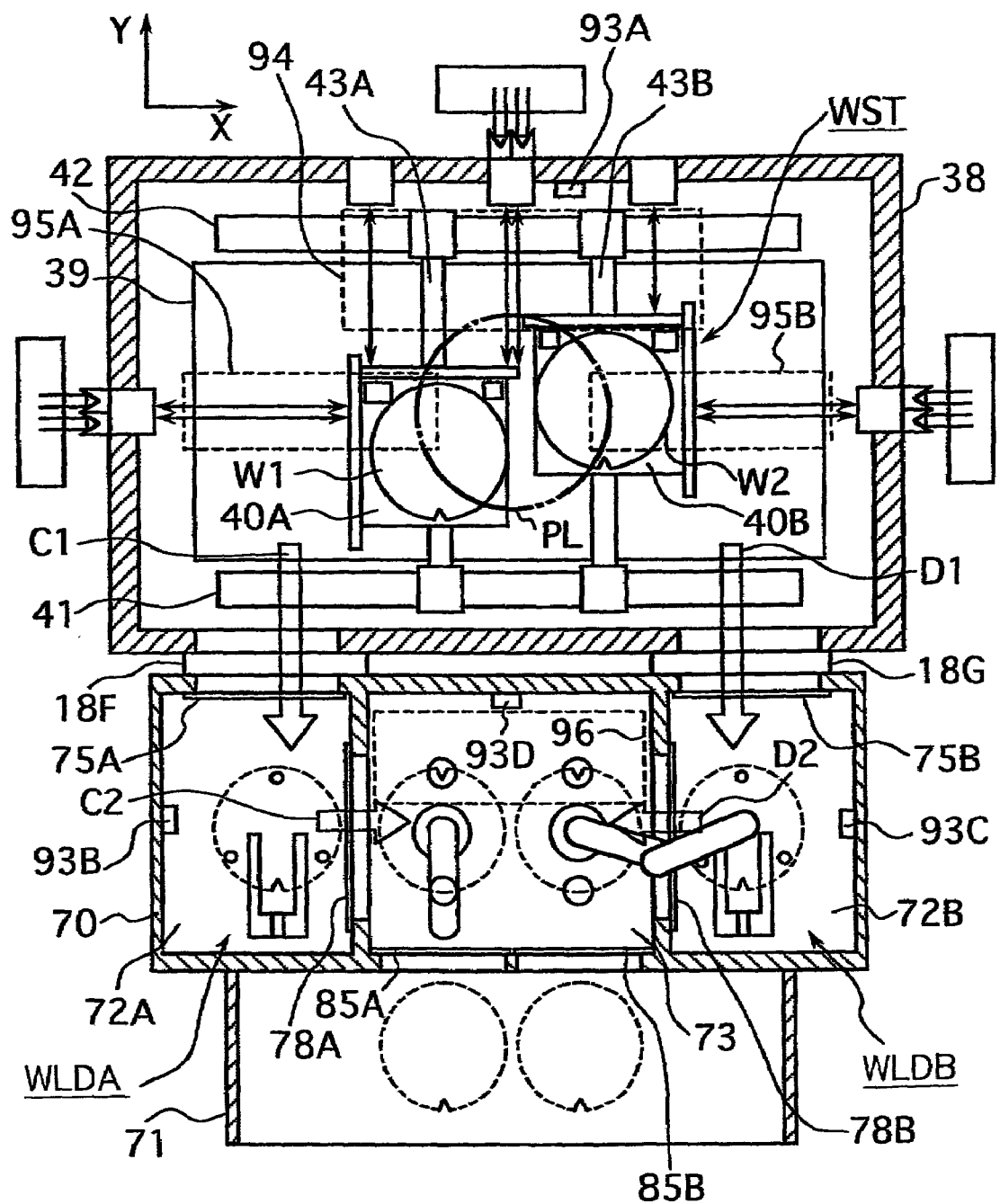
FIG. 5 shows a plan view illustrating blow ports, discharge ports, and other components for the purge gas for the wafer chamber 38 and the wafer loader chamber 70 shown in FIG. 3.

FIG. 5 shows a plan view illustrating the wafer stage system WST and the wafer loader systems WLDA, WLDB of this embodiment in the same manner as in FIG. 3. With reference to FIG. 5, three blow ports 94, 95A, 95B, which communicate with the gas feed tube 16E and the gas-feeding unit 5 shown in FIG. 2, are installed as indicated by dotted lines at upper portions of the wafer chamber 38. The purge gas at a positive pressure is supplied from the blow ports 94, 95A, 95B to the inside of the wafer chamber 38 in accordance with the down flow system. In this arrangement, the blow port 94 is disposed over the area including the optical path of the Y axis wafer interferometer 50AY. The blow ports 95A, 95B are disposed over the areas including the optical paths of the two wafer interferometers 49AX, 49BX for the X axis. The high purity purge gas is substantially always supplied to the optical paths of the wafer interferometers 49AX, 49BX, 50AY. Therefore, the refractive index of the optical path is stabilized, and the measurement accuracy is improved.

However, when the purity of the purge gas is changed relatively greatly, the refractive index of the optical path of the wafer interferometer is changed depending thereon. Therefore, when the purity of the purge gas is changed while exceeding the predetermined allowable value, then the alignment and the exposure operation may be stopped, and the wafer stages 40A, 40B may be allowed to wait until the purity of the purge gas is stabilized at a high purity. Accordingly, it is possible to avoid any deterioration of the alignment accuracy and the exposure accuracy.

A discharge port 96, which communicates with the gas discharge tube 17F shown in FIG. 2, is installed as indicated by dotted lines at the bottom surface of the preparatory chamber 73 of the wafer loader chamber 70 shown in FIG. 5. oxygen concentration sensors 93A, 93B, 93C, 93D for measuring the concentration of oxygen as the light-absorbing substance are installed at the inside of the wafer chamber 38, the waiting chambers 72A, 72B, and the preparatory chamber 73 respectively. Measured values obtained by the oxygen concentration sensors 93A to 93D are supplied to the unillustrated purge gas control system. The purge gas, which is supplied to the inside of the wafer chamber 38 when the shutters 75A, 78A or the shutters 75B, 78B are open, passes through the waiting chambers 72A, 72B as indicated by the arrows C1, C2 and the arrows D1, D2, and it inflows into the preparatory chamber 73. The purge gas, which inflows into the preparatory chamber 73, is recovered by the recovery unit 4 via the discharge port 96 and the gas discharge tube 17F shown in FIG. 2. When the shutters 75A, 78A, 75B, 78B are closed, the purge gas, which is fed to the inside of the wafer chamber 38, is recovered by the recovery unit 4 via the gas discharge tube 17E shown in FIG. 2, if necessary.

In this arrangement, the allowable values of the oxygen concentrations detected by the oxygen concentration sensors 93A to 93D are set to be increased (loosened) in an order of the inside of the wafer chamber 38, the inside of the waiting chambers 72A, 72B, and the inside of the preparatory chamber 73. When the concentration measured by any one of the oxygen concentration sensors 93A to 93D exceeds the allowable value, the purge gas control system supplies the purge gas in an amount larger than the ordinary amount from the blow ports 94, 95A, 95B to the inside of the wafer chamber 38. Accordingly, for example, even when the shutters 75A, 75B are opened during the exchange of the wafer, the concentration of the purge gas in the wafer chamber 38 is maintained to be high. Further, it is possible to decrease the amount of use of the purge gas.

The flow rate, which is used when the purge gas is supplied to the inside of the wafer chamber 38, is, for example, in such a degree that the amount corresponding to the volume of the space increased in the wafer chamber 38 when one sheet of wafer is successively exported from the wafer chamber 38 is replenished. Accordingly, it is possible to decrease the amount of use of the purge gas.

In this embodiment, the allowable value (designated as dA) of the concentration of the light-absorbing substance (oxygen in this case) at the inside of the wafer chamber 38 (exposure chamber) is set to be about $1/10$ to $1/100$ of the allowable value (designated as dB) of the concentration of the light-absorbing substance at the inside of the waiting chamber 72A, 72B. The allowable value dB of the concentration of the light-absorbing substance at the inside of the waiting chamber 72A, 72B is set to be about $1/10$ to $1/100$ of the allowable value (designated as dC) of the concentration of the light-absorbing substance at the inside of the preparatory chamber 73. For example, the allowable value dA in the wafer chamber 38 is set to be about 100 to 10 ppm, the allowable value dB in the waiting chamber 72A, 72B is set to be about $10^3$ ppm, and the allowable value dC in the preparatory chamber 73 is set to be about $10^5$ ppm.

In this case, in order to easily manage the concentration of the purge gas, the following procedure is available. That is, the allowable value dA in the wafer chamber 38 is set to be most strict. As for the other air-tight chambers (waiting chambers 72A, 72B and preparatory chamber 73), the allowable value is merely commonly set to be approximately equal to or not less than that in the wafer chamber 38. In this procedure, the waiting chambers 72A, 72B and the preparatory chamber 73 may be combined into one air-tight chamber. Further, it is also preferable that the number of types of the light-absorbing substance (impurity) as the detection objective is increased, and the allowable value of the concentration is allowed to differ for each of the light-absorbing substances. It is also preferable that the flow rate of the purge gas or the like is controlled taking notice of the concentration of the substance having the most strict allowable value.

Another method for managing the purge gas is available. That is, the allowable concentration of the light-absorbing substance (impurity) at the inside may be set to be equivalent to that at the inside of the wafer chamber 38, in the waiting chambers 72A, 72B adjacent to the wafer chamber 38. The allowable concentration of the light-absorbing substance at the inside may be set to be higher than that in the wafer chamber 38, for example, in the preparatory chamber 73 arranged on the side of the wafer cassette as compared with the waiting chambers 72A, 72B. Accordingly, the management is simplified.

In order to avoid any counter flow of the purge gas from the air-tight chamber having a loose (large) allowable value of the concentration of the light-absorbing substance to the air-tight chamber having a strict (small) allowable degree, it is also preferable that the pressure of the purge gas is allowed to differ in the respective air-tight chambers, i.e., the pressure of the purge gas is increased at the inside of the air-tight chamber having a more strict (smaller) allowable value thereof.

In this embodiment, the purge gas is supplied to the inside of the wafer chamber 38 in accordance with the down flow system. However, when the purge gas is a light gas such as helium gas as in this embodiment, the air, which is the major component of the atmospheric air, tends to stay at lower portions. When the light purge gas is supplied from the upper position, the air is efficiently discharged from the lower portions. Therefore, the purge gas in the wafer chamber 38 is maintained to have a high purity. However, for example, when the atmospheric air is a gas lighter than the air, it is also preferable that the purge gas composed of the light gas is supplied so that the purge gas is blown upwardly from the bottom surface portion in the wafer chamber 38 (in accordance with the so-called overflow system).

For example, when the KrF excimer laser (wavelength: 248 nm) is used as the exposure light beam, it is also desirable that the purge gas such as helium gas and nitrogen gas is supplied to the optical path thereof. However, in this case, for example, even when the concentration of the purge gas is lowered to be about 90 to 99%, then the high exposure intensity is obtained on the wafer, and the high measurement accuracy is also obtained for the sensor such as the laser interferometer. However, in this case, in order that the fluctuation of the refractive index on the optical path of the sensor is not increased, it is desirable that the supply tube and the discharge tube for the purge gas with respect to the air-tight chamber are arranged at positions separated from the optical path of the sensor as far as possible.

Next, detailed explanation will be made with reference to FIGS. 8 to 12 for the arrangement and the operation of the temperature-adjusting unit 76A (temperature control system) and the prealignment mechanism 92A (first alignment system) of this embodiment.

Figure 8A:
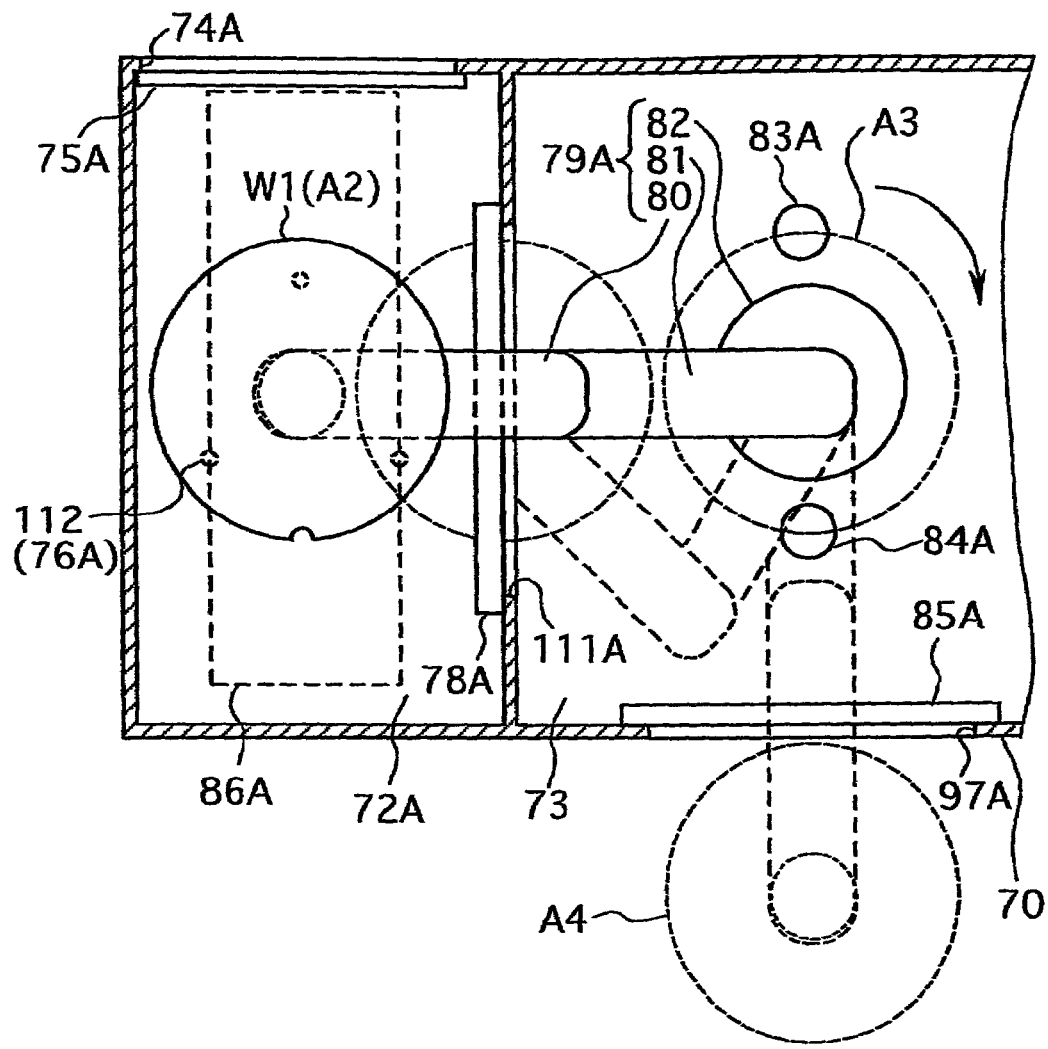
FIG. 8A shows, with partial cutout, a plan view illustrating the inside of the left half side of the wafer loader chamber 70 shown in FIG. 3.
Figure 8B:
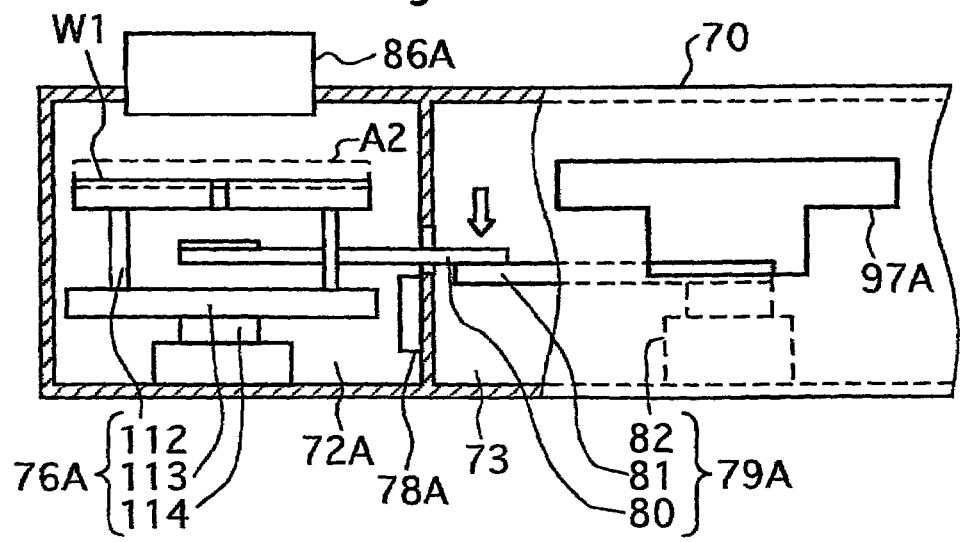
FIG. 8B shows, with partial cutout, a front view of those shown in FIG. 8A.

FIG. 8A shows a magnified plan view illustrating a state of the left half side at the inside of the wafer loader chamber 70, and FIG. 8B shows a front view with partial cutout of FIG. 8A. As shown in FIG. 8B, the first temperature-adjusting unit 76A comprises an upward/downward driving section 114, a heating/cooling section 113 which is fixed thereon and which is provided with a heating unit such as a heater and a cooling element such as a Peltier element, and three support pins 112 which are fixed thereon. The support pin 112 is formed of a material (for example, metal) having a good coefficient of thermal conductivity. Although not shown, a temperature-measuring element such as a thermistor is fixed at a position in the vicinity of the upper end of the support pin 112. The detection data of the temperature obtained by the temperature-measuring element is supplied to the unillustrated wafer loader control system. The support pin 112 of this embodiment is formed of a material involving little gas release.

In this arrangement, it is assumed that the wafer to be exposed from now on is the wafer W1. As shown in FIG. 8A, the wafer W1 is transported by the transport robot 79A as the handling mechanism to the position A2 in the waiting chamber 72A from the position A4 at the outside of the wafer loader chamber 70 via the position A3 in the preparatory chamber 73 at which the first prealignment is performed. As shown in FIG. 8B, the support pins 112 of the temperature-adjusting unit 76A wait at the position under the position A2 indicated by dotted lines. When the rotary shaft 82 is moved downwardly in this state, the wafer W1 is delivered from the transport robot 79A onto the support pins 112. The wafer W1 waits on the support pins 112 until the alignment and the exposure are completed for the previous wafer. During this waiting period, the wafer loader control system controls the temperature of the support pins 112 and the wafer W1 by the aid of the heating/cooling section 113 so that the temperature (approximately regarded to be the temperature of the wafer W1), which is detected by the temperature-measuring element (not shown) installed to the support pin 112, approaches the proper temperature of the photoresist applied to the wafer W1 (previously set as the exposure data). Accordingly, the wafer W1 always waits in a state of being maintained at the proper temperature. Therefore, the exposure can be always performed in a state in which the highest resolution is obtained with the photoresist.

In FIG. 8, the slide arm 77A shown in FIG. 3 is omitted from the illustration. However, after the state shown in FIG. 8, the wafer W1 is delivered to the slide arm 77A as shown in FIG. 9.

FIG. 9A shows a plan view illustrating the interior of the waiting chamber 72A shown in FIG. 3, and FIG. 9B shows a front view with partial cutout of FIG. 9A. As shown in FIG. 9B, the slide arm 77A is located at the bottom surface portion of the wafer W1 in the state in which the wafer W1 waits on the support pins 112 of the temperature-adjusting unit 76A. The slide arm 77A is connected to a slider 86A disposed at an upper position. The slider 86A drives the slide arm 77A upwardly and downwardly, if necessary. Further, as shown in FIG. 9A, the slider 86A moves the slide arm 77A substantially linearly between the position A2 and the position A1. The slide arm 77A and the slider 86A correspond to the arm mechanism of the present invention. The transport port 74A (also the transport port 52A shown in FIG. 3), which is disposed between the waiting chamber 72A and the wafer chamber 38 shown in FIG. 3 of this embodiment, is formed to have a wide width in the vertical direction. The shutter 75A for opening/closing the transport port 74A is composed of a first shutter 75A1 for opening/closing the substantially lower half portion thereof, and a second shutter 75A2 for opening/closing the substantially upper half portion thereof.

The following operation is performed when the wafer W1 is transported toward the wafer chamber 38. That is, with reference to FIG. 9B, the slide arm 77A is moved upwardly to deliver the wafer W1 from the support pins 112 to the slide arm 77A. After that, as shown in FIG. 9D corresponding to FIG. 9B, only the first shutter 75A1 is opened. Accordingly, a substantially lower half area of the transport port 74A, i.e., an area through which the wafer W1 and the slide arm 77A can pass therethrough is open. The wafer holder on the side of the wafer stage 40A is transported in some cases. When the accompanying member, which is larger than the wafer W1, is transported as described above, the second shutter 75A2 is also opened together with the first shutter 75A1. It is possible to effectively utilize the purge gas by opening, for example, the transport port 74A between the adjoining air-tight chambers to the necessary minimum as described above.

After that, as shown in FIG. 9C corresponding to FIG. 9A, the slide arm 77A is driven in the direction toward the transport port 74A. Accordingly, the wafer W1 is transported to the position A1 in the wafer chamber 38. As shown in FIG. 10, the prealignment mechanism 92A is arranged so as to surround the position A1.

Figure 10A:
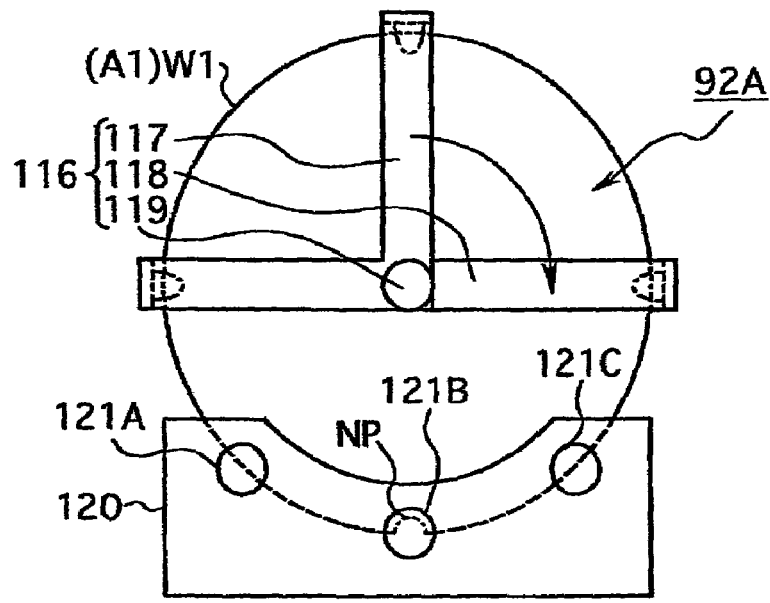
FIG. 10A shows a plan view illustrating a load arm 116 of an exemplary prealignment mechanism 92A of the embodiment.
Figure 10B:
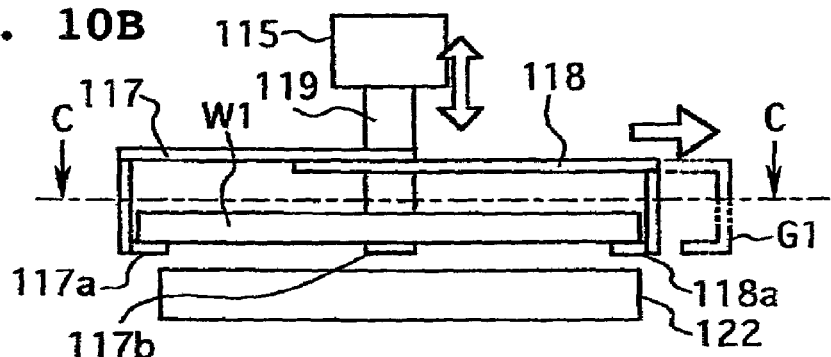
FIG. 10B shows a front view of those shown in FIG. 10A.
Figure 10C:
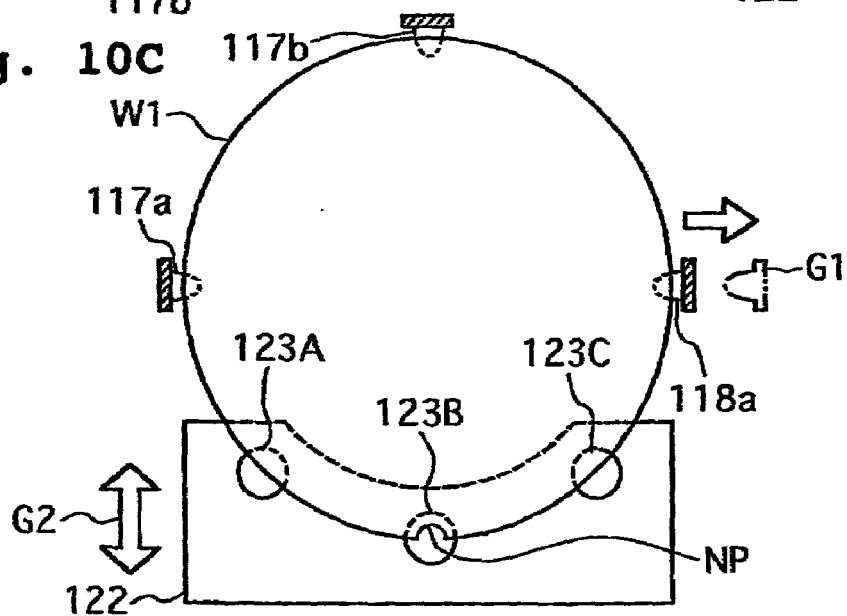
FIG. 10C shows a sectional view taken along a line CC shown in FIG. 10B.

FIG. 10A shows a plan view illustrating an importing load arm 116 of the prealignment mechanism 92A. FIG. 10B shows a front view with partial omission of FIG. 10A. FIG. 10C shows a sectional view taken along a line CC shown in FIG. 10B. As shown in FIGS. 10A and 10B, the load arm 116 includes a rotary elevating shaft 119 which extends in the vertical direction, a first arm 117 which is attached to the rotary elevating shaft 119 and which has two pawl-shaped holding sections 117*a*, 117*b* opened at an interval of 90°, a second arm 118 which is attached to the rotary elevating shaft 119 rotatably in a range of about 0° to 180° with respect to the first arm 117 and which has a pawl-shaped holding section 118*a*, and a driving section 115 which drives the rotary elevating shaft 119 in the vertical direction and in the rotation direction. In this arrangement, the wafer W1 is placed on the three holding sections 117*a*, 117*b*, 118*a*. The angle of rotation of the second arm 118 is set so that the holding section 118*a* is disengaged from the notch NP at the outer circumference of the wafer W1.

For example, the wafer W1 is a so-called 12-inch wafer having a diameter of 300 mm, in which the notch NP as a cutout is formed at one position of the outer circumference thereof. Other than the above, the wafer W1 may be as follows. That is, for example, notches may be formed at two or more positions, or an orientation flat as a cutout extending over a relatively wide range may be formed. Even when the position and the shape of the cutout are changed, it is possible to hold the wafer while avoiding the cutout by rotating the second arm 118. In this embodiment, the second arm 118 is fixed in a state of being rotated by 90° with respect to the first arm 117. The notch NP is formed at the position of being further rotated by about 90° from the second arm 118. As shown by the position G1 indicated by two-dot chain lines, the second arm 118 is constructed to be slidable with respect to the rotary elevating shaft 119 in the movement direction (horizontal direction) of the wafer W1.

As shown in FIG. 10A, an image pickup unit 120, which is provided with image pickup elements 121A to 121C disposed at three places, is arranged over the outer circumferential portion of the wafer W1 disposed at the position A1. The central image pickup element 121B is located over the notch NP. As shown in FIGS. 10B and 10C, an illuminating unit 122, which is provided with light emitting elements 123A to 123C composed of, for example, light emitting diodes disposed at three places, is arranged on the bottom surface side of the wafer W1 so that the illuminating unit 122 is capable of retracting in the direction of the arrow G2. The contour-detecting system is constructed by the illuminating unit 122 and the image pickup unit 120. Those usable as the light emitting elements 123A to 123C also include, for example, light-outgoing ends of optical fibers for which the light from a halogen lamp is collected at light-incoming ends. When the contour of the wafer W1 is detected, the light emitting elements 123A to 123C are arranged so that they are opposed to the image pickup elements 121A to 121C. Image pickup signals of the image pickup elements 121A to 121C are supplied to the alignment control system (not shown). The alignment control system processes the image pickup signals to determine the direction of the notch NP of the wafer W1 and the central position of the wafer W1. After the contour detection for the wafer W1 is completed as described above, the illuminating unit 122 is retracted so that the wafer W1 may be placed on the wafer stage 40A.

The alignment control system rotates the rotary elevating shaft 119 by the aid of the driving section 115 so that the direction of the notch NP is the previously defined direction. The alignment control system positions the wafer stage 40A so that the central position of the wafer W1 is coincident with the previously defined position on the wafer stage 40A shown in FIG. 3, for example, the center of the unillustrated wafer holder. Accordingly, the second prealignment for the wafer W1, i.e., the positioning with respect to the wafer stage 40A on the basis of the contour is completed. The wafer W1 is loaded on the wafer stage 40A in this state.

However, actually, the exposed wafer is placed on the wafer stage 40A until that time. As shown in FIG. 11, the exposed wafer (referred to as "wafer W5") is delivered at the position A5 to an exporting unload arm 124.

Figure 11A:
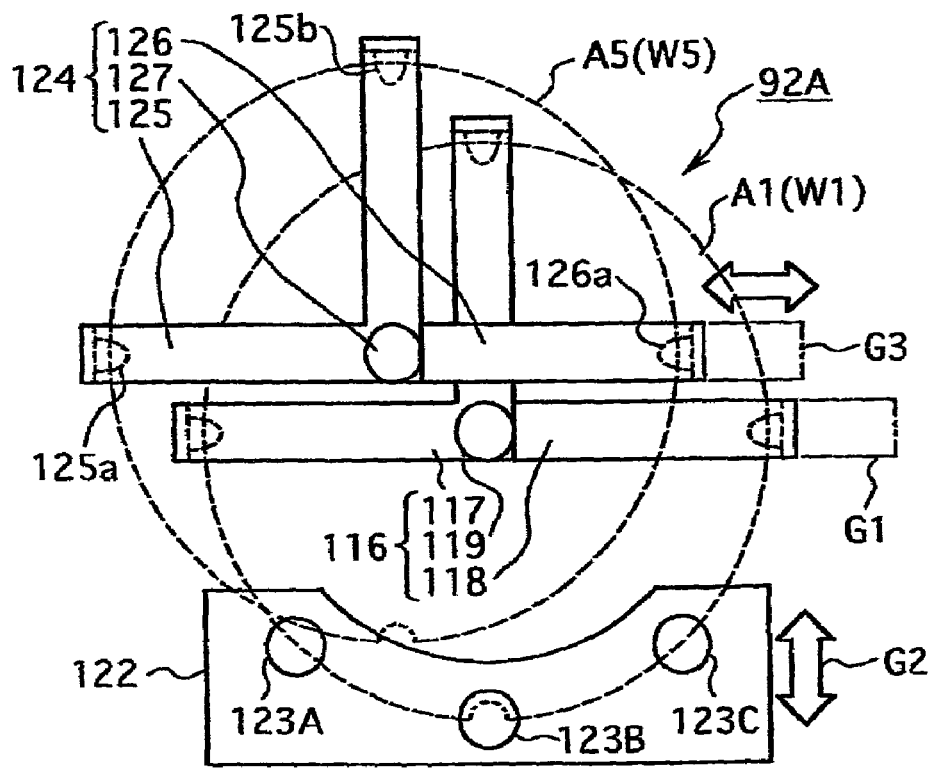
FIG. 11A shows a plan view illustrating an unload arm 124 and the load arm 116 of the prealignment mechanism 92A.
Figure 11B:
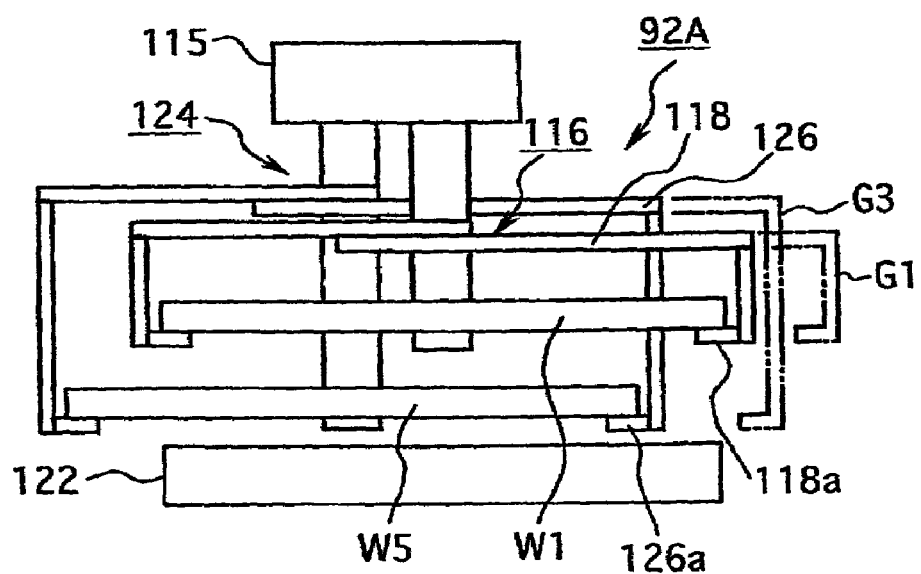
FIG. 11B shows a plan view of those shown in FIG. 11A.

FIG. 11A shows a plan view illustrating the load arm 116 and the unload arm 124 of the prealignment mechanism 92A. FIG. 11B shows a front view of FIG. 11A. For the convenience of explanation, the wafers W1, W5 are depicted with dotted lines in FIG. 11A. As shown in FIGS. 11A and 11B, the unload arm 124 comprises a first arm 125, a second arm 126, and a rotary elevating shaft 127, in the same manner as the load arm 116. The rotary elevating shaft 127 is driven by the driving section 115. The unload arm 124 also includes pawl-shaped holding sections 125*a*, 125*b*, 126*a* disposed at three places for holding the wafer W5 from the bottom surface. The second arm 126 is slidable in the movement direction of the wafer W5 as indicated by the position G3 of dotted line. However, the unload arm 124 is constructed so as to surround the load arm 116.

In this arrangement, the exposed wafer (wafer W5) on the wafer stage 40A shown in FIG. 3 is delivered to the unload arm 124 at the position A5 deviated in the oblique direction with respect to the prealignment position A1 as shown in FIG. 11A. After that, the wafer W1, which is the next exposure objective, is delivered to the load arm 116 by the aid of the slide arm 77A shown in FIG. 3. The exposed wafer W5 is delivered from the unload arm 124 to the slide arm 77A. The wafer W5 is exported toward the waiting chamber 72A shown in FIG. 3. The prealignment is performed for the wafer W1. The illuminating unit 122 is retracted. After that, the wafer W1 is loaded on the wafer stage 40A. As described above, the position A1 (B1 as well) of the prealignment of this embodiment is also the loading position.

FIG. 12 shows an example of the operation performed when the wafer W1 is delivered from the load arm 116 onto the wafer stage 40A. At first, as shown in FIG. 12A, the rotary elevating shaft 119 of the load arm 116 is moved downwardly at the position A1 at which the prealignment has been performed. As shown in FIG. 13B, the wafer W1 is placed on a wafer holder 128 on the wafer stage 40A disposed thereunder.

Figure 13A:
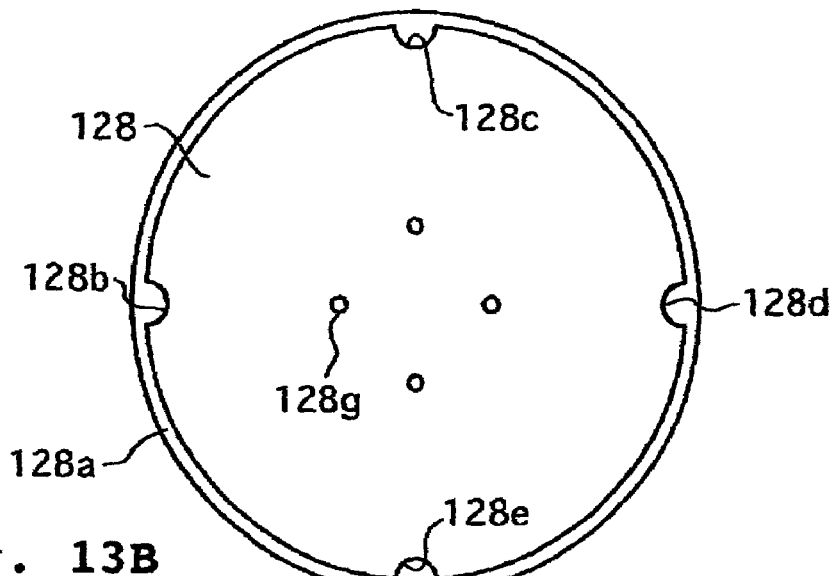
FIG. 13A shows a plan view illustrating an exemplary wafer holder of the embodiment.

FIG. 13A shows a plan view illustrating the wafer holder 128. FIG. 13B shows a sectional view of FIG. 13A. In FIG. 13A, the wafer W1 is omitted from the illustration for the purpose of better understanding, and the load arm 116 is also omitted from the illustration. As shown in FIGS. 13A and 13B, the wafer holder 128 is attracted and held in the recess on the wafer stage 40A by means of an unillustrated vacuum pump by the aid of attraction holes 129F and attraction grooves 128*f*. The wafer W1 disposed thereon is also attracted and held by means of the unillustrated vacuum pump by the aid of attraction holes 128g in the wafer holder 128 and attraction holes 129G on the wafer stage 40A. In addition to the stepped section 128a, cutouts 128b to 128e are formed on the upper surface of the wafer holder 128 at intervals of approximately 90°, in order to insert the holding sections 117a, 117b, 118a of the load arm 116 shown in FIG. 10 and the holding sections 125a, 125b, 126a of the unload arm 124 shown in FIG. 11.

Figure 12A:
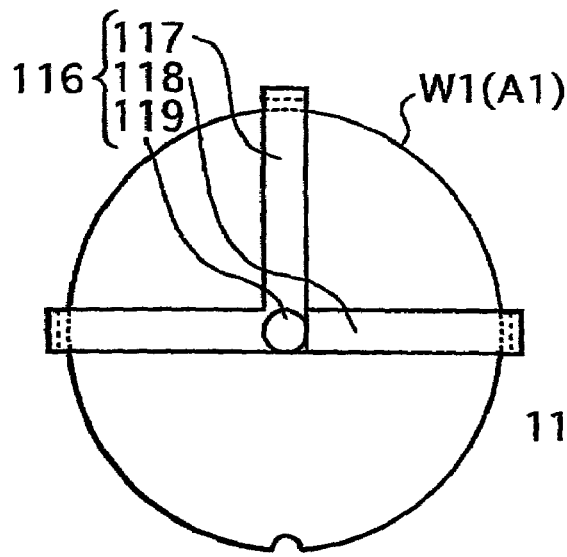
FIGS. 12A to 12D illustrate the operation performed when the wafer is loaded on the wafer stage by using the load arm 116.
Figure 12C:
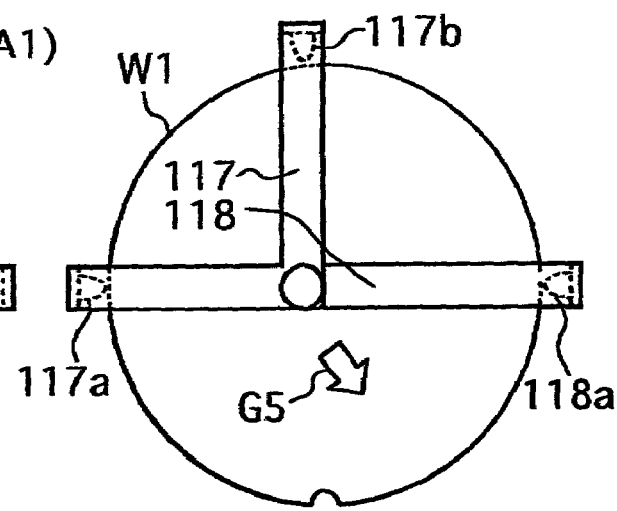
Figure 12B:
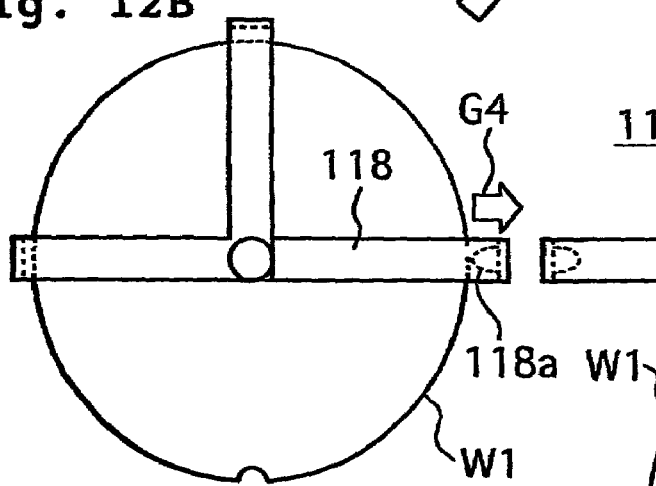
Figure 12D:
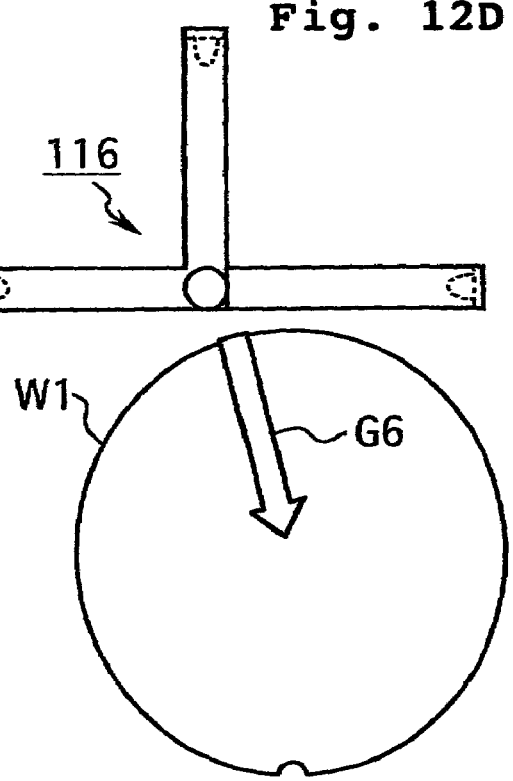
Figure 13B:
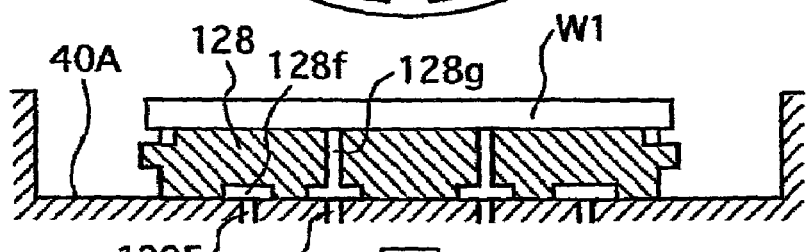
FIG. 13B shows a sectional view in which the part of the wafer stage corresponding to FIG. 13A is viewed from the front.

In this state, as shown in FIG. 12B, the second arm 118 is allowed to slide as indicated by the arrow G4 to disengage the holding section 118a from the bottom surface portion of the wafer W1. After that, as indicated by the arrow G5 in FIG. 12C, the wafer stage 40A is moved obliquely with respect to the load arm 116 to disengage all of the three holding sections 117a, 117b, 118a of the load arm 116 from the bottom surface portions of the wafer W1. When the load arm 116 is moved upwardly in this state, the wafer stage 40A is capable of being moved freely as shown by the arrow G6 in FIG. 12D. Therefore, the wafer stage 40A is moved to the position under the alignment sensor 27A shown in FIG. 3.

Figure 13C:
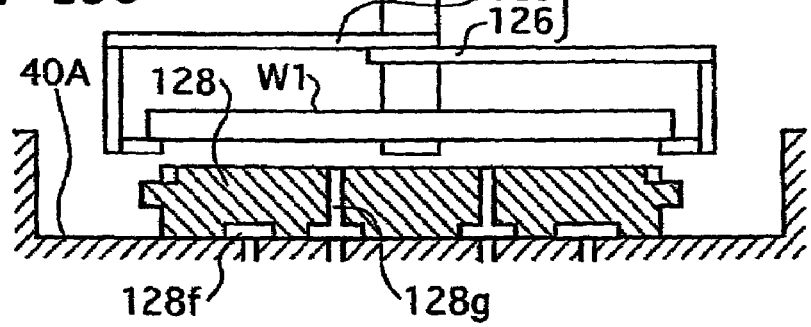
FIG. 13C shows a state in which the wafer W1 is moved upwardly from a state shown in FIG. 13B.
Figure 13D:
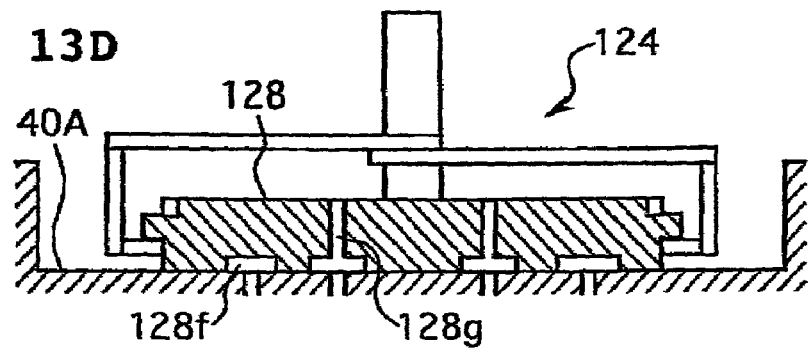
FIG. 13D shows a state in which the wafer holder 128 is further moved upwardly from the state shown in FIG. 13C.

After that, when the wafer W1 is exported from the wafer stage 40A after completing the alignment and the exposure for the wafer W1, the operation, which is approximately the reverse of the operation shown in FIGS. 12A to 12D, is performed to deliver the wafer W1 to the unload arm 124 as shown in FIG. 13C. During this process, the attraction effected by the attraction holes 128g is canceled. The wafer W1 is delivered to the slide arm 77A shown in FIG. 3. Further, when the wafer holder 128 itself is exported, as shown in FIG. 13D, the attraction effected by the attraction grooves 128f is also canceled. After that, the wafer holder 128 may be delivered to the unload arm 124 in the same manner as for the wafer W1.

As described above, in this embodiment, there is provided the prealignment mechanism 92A including the unload arm 124 and the load arm 116 including the holding sections 118a, 126a capable of sliding in the movement direction of the wafer. Therefore, the wafer can be imported and exported at a high speed with respect to the wafer stage 40A in accordance with the simple control. Further, the prealignment mechanism 92A is provided with the contour-detecting system. Therefore, the wafer can be installed in the approximately objective positional relationship with respect to the wafer stage 40A on the basis of the detection result thereof. Accordingly, the wafer alignment, which is performed with the alignment sensor 27A thereafter, can be carried out quickly.

An example of the entire operation of the wafer stage system WST and the wafer loader systems WLDA, WLDB shown in FIG. 3 will now be explained. At first, it is assumed that the scanning exposure is completed for the first wafer W1 on the first wafer stage 40A, and the scanning exposure is performed for the second wafer W2 on the second wafer stage 40B. The first wafer stage 40A is moved to the position A1, and then the second wafer stage 40B, for which the wafer alignment has been performed under the alignment sensor 27B, is moved toward the exposure area of the projection optical system PL to start the scanning exposure for the wafer W2 on the wafer stage 40B. Until this point of time, the unexposed wafer, which is disposed at the position A4 in the interface column 71, is transported to the position A3 in the preparatory chamber 73 by the aid of the transport robot 79A. At this place, the first prealignment is performed for the angle of rotation and the central position on the basis of the notch by using the image pickup devices 83A, 84A. After that, the wafer at the position A3 is transported to the position A2 on the temperature-adjusting unit 76A in the waiting chamber 72A by the aid of the transport robot 79A. At this place, the wafer is heated or cooled to a temperature suitable for the exposure, and then the wafer is transported to a position in the vicinity of the position A1 in the wafer chamber 38 by the aid of the slide arm 77A.

At the position A1, the exposed wafer W1, which is disposed on the wafer stage 40A, is delivered to the unload arm (not shown) of the prealignment mechanism 92A shown in FIG. 4. The unexposed wafer, which is disposed on the slide arm 77A, is delivered to the load arm (not shown) of the prealignment mechanism 92A. Subsequently, the exposed wafer on the unload arm is delivered onto the slide arm 77A, and then the shapes at three places at the outer circumferential portion of the unexposed wafer on the load arm are observed by the unillustrated image pickup device. Accordingly, the second prealignment is performed for the unexposed wafer. After that, the unexposed wafer is placed on the wafer stage 40A at the position A1, and it is moved to the position under the alignment sensor 27A by the aid of the wafer stage 40A to detect the search alignment mark on the unexposed wafer (search alignment) by means of the alignment sensor 27A and detect the fine alignment mark by using an obtained result. During this process, for example, the fine alignment is performed for the wafer in accordance with the enhanced global alignment (EGA) system. In the EGA system, for example, as disclosed in Japanese Patent Application Laid-Open No. 61-44429 (Japanese Patent Publication No. 4-47968), the coordinate positions of the alignment marks (wafer marks) affixed to a predetermined number of short areas (sample shots) selected on the wafer are measured to statistically process obtained measurement results. Accordingly, coordinates of all of the shot areas are determined.

In this embodiment, the search alignment and the fine alignment are collectively referred to as "wafer alignment". The wafer on the first wafer stage 40A, for which the wafer alignment has been completed, waits under the alignment sensor 27A until the scanning exposure for the wafer W2 on the second wafer stage 40B is completed. On the other hand, the exposed wafer W1, which is delivered from the wafer stage 40A to the slide arm 77A at the position A1, is moved to the position A2 in the waiting chamber 72A, and then it is transported by the transport robot 79A from the position A2 to the position A4 in the interface column 71. During this process, the wafer cassette for the exposed wafer waits at the position A4. The wafer W1 is accommodated in the wafer cassette. After that, the wafer cassette, which accommodates the unexposed wafer, is moved to the position A4. The unexposed wafer in the wafer cassette is transported by the transport robot 79A to the position A3 in the preparatory chamber 73.

Further, the wafer W2, which has been subjected to the exposure on the second wafer stage 40B, is transported to the position B1 in the wafer chamber 38. The first wafer stage 40A is moved toward the exposure area of the projection optical system PL to start the scanning exposure for the wafer on the wafer stage 40A. During this process, the unexposed wafer, which has been subjected to the temperature control, is transported to a position in the vicinity of the position B1 from the position B4 via the positions B3, B2 by the aid of the transport robot 79B and the slide arm 77B. The unexposed wafer on the slide arm 77B is exchanged with the exposed wafer W2 on the wafer stage 40B by the aid of the prealignment mechanism 92B shown in FIG. 4. After that, the unexposed wafer is subjected to the second prealignment at the position B1. On the other hand, the exposed wafer W2 is transported from the position B2 to the position B4 by the aid of the slide arm 77B and the transport robot 79B.

As described above, in this embodiment, the wafer stage WST and the wafer loader systems WLDA, WLDB are incorporated into the wafer chamber 38 and the wafer loader chamber 70 respectively while being constructed as modules. However, the second prealignment is performed at the positions A1, B1 in the wafer chamber 38. Therefore, it is unnecessary that the positional relationship between the wafer chamber 38 and the wafer loader chamber 70 during the assembling is extremely strict. That is, the projection exposure apparatus can be assembled and adjusted with ease. Further, it is possible to perform the wafer alignment highly accurately. In this embodiment, the prealignment mechanisms 92A, 92B including, for example, the load arm 116 and the unload arm 124 have been arranged in the wafer chamber 38. However, for example, the prealignment mechanisms 92A, 92B may be incorporated into the wafer loader chamber 70 in accordance with the module system together with the wafer loader systems WLDA, WLDB. In this arrangement, in order to shorten the exchange time for the wafer, it is preferable that the unload arm and the load arm for holding the wafer completed for the prealignment are allowed to wait in the space over the exchange position, prior to the arrival of the wafer stage at the exchange position for the wafer.

Accordingly, even when the exposure process is performed for the wafer, it is possible to avoid any decrease in exposure accuracy which would be otherwise caused, for example, by the vibration generated by the preparatory operation (including the driving operation of the load arm and the unload arm) for the wafer exchange. In this arrangement, the prealignment accuracy may be decreased due to any variation of the relative positional relationship between the wafer chamber 38 and the wafer loader chamber 70. Therefore, it is desirable that a sensor (for example, a gap sensor) for detecting the positional relationship is provided, if necessary. Further, it is desirable, for example, that the relative positional relationship between the wafer stage and the load arm is adjusted on the basis of the obtained result of the detection and the result of the prealignment to deliver the wafer.

In this embodiment, when the unexposed wafer or the exposed wafer passes through, for example, the transport ports 74A, 74B in FIG. 3, then the corresponding shutters 75A, 75B, 78A, 78B, 85A, 85B are opened, and the corresponding shutters 75A, 75B to 85A, 85B are closed during the period in which the wafer does not pass therethrough. The control is made such that when the shutters 75A, 75B are open, the shutters 78A, 78B or the shutters 85A, 85B are closed. The interior of the wafer chamber 38 does not make direct communication with the interior of the interface column 71, i.e., the atmospheric air. Therefore, the concentration of the purge gas at the inside of the wafer chamber 38 is always maintained to be high.

Next, explanation will be made in detail with reference to FIGS. 6 and 7 for an example of the method for assembling the wafer loader chamber 70 and the wafer chamber 38 shown in FIG. 3.

Figure 6:
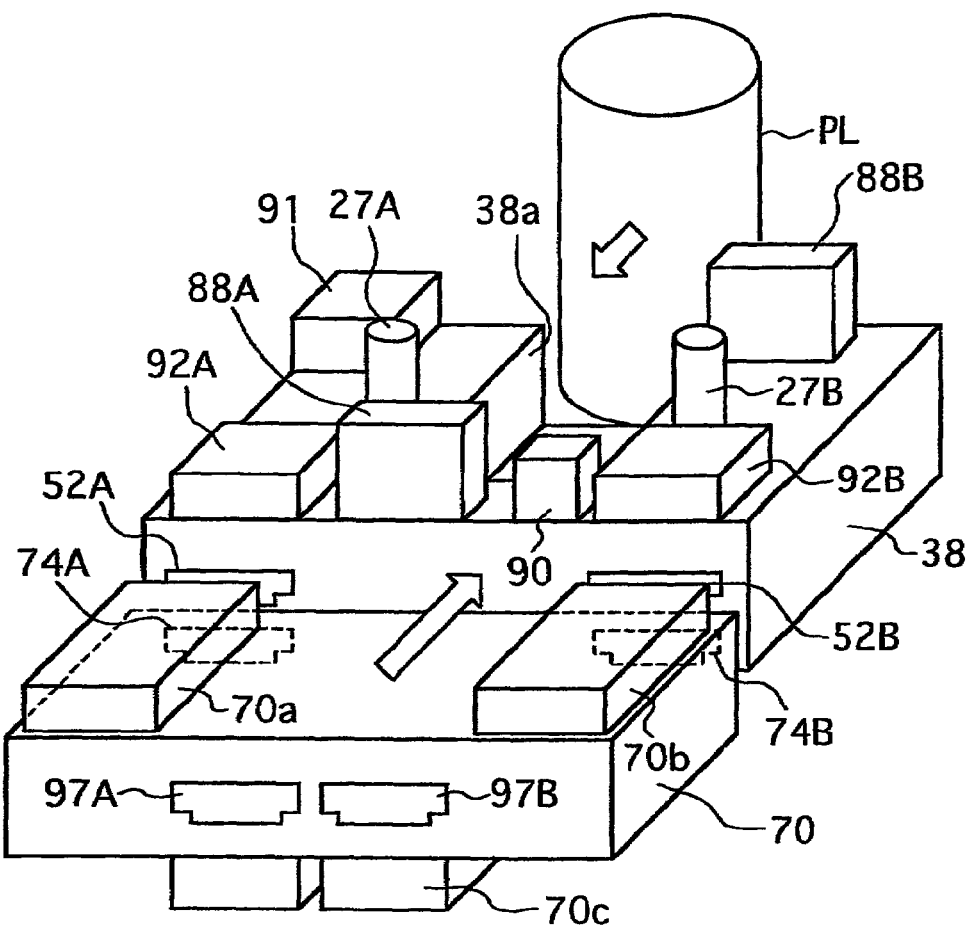
FIG. 6 shows a perspective view illustrating a state during assembling and adjustment of a projection optical system PL, the wafer chamber 38, and the wafer loader chamber 70 shown in FIG. 2 (or FIG. 3).

FIG. 6 shows a perspective view illustrating a state in which the wafer chamber 38, the wafer loader chamber 70, and the projection optical system PL shown in FIG. 3 are assembled and adjusted. In FIG. 6, for example, the laser light source unit 91, the prealignment mechanisms 92A, 92B, the AF sensors 88A, 88B, and the alignment sensors 27A, 27B protrude as projections on the upper surface of the wafer chamber 38. The groove 38a, with which the projection optical system PL is relatively movable in the horizontal direction, is formed between these components. The driving units 70a, 70b, in which the driving apparatuses for driving the slide arms 77A, 77B shown in FIG. 3 are accommodated, are installed on the upper surface of the wafer loader chamber 70. The vibration-preventive pedestals 70C are arranged on the bottom surface of the wafer loader chamber 70. Further, the transport ports, through which the wafer is transported with respect to the interface column 71 shown in FIG. 3, are formed at the front surface portions of the wafer loader chamber 70. The transport ports are opened/closed by the shutters 85A, 85B shown in FIG. 3.

Figure 7A:
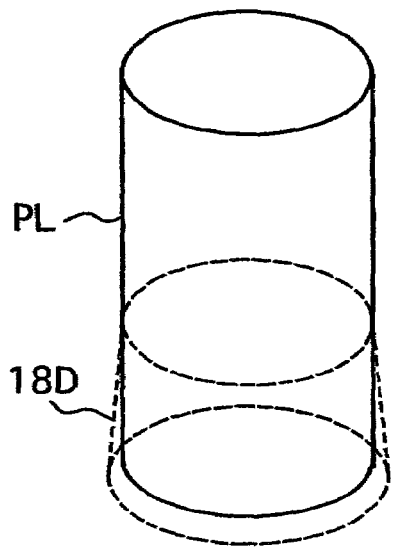
FIG. 7A shows a soft shield member 18D disposed between the projection optical system PL and the wafer chamber.
Figure 7B:
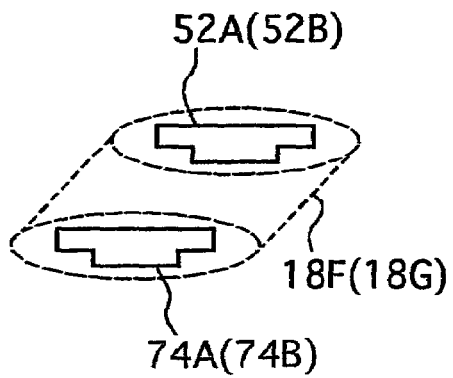
FIG. 7B shows a soft shield member 18F disposed between transport ports 52A, 74A.

When the projection exposure apparatus of this embodiment is assembled and adjusted, the wafer chamber 38 is assembled together with the wafer stage system WST among them, substantially concurrently with which the wafer loader chamber 70 is assembled together with the wafer loader systems WLDA, WLDB among them. After that, the projection optical system PL is installed to the frame mechanism shown in FIG. 2, and then the wafer chamber 38 is installed to the frame mechanism so that the projection optical system PL is relatively movable along the groove 38a as indicated by the arrow shown in FIG. 6. Subsequently, the wafer loader chamber 70 is installed so that the transport ports 74A, 74B of the wafer loader chamber 70 are opposed to the transport ports 52A, 52B of the wafer chamber 38. After that, as shown in FIG. 7A, the soft shield member 18D is installed so that the gap between the lower end of the projection optical system PL and the groove 38a of the wafer chamber 38 is tightly closed. The soft shield member 18F (or 18G) is installed so that the space between the transport port 52A (or 52B) and the transport port 74A (or 74B) is isolated from the atmospheric air.

The other components, i.e., for example, the illumination optical system and the reticle chamber 23 are assembled and adjusted in the same manner as described above. After that, the overall adjustment (for example, electric adjustment and confirmation of operation) is performed. Thus, the projection exposure apparatus shown in FIGS. 1 and 2 is successfully produced in a short period of time in accordance with the module system or the box system. It is desirable that the foregoing operations are performed in the clean room.

Figure 14A:
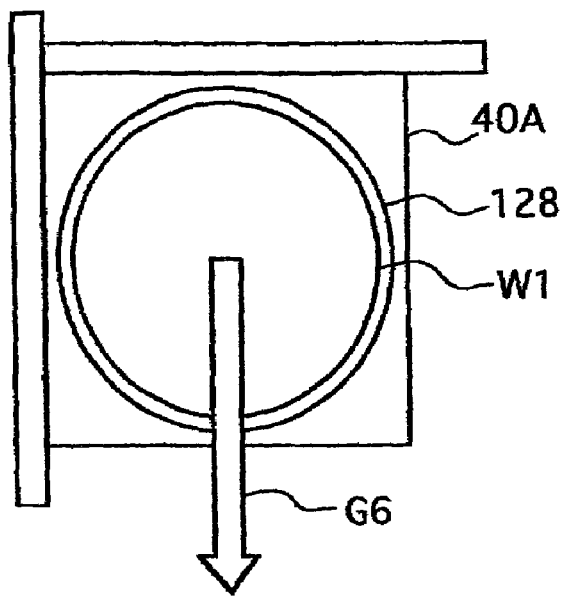
FIGS. 14A and 14B illustrate the operation for exporting the wafer according to another embodiment of the present invention.
Figure 14B:
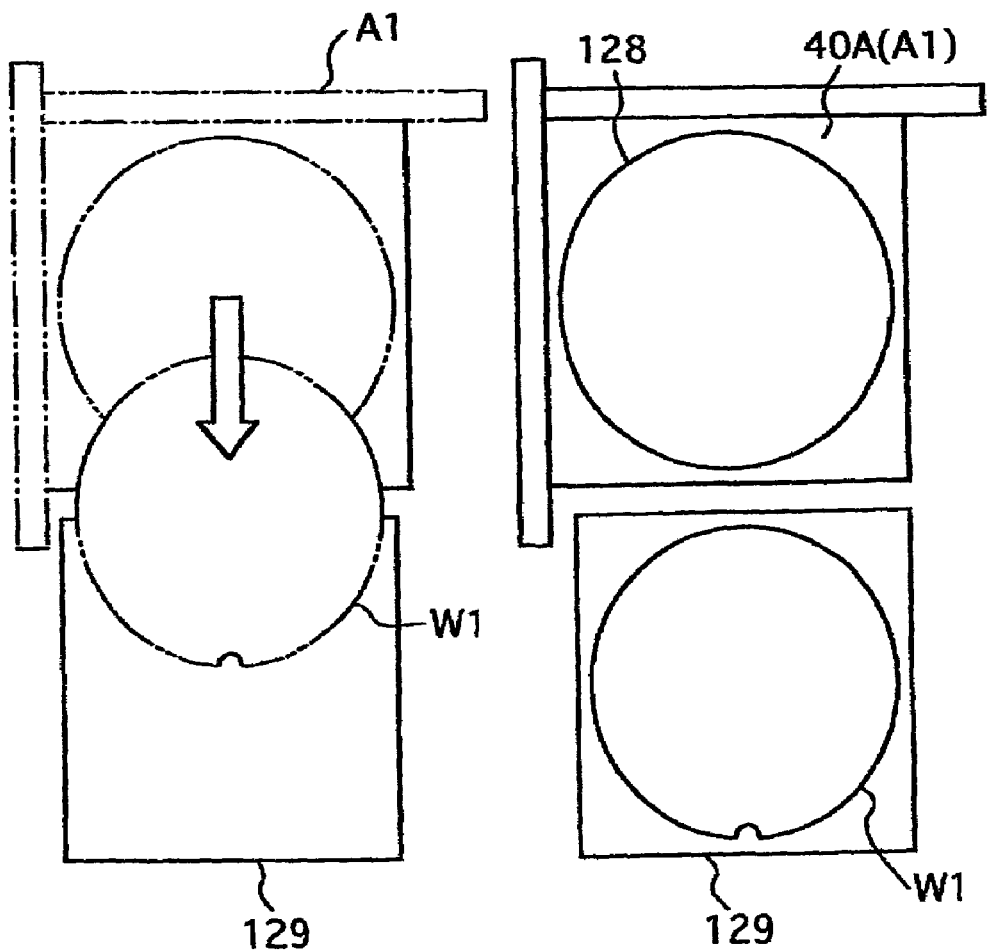

The wafer can be also exported in accordance with another method as shown in FIG. 14. In FIG. 14A, the wafer W1 is held on the wafer stage 40A by the aid of a wafer holder 128. A flat plate-shaped wafer support plate 129 is supported by an unillustrated movable slider on the further front side of the position A1 to perform the prealignment on the front side with respect to the wafer stage 40A. The height of the wafer support plate 129 is set to be slightly lower than that of the wafer holder 128. A stopper composed of a semicircular stepped section (not shown) and a mechanism for attracting and holding the wafer (for example, attraction hole for vacuum attraction) are provided on the upper surface of the wafer support plate 129. In this state, the wafer stage 40A is moved at a predetermined velocity in the direction toward the position A1 (direction indicated by the arrow G6). The attraction for the wafer W1, which is effected by the wafer holder 128, is canceled at a position in the vicinity of the position A1, and the wafer stage 40A is suddenly stopped (see the position depicted by chain lines at lower part of FIG. 14A). Accordingly, the wafer W1 is moved to the upper surface of the wafer support plate 129 in accordance with the inertial force, and it is stopped by the stopper described above as shown in FIG. 14B. After that, for example, the attraction for the wafer W1 is started, and the wafer support plate 129 is exported by using the unillustrated slider. Thus, the wafer W1 is exported at a high speed.

In the embodiment described above, the wafer is transported singly. Alternatively, the wafer may be transported integrally with an accompanying member which facilitates the transport of the wafer.

Figure 15A:
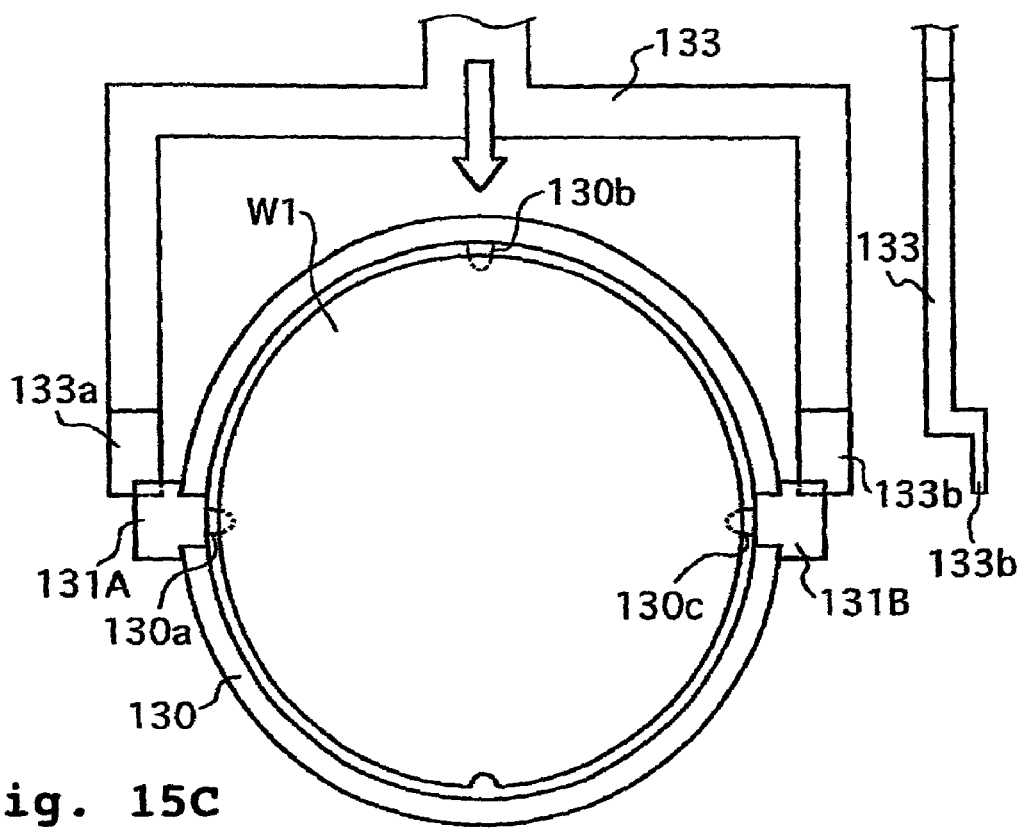
FIGS. 15A to 15D show a transport mechanism for the wafer according to another embodiment of the present invention.
Figure 15B:
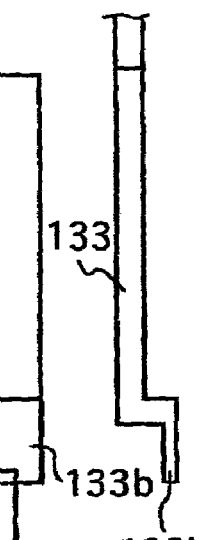
Figure 15C:
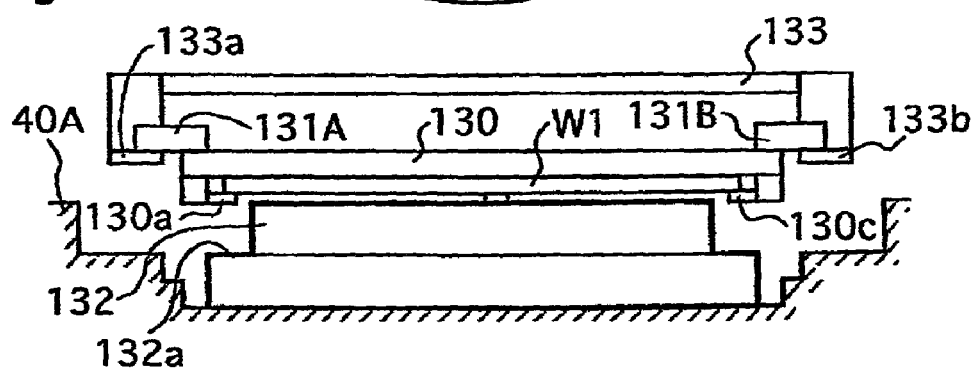

FIG. 15A shows a plan view illustrating the wafer stage to be used when the wafer W1 is transported integrally with the accompanying member. FIG. 15B shows a side view illustrating a part thereof. FIG. 15C shows a front view in which a part of the wafer stage 40A shown in FIG. 15 is depicted in cross section. As shown in FIGS. 15A, 15B, and 15C, a disk-shaped wafer holder 132, which has a stepped section 132, is held in the recess of the upper surface of the wafer stage 40A. The wafer W1 is supported by a holding ring 130 thereover. That is, the holding ring 130 surrounds the wafer W1. The bottom surface of the wafer W1 is supported by pawl-shaped holding sections 130a, 130b, 130c which are provided at three places at intervals of 90° for the holding ring 130. Grip sections 131A, 131B, which are provided at the upper surface of the holding ring 130 while being separated from each other by 180°, are supported by two tips 133a, 133b of a fork-shaped transport arm 133.

Figure 15D:
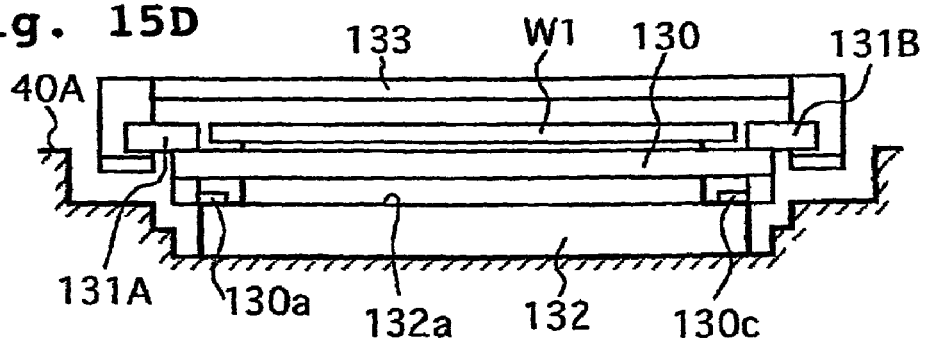

When the wafer W1 is loaded, then the transport arm 133 is moved downwardly from the state shown in FIG. 15C, and the holding sections 130a to 130c of the holding ring 130 are placed on the stepped section 132a of the wafer holder 132 as shown in FIG. 15D. By doing so, the wafer W1 is placed on the upper surface of the wafer holder 132 at an intermediate point of the foregoing process. After that, for example, the wafer stage 40A is slightly moved in the frontward direction to move the transport arm 133 upwardly. Accordingly, the load of the wafer W1 is completed. When the wafer W1 is exported, the reverse of the foregoing operation may be performed.

As described above, in the embodiment shown in FIG. 15, the wafer W1 is transported integrally with the holding ring 130 as the accompanying member. Therefore, for example, when the grip sections 131A, 131B of the holding ring 130 are enlarged, it is possible to transport the holding ring 130 and the wafer W1 with the transport arm 133 reliably and easily.

Next, another embodiment of the present invention will be explained. At first, another illustrative arrangement of the wafer stage system WST of the projection exposure apparatus described above will be explained with reference to FIGS. 16 to 19. In the case of the wafer stage system WST shown in FIG. 3, the X axis guide members 41, 42 are commonly used for the two wafer stages 40A, 40B. On the contrary, in the case of this illustrative arrangement, the two wafer stages 40A, 40B are independently provided with X axis guide members. In FIGS. 16 to 19, components or parts corresponding to those shown in FIGS. 1 to 3 are designated by the same reference numerals, detailed explanation of which will be omitted.

Figure 16:
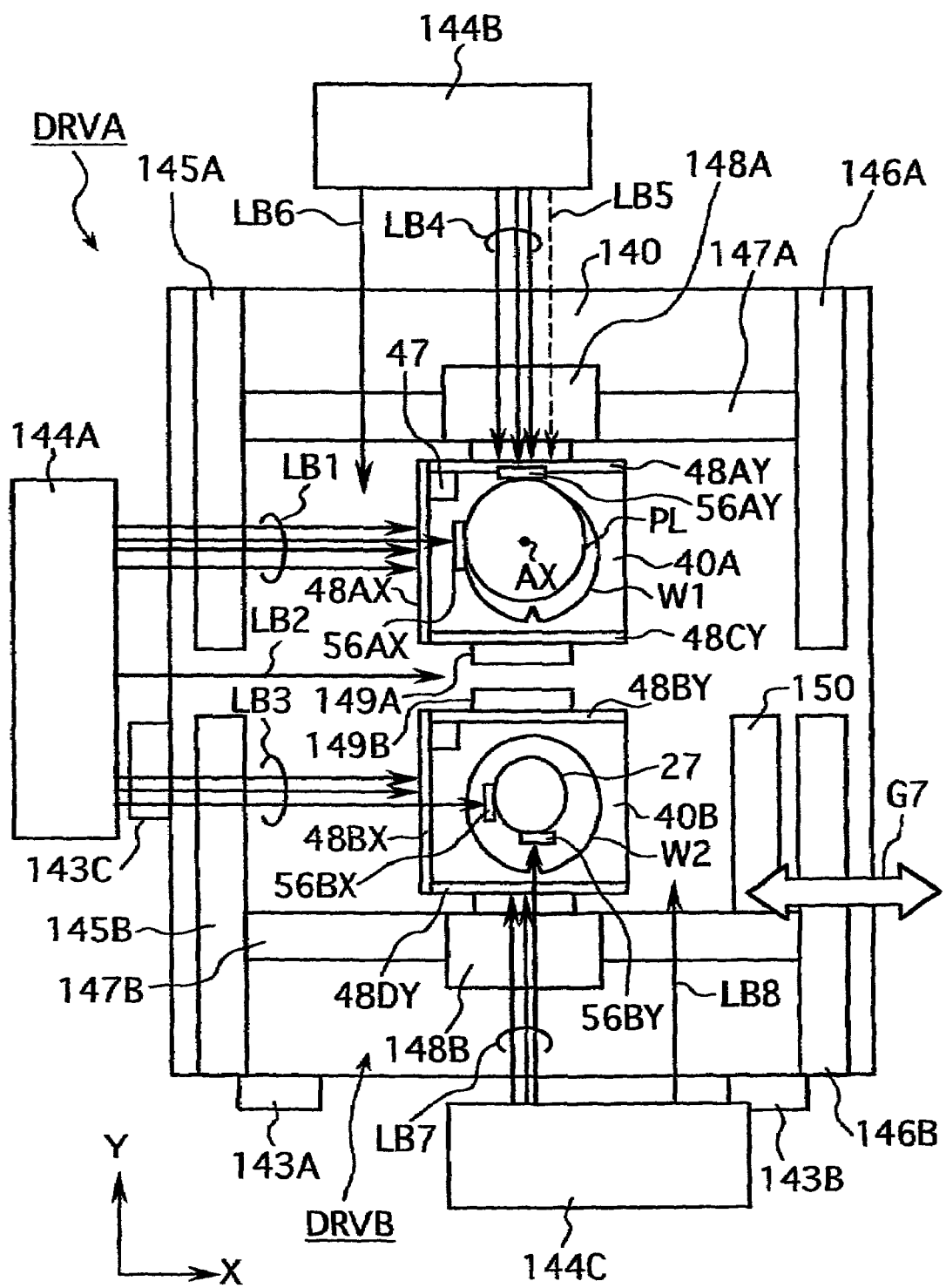
FIG. 16 shows a plan view illustrating a wafer stage system according to another embodiment of the present invention.
Figure 17:
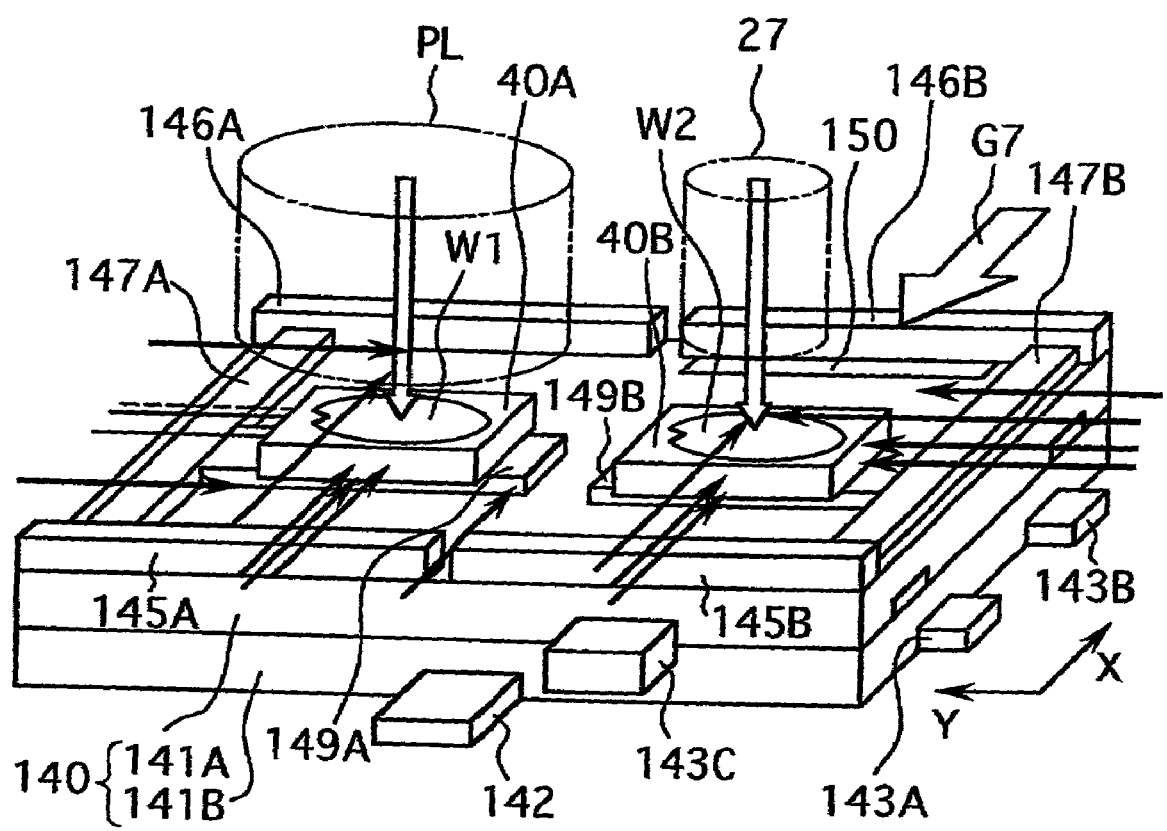
FIG. 17 shows a perspective view illustrating the wafer stage system shown in FIG. 16.

FIG. 16 shows a plan view illustrating another exemplary arrangement of the wafer stage system, and FIG. 17 shows a perspective view illustrating the wafer stage system shown in FIG. 16. As shown in FIG. 17, a wafer base 140, which has a structure obtained by stacking a first movable base 141A and a second movable base 141B, is placed on an unillustrated base plate. Movable exchange tables 149A, 149B, which are slidable in the X direction and in the Y direction by the aid of air bearings, are placed in parallel on the wafer base 140. Wafer stages 40A, 40B for supporting wafers W1, W2 are fixed on the movable exchange tables 149A, 149B respectively. Each of the wafer stages 40A, 40B of this embodiment is a stage obtained by removing the mechanism for making the driving in the Y direction from the wafer stage 40A, 40B shown in FIG. 3. The wafer stage 40A, 40B of this embodiment is provided with the function to perform the focusing and the leveling. A projection optical system PL is arranged thereover on the side in the +Y direction. An alignment sensor, which is based on the off-axis system and the image pickup system, is arranged on the side in the −Y direction.

The second movable base 141B is placed slidably in the X direction by the aid of an air bearing along a guide member 142. The first movable base 141A is placed thereon slidably in the Y direction by the aid of an air bearing. The position of the first movable base 141A in the Y direction is adjusted by a linear motor 143C. The position of the second movable base 141B is also adjusted by linear motors 143A, 143B. That is, the wafer base 140 of this embodiment is constructed such that when the movable exchange tables 149A, 149B disposed thereon are moved in the X direction or in the Y direction, the wafer base 140 is moved in the opposite direction while satisfying the law of conservation of momentum. Further, the position in the X direction or the Y direction can be returned, for example, to the center of the movable range (neutral position), if necessary. Accordingly, the occurrence of any vibration is suppressed.

With reference to FIG. 16, a pair of first Y axis guides 145A, 146A and a pair of second Y axis guides 145B, 146B are fixed at predetermined intervals in the X direction closely in the Y direction on the wafer base 140. A first X axis guide member 147A and a second X axis guide member 147B are arranged between the Y axis guides 145A, 146A and the Y axis guides 145B, 146B so that they are driven in the Y direction in accordance with the linear motor system respectively. A first X axis slider 148A and a second X axis slider 148B are arranged along the X axis guide members 147A, 147B so that they are driven in the X direction in accordance with the linear motor system respectively. The movable exchange tables 149A, 149B are connected to the X axis sliders 148A, 148B. In this embodiment, the movable exchange tables 149A, 149B are constructed such that they may be separated from the X axis sliders 148A, 148B and they may be connected to other X axis sliders 148A, 148B, if necessary.

The movable exchange tables 149A, 149B may be constructed to be detachable with respect to the X axis sliders 148A, 148B, for example, by means of the magnetic force. For example, an electromagnet may be installed to the inside of any one of or both of the movable exchange tables 149A, 149B and the X axis sliders 148A, 148B. When the stages are exchanged, the electromagnetic force may be demagnetized to make separation between the movable exchange table 149A and the X axis slider 184A and between the movable exchange table 149B and the X axis slider 148B. After the movable exchange tables 149A, 149B are moved to predetermined positions to be exchanged, the electromagnet may be magnetized. Accordingly, the movable exchange table 149A may be connected to the X axis slider 148B, and the movable exchange table 149B may be connected to the X axis slider 148A. The detachable connecting relationship between the movable exchange tables 149A, 149B and the X axis sliders 148A, 148B may be effected not only by the magnetic force but also by the suction or attraction force or the mechanical coupling force. A technique concerning the lithography apparatus, in which a pair of movable units are exchanged with respect to a pair of actuators for driving the movable units by using a joint member composed of Lorentz actuator, is disclosed in U.S. Pat. No. 5,969,441. This patent document is incorporated herein by reference.

A first driving system DRVA is constructed by the first Y axis guides 145A, 146A, the X axis guide member 147A, and the X axis slider 148A. A second driving system DRVB is constructed by the second Y axis guides 145B, 146B, the X axis guide member 147B, and the X axis slider 148B. The first movable exchange table 149A (wafer stage 40A) and the second movable exchange table 149B (wafer stage 40B) are exchangeable with each other, and they are driven in the X direction, the Y direction, and the direction of rotation by the aid of the first driving system DRVA or the second driving system DRVB. In this arrangement, the first driving system DRVA drives the wafer stages 40A, 40B under the projection optical system PL. The second driving system DRVB drives the wafer stages 40A, 40B under the alignment sensor 27.

In this embodiment, an X axis wafer interferometer 144A and two Y axis wafer interferometers 144B, 144C, which are composed of laser interferometers, are provided for measuring the positions of the wafer stages 40A, 40B. The X axis wafer interferometer 144A supplies a multiple-axis measuring beam LB1 radiated along the X axis so that the optical axis AX of the projection optical system PL is the center, a multiple-axis measuring beam LB3 radiated along the X axis so that the detection center of the alignment sensor 27 is the center, and a measuring beam LB2 radiated at an intermediate position therebetween. In the state shown in FIG. 16, the laser beams of the three axes of the measuring beam LB1 are radiated onto an X axis movement mirror 48AX of the wafer stage 40A, and the laser beam of the one axis is radiated onto a reference mirror 56AX of the projection optical system PL. The position of the wafer stage 40A in the X direction, the angle of rotation about the Z axis (yawing amount), and the angle of rotation about the Y axis (rolling amount) are measured on the basis of the projection optical system PL. The laser beams of the two axes of the measuring beam LB3 are radiated onto an X axis movement mirror 48B of the wafer stage 40B, and the laser beam of the one axis is radiated onto a reference mirror 56BX of the alignment sensor 27. The position of the wafer stage 40B in the X direction and the yawing amount are measured on the basis of the alignment sensor 27.

The first Y axis wafer interferometer 144B supplies a multiple-axis measuring beam LB4 radiated along the Y axis so that the optical axis AX of the projection optical system PL is the center, and a measuring beam LB6 separated therefrom in the X direction in the −Y direction. As shown by dotted lines, a measuring beam LB5 separated in the Z direction may be supplied together with the measuring beam LB4. In the state shown in FIG. 16, the laser beams of the two axes of the measuring beam LB4 are radiated onto a movement mirror 48AY of the wafer stage 40A, and the laser beam of the one axis is radiated onto a reference mirror 56AY of the projection optical system PL. The position of the wafer stage 40A in the Y direction and the yawing amount are measured on the basis of the projection optical system PL. In this embodiment, the incoming position of the laser beam with respect to the movement mirror 48AX is set to be at the same height as that of the surface of the wafer W1. Therefore, no Abbe error is generated by the pitching. However, in order to measure the position more accurately, it is desirable that the measuring beam LB5 is also supplied to measure the angle of rotation (pitching amount) about the X axis of the wafer stage 40A.

Symmetrically therewith, the second Y axis wafer interferometer 144C supplies, in the +Y direction, a multiple-axis measuring beam LB7 radiated along the Y axis so that the detection center of the alignment sensor 27 is the center, and a measuring beam LB8 separated therefrom in the X direction. In the state shown in FIG. 16, the laser beams of the two axes of the measuring beam LB7 are radiated onto a Y axis movement mirror 48DY of the wafer stage 40B, and the laser beam of one axis is radiated onto a reference mirror 56BY of the alignment sensor 27. The position of the wafer stage 40B in the Y direction and the yawing amount are measured on the basis of the alignment sensor 27.

In this embodiment, the wafer stages 40A, 40B can be connected to other X axis guide members 147B, 147A respectively together with the movable exchange tables 149A, 149B. In order to make it possible to measure the position in the Y direction in this case as well, second Y axis movement mirrors 48CY, 48BY are fixed to the wafer stages 40A, 40B respectively. In order to make it possible to measure the positions in the X direction and the Y direction during the exchange of the wafer stages 40A, 40B as well, the X axis measuring beam LB2 and the Y axis measuring beams LB6, LB8 are used. Measured values obtained by the wafer interferometers 144A to 144C are added with previously determined offsets so that the result of the measurement of the position based on the projection optical system PL is coincident with the result of the measurement of the position based on the alignment sensor 27.

In this embodiment, it is feared that the X axis measuring beams LB2 and LB3 are intercepted during the period in which the wafer stages 40A, 40B are exchanged, and it is impossible to measure, for example, the position of one of the wafer stages 40B in the X direction. In order to maintain a certain constant value for the position of the wafer stage 40B in the X direction even in such a case, a linear encoder 150, which is based on, for example, the photoelectric system, the magnetic system, or the electrostatic capacity system, is installed in the vicinity of the Y axis guide 146B in order that the X coordinate of the wafer stage 40B (or 40A) disposed thereon is measured highly accurately within a narrow range. In place of the use of the linear encoder 150, a measuring beam, which is branched, for example, into four or more sets, may be supplied in the Y direction from the wafer interferometer 144A, and the length of the movement mirror 48BX of the second wafer stage 40B in the Y direction may be lengthened, for example, as compared with the movement mirror 48AX of the first wafer stage 40A. In this arrangement, when the movable exchange tables 149A, 149B are exchanged, the position in the X direction can be always measured by disposing the first movable exchange table 149A on the side of the wafer interferometer 144A (on the side in the −X direction) and disposing the second movable exchange table 149B on the side in the +X direction.

In this embodiment, the loading position of the wafer is set on the side in the +X direction in the −Y direction as the position close to the alignment sensor 27. The wafer is delivered as indicated by the arrow G7 between the wafer stage at the loading position and the unillustrated wafer loader system. That is, in the projection exposure apparatus of this embodiment, the loading position (also as the pre-alignment position in this embodiment) is located at one place, and the wafer loader system is single.

In this embodiment, the exposure is performed by driving the wafer stage 40A by using the first driving system DRVA, during which the wafer stage 40B is moved in the +X direction and the −Y direction by using the second driving system DRVB to deliver the wafer with respect to the unillustrated wafer loader system in the direction indicated by the arrow G7. After that, the wafer stage 40B is moved to the position under the alignment sensor 27 to perform the alignment for the wafer W2. The X axis guide members 147A, 147B are allowed to make approach to exchange the wafer stages 40A, 40B. After that, the exposure is performed for the wafer W2 by driving the wafer stage 40B by using the first driving system DRVA. During this process, in this embodiment, the wafer stages 40A, 40B can be driven completely independently in the X direction and in the Y direction respectively in the state in which the law of conservation of momentum is satisfied. Thus, the occurrence of vibration is suppressed. Since the alignment sensor 27 is single, it is possible to miniaturize the wafer base 140, and it is possible to decrease the foot print (installation area) of the exposure apparatus.

With reference to FIG. 17, the wafer stage system of this embodiment is accommodated in the unillustrated wafer chamber having the air-tightness as a whole. The gap at the upper surface with respect to the outer circumferential portions of the alignment sensor 27 and the projection optical system PL is tightly closed by a soft shield member (not shown) which is equivalent to the soft shield member 18D shown in FIG. 2. Accordingly, the wafer stage system of this embodiment can be also assembled efficiently in accordance with the module system or the box system.

In the projection exposure apparatus shown in FIG. 16, the movable exchange tables 149A, 149B are exchanged as a whole. Alternatively, for example, an exchanging robot arm (not shown) may be installed so that the movable exchange tables 149A, 149B may be fixed to the X axis guide members 147A, 147B respectively, and only the portions of the wafer stages 40A, 40B may be exchanged. Further alternatively, the wafer holders (not shown) for holding the wafers W1, W2 may be exchangeable so that the wafer holders and the wafers W1, W2 disposed thereon may be exchangeable in an integrated manner.

However, in the case of the projection exposure apparatus shown in FIGS. 16 and 17, when the wafer stages 40A, 40B are exchanged, the two sets of the movement mirrors 48AY, 48CY, 48BY, 48DY of the Y axis interferometers are switched as the measurement objectives. Therefore, it is feared that any offset appears on the result of the measurement of the position in the Y direction. The offset can be previously determined highly accurately. In this case, it is desirable to adopt the following procedure. That is, for example, the bending amount (flatness) of the measuring plane of each of the movement mirrors 48AY, 48CY, 48BY, 48DY is measured beforehand. When the movement state is controlled while monitoring the position of the wafer stage 40A (or 40B) with the exposing wafer interferometer 144B by using the result of the detection effected by the alignment sensor 27, the variation amount of the measured value, which is caused by the bending of the two sets of the movement mirrors, is corrected. In this arrangement, in the case of the interferometer for measuring the rolling amount or the pitching amount, the measuring beams thereof are separated in the Z direction by a predetermined spacing distance. Therefore, it is desirable that the bending amount is measured at the position of each of the measuring beams.

Alternatively, other than the system in which the offset is determined highly accurately as described above, it is possible to adopt a system in which a common Y axis movement mirror is used.

Figure 18:
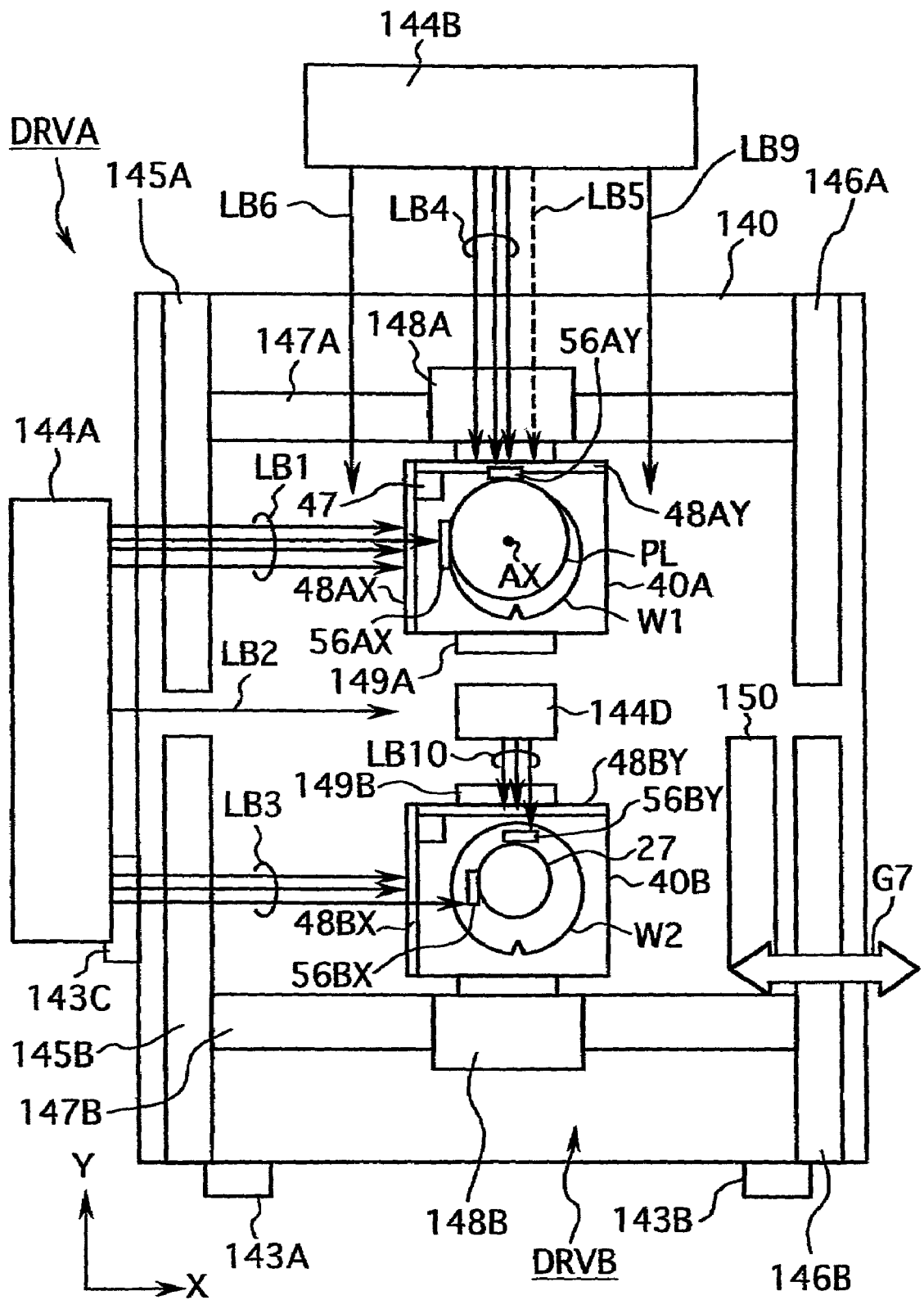
FIG. 18 shows a plan view illustrating a modified embodiment of the wafer stage system shown in FIG. 16.
Figure 19:
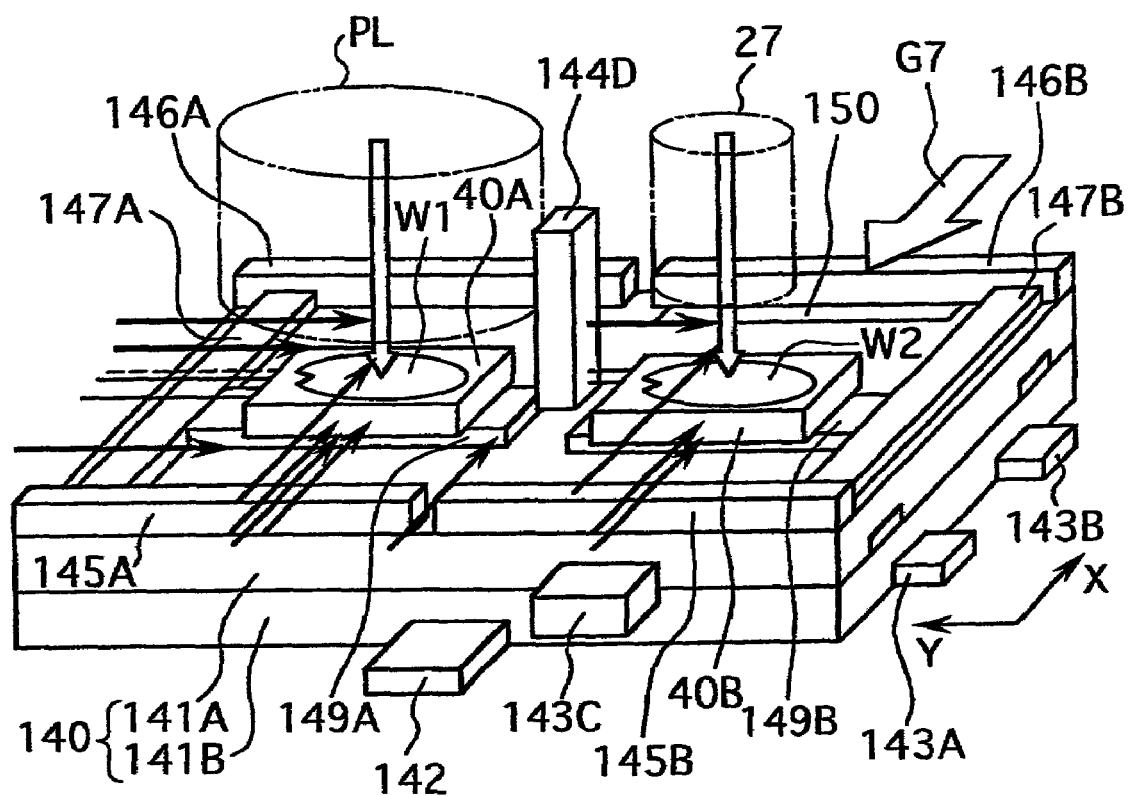
FIG. 19 shows a perspective view illustrating the wafer stage system shown in FIG. 18.

FIGS. 18 and 19 show a modified embodiment in which a common Y axis movement mirror is used as described above. In FIGS. 18, 19, components or parts corresponding to those shown in FIGS. 16 and 17 are designated by the same reference numerals, detailed explanation of which will be omitted.

FIG. 18 shows a wafer stage system according to the modified embodiment, and FIG. 19 shows a perspective view thereof. As shown in FIGS. 18 and 19, each of wafer stages 40A, 40B of this embodiment is provided with only one Y axis movement mirror 48AY, 48BY on the side in the +Y direction. A wafer interferometer 144D for radiating a multiple-axis measuring beam LB10 in the −Y direction, which is used as a laser interferometer for measuring the position in the Y direction with respect to the alignment sensor 27, is arranged between the projection optical system PL and the alignment sensor 27. In the state shown in FIG. 18, two laser beams of two axes of the measuring beam LB10 are radiated onto the movement mirror 48BY, and a laser beam of one axis is radiated onto a reference mirror 56BY of the alignment sensor 27. In this arrangement, the wafer stages 40A, 40B cannot pass through portions in the vicinity of the center. Therefore, a measuring beam LB9, which is symmetrical to the measuring beam LB6, is supplied so that the Y coordinate of the wafer stage 40A, 40B moved in the +X direction is successfully measured, by the Y axis wafer interferometer 144B for the projection optical system PL. The other parts are constructed in the same manner as those shown in FIGS. 16 and 17.

Also in this modified embodiment, the wafer stages 40A, 40B are exchanged with each other to successively perform the exposure and the alignment. However, it is necessary to avoid the central wafer interferometer 144D during the exchange. However, owing to the presence of the wafer interferometer 144D, the Y axis movement mirrors 48AY, 48BY are used for measuring the position as they are, even when the wafer stages 40A, 40B are exchanged. Therefore, an advantage is obtained such that the positions of the wafer stages 40A, 40B in the Y direction can be continuously measured highly accurately during both of the alignment and the exposure. The wafer stage of this modified embodiment can be also assembled efficiently in accordance with the module system or the box system.

Next, a projection exposure apparatus according to still another embodiment of the present invention will be explained with reference to FIGS. 20 to 24. Also in this embodiment, the present invention is applied to the projection exposure apparatus of the scanning exposure type based on the step-and-scan system. In FIGS. 20 to 24, components or parts corresponding to those shown in FIGS. 1 to 3 are designated by the same reference numerals, detailed explanation of which will be omitted.

Figure 20:
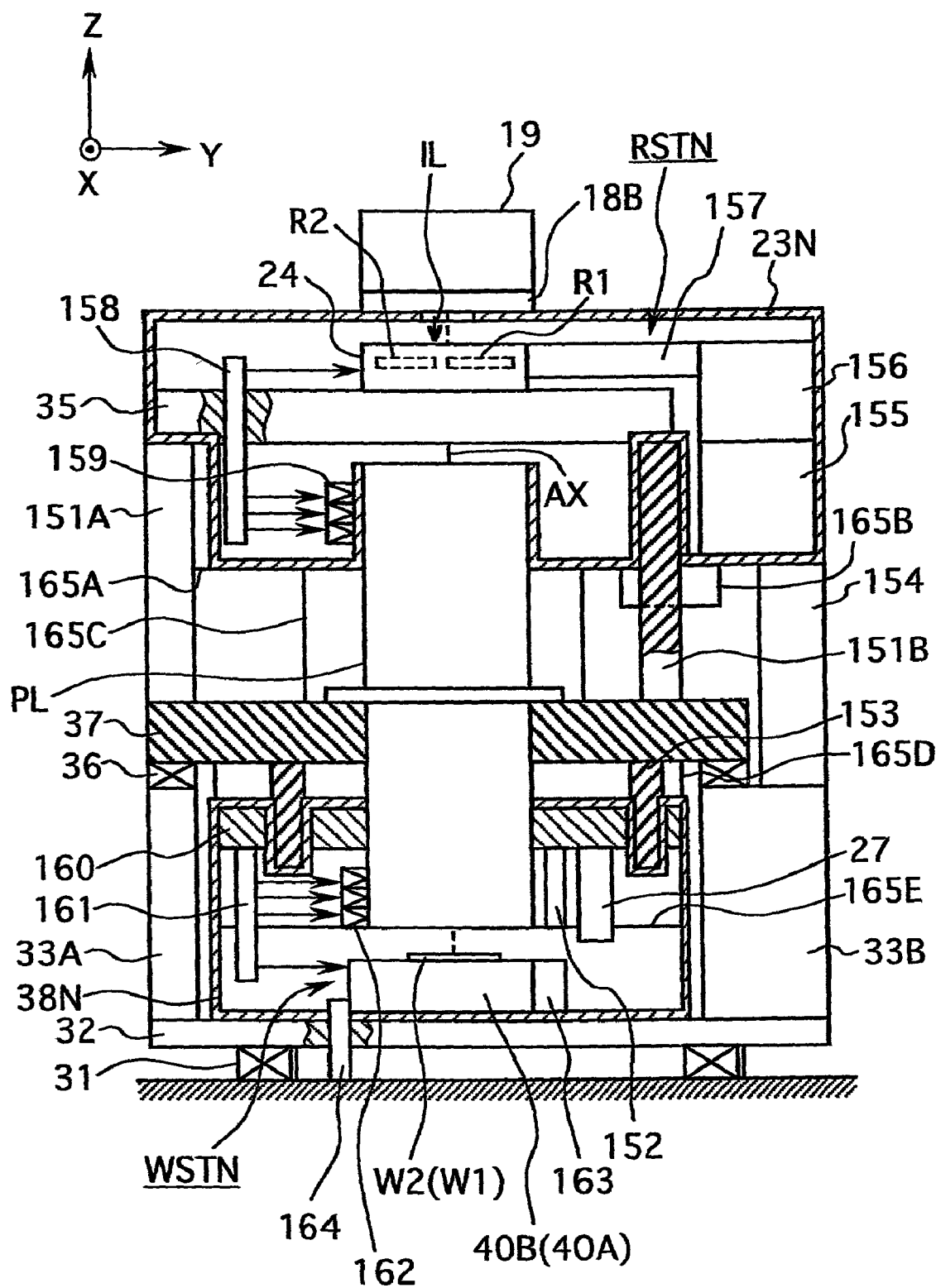
FIG. 20 shows, with partial cutout, a front view illustrating a projection exposure apparatus according to still another embodiment of the present invention.

FIG. 20 shows, with partial cutout, a front view illustrating the projection exposure apparatus of this embodiment. With reference to FIG. 20, a base plate 32, columns 33A, 33B, vibration-preventive pedestals 36, and a support plate 37 are installed on a floor by the aid of vibration-preventive pedestals 31 disposed at four places (or three places or the like). An enclosed reticle chamber 23N having a box-shaped configuration is installed by the aid of columns 151A, 151B disposed on the support plate 37 and a column 154 disposed on the column 33B. A support plate 35, which serves as a reticle base, is installed on the columns 151A, 151B so that the bottom surface portion of the reticle chamber 23N is interposed. A base member 155 is installed on the column 154 so that the bottom surface portion of the reticle chamber 23N in the +Y direction is interposed. In this embodiment, a frame mechanism is constructed by the base plate 32, the columns 33A, 33B, the vibration-preventive pedestals 36, the support plate 37, and the columns 151A, 151B, 154.

A sub-chamber 19, in which a part of an illumination optical system is accommodated, is arranged by the aid of a soft shield member 18B so that the opening at the upper surface of the reticle chamber 23N is covered therewith. An exposure light beam IL is supplied from the sub-chamber 19. A reticle stage 24, which is slidable two-dimensionally, is arranged on the upper surface (guide surface) of the support plate 35 by the aid of an air bearing. Two reticles R1, R2, which are adjacent to one another in the scanning direction (Y direction), are held at the inside of the reticle stage 24. The reticle stage 24 is driven so that the law of conservation of momentum is satisfied by the aid of a connecting member 157 by means of a driving section 156 based on the linear motor system disposed on the base member 155. A Y axis reticle interferometer 158 is installed on the −Y direction side of the support plate 35. The reticle interferometer 158 measures the position of the reticle stage 24 in the Y direction on the basis of a three-axis corner cube type reference mirror 159 disposed on the side surface of the projection optical system PL. The measured value is supplied to an unillustrated main control system.

In this arrangement, for example, when the support plate 35 is rotated by any vibration or the like, the projection optical system PL is rotated relatively with respect to the support plate 35. Therefore, the main control system calculates the angle of rotation (yawing amount) of the projection optical system PL about the Z axis and the angle of rotation (pitching amount) about the X axis from the difference in result of the measurement of the position on the basis of the three-axis reference mirror 159. The positional relationship of the reticle stage 24 with respect to the projection optical system PL is corrected on the basis of the obtained result. Similarly, an X axis reticle interferometer is also provided. The position of the reticle stage 24 in the X direction with respect to the projection optical system PL is measured highly accurately by means of the reticle interferometer. In this embodiment, a reticle stage system RSTN is constructed, for example, by the reticle stage 24, the driving section 156, the connecting member 157, and the reticle interferometer 158. The reticle stage system RSTN is tightly enclosed in the reticle chamber 23N. A purge gas (for example, helium) is supplied into the interior of the reticle chamber 23N via unillustrated piping. In this arrangement, soft shield members 165A, 165B are installed so that the gaps between the reticle chamber 23N and the columns 151A, 151B are covered therewith. A soft shield member 156C is installed so that the gap between the reticle chamber 23N and the tip of the projection optical system PL is covered therewith. The arrangement is made so that the purge gas is not contaminated with any atmospheric air. Each of the soft shield members 165A to 165C is formed of a material equivalent to that for the soft shield member 18B.

An enclosed wafer chamber 38N having a box-shaped configuration is installed on the upper surface of the base plate 32 so that the lower end portion of the projection optical system PL is surrounded thereby. Two wafer stages 40B, 40A (in FIG. 20, the wafer stage 40B appears), which are aligned in parallel and which are slidable in the X direction and in the Y direction, are placed on the bottom surface of the wafer chamber 38N by the aid of air bearings. Wafers W2, W1 are held on the wafer stages 40B, 40A respectively. The wafer stages 40A, 40B of this embodiment are driven by a driving section 163 based on the linear motor system so that the law of conservation of momentum is satisfied. However, in this arrangement, for example, a connecting member 164 may be installed from the floor surface via the base plate 32 and the bottom surface of the wafer chamber 38N so that the reaction force, which is generated when the wafer stages 40A, 40B are driven, is released to the floor surface.

A sensor attachment plate 160 is arranged on the upper surface of the wafer chamber 38N so that the lower side surface of the projection optical system PL is surrounded thereby. The sensor attachment plate 160 is supported by two columns 153 fixed to the bottom surface of the support plate 37. A Y axis wafer interferometer 161 is installed on the −Y direction side of the bottom surface of the sensor attachment plate 160. The wafer interferometer 161 measures the positions of the wafer stages 40A, 40B in the Y direction on the basis of a three-axis corner cube type reference mirror 162 disposed on the side surface of the projection optical system PL. The measured value is supplied to the unillustrated main control system.

Also in this arrangement, the main control system calculates the angle of rotation (yawing amount) of the projection optical system PL about the Z axis and the angle of rotation (pitching amount) about the X axis from the difference in result of the measurement of the position on the basis of the three-axis reference mirror 162. The positional relationship of the wafer stage 40A, 40B with respect to the projection optical system PL is corrected on the basis of the obtained result. Similarly, an X axis wafer interferometer is also provided. The position of the wafer stage 40A, 40B in the X direction with respect to the projection optical system PL is measured highly accurately by means of the wafer interferometer. In this embodiment, a wafer stage system WSTN based on the double-wafer stage system is constructed, for example, by the wafer stages 40A, 40B, the driving section 163, and the wafer interferometer 161. The wafer stage system WSTN is tightly enclosed in the wafer chamber 38N. The purge gas (for example, helium) is supplied to the surroundings of the wafer stages 40A, 40B in the wafer chamber 38N via unillustrated piping. Similarly, the purge gas is also supplied to the interior of the projection optical system PL.

In this arrangement, a soft shield member 165E is installed so that the flat surface portion including the lowermost end of the projection optical system PL is covered in the wafer chamber 38N. A soft shield member 165D is installed so that the gap between the wafer chamber 38N and the columns 33A, 33B is covered therewith. The arrangement is made so that the purge gas in the surroundings of the wafer stages 40A, 40B in the wafer chamber 38N is not contaminated with any atmospheric air. An alignment sensor 27 and a multiple-point autofocus sensor (AF sensor) 152 based on the oblique incidence system are arranged on the bottom surface of the sensor attachment plate 160. The other components of, for example, the illumination optical system and the wafer loader system are equivalent to those of the embodiment shown in FIGS. 1 and 2.

Also in this embodiment, grooves, which make it possible to allow the projection optical system PL to slide in the lateral direction, are formed at the bottom surface of the reticle chamber 23N and the upper surface of the wafer chamber 38N. The projection exposure apparatus can be efficiently assembled by assembling and adjusting the reticle chamber 23N and the wafer chamber 38N separately in accordance with the module system (box system), and then installing the reticle chamber 23N and the wafer chamber 38N to the frame mechanism. In this embodiment, the positions of the reticle stage 24 and the wafer stages 40A, 40B are directly measured on the basis of the projection optical system PL respectively. Therefore, the measurement accuracy is improved, and it is possible to obtain high exposure accuracy.

Next, explanation will be made with reference to FIG. 21 for an example of the arrangement of the wafer interferometer for the projection exposure apparatus shown in FIG. 20.

Figure 21A:
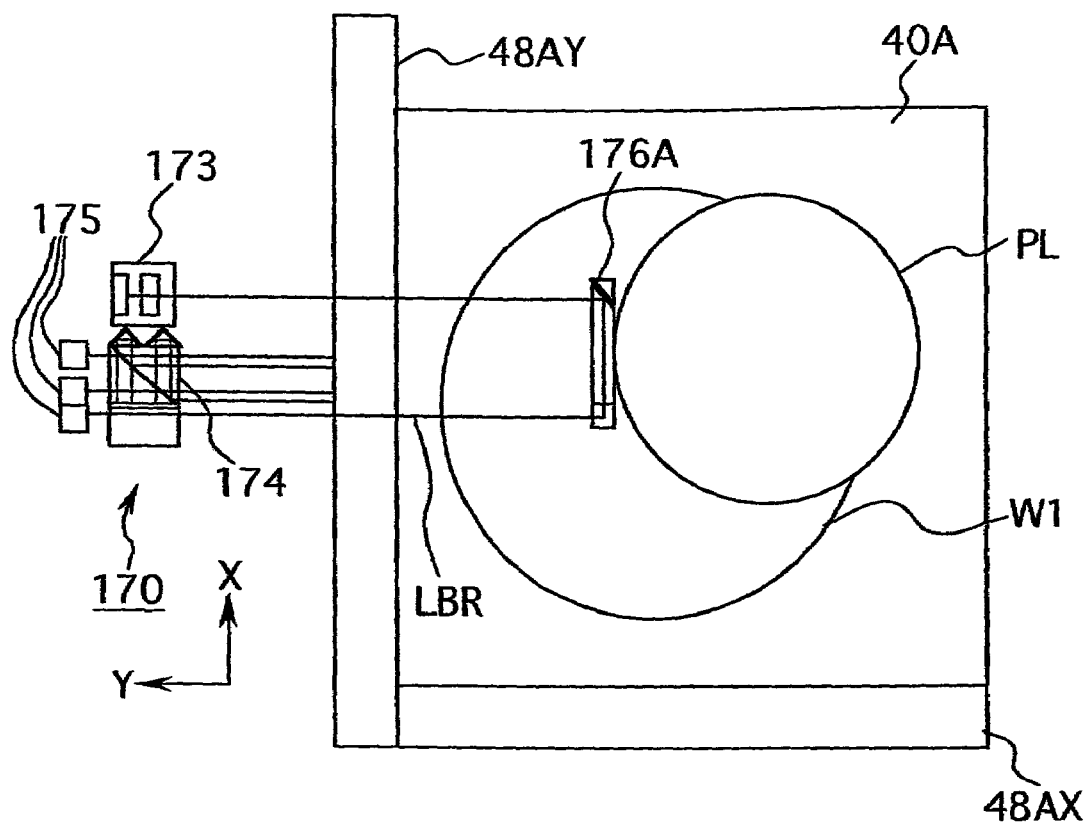
FIG. 21A shows a plan view illustrating an exemplary wafer interferometer capable of being used for the projection exposure apparatus shown in FIG. 20.
Figure 21B:
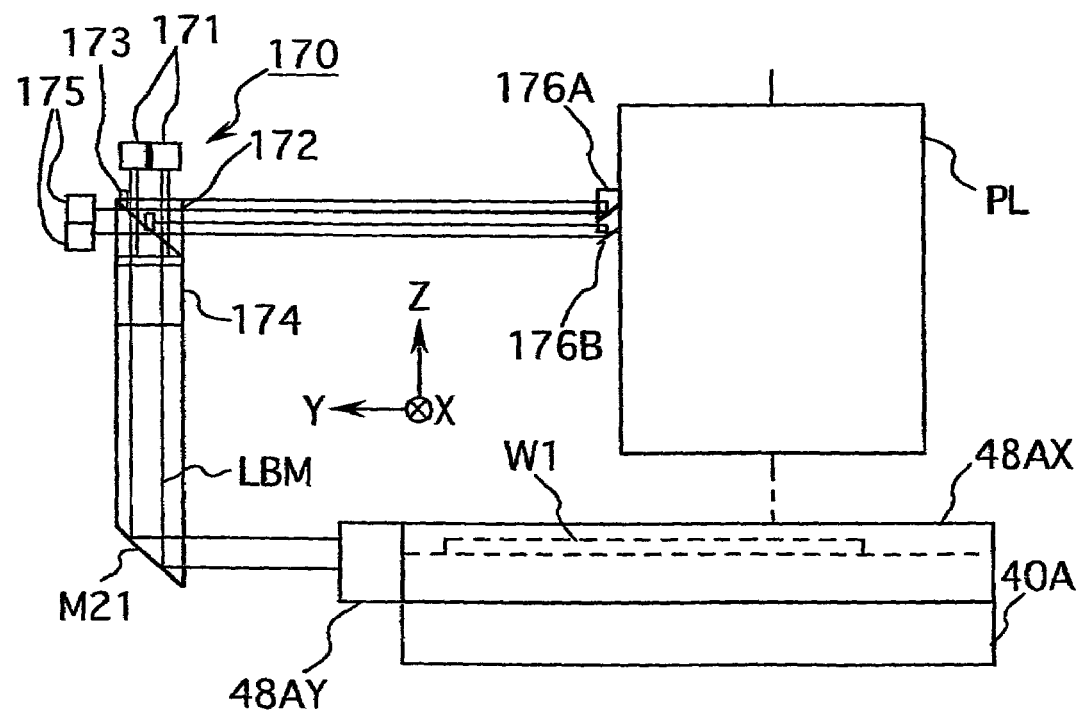
FIG. 21B shows a front view of those shown in FIG. 21A.

FIG. 21A shows a plan view illustrating the projection optical system PL and the wafer stage 40A, and FIG. 21B shows a front view thereof. In FIGS. 21A and 21B, a Y axis wafer interferometer 170 is arranged in order to measure the position of the wafer stage 40A in the Y direction. The wafer interferometer 170 comprises a laser beam-radiating section 171 for radiating a plurality of axes of laser beams, a beam splitter section 172 for separating the laser beams of the plurality of axes from the radiating section 171 into reference beams and measuring beams respectively and combining them again, a reflecting section 173 for reflecting the reference beam, an optical unit 174 for making round trip of the measuring beam to cause interference in accordance with the double-pass system, and a plurality of receivers 175 composed of photoelectric conversion elements for receiving interference light beams of a plurality of axes of the returned reference beam and the measuring beam. In this arrangement, for example, the measurement is performed in accordance with the heterodyne interference system in which the reference beam and the measuring beam are allowed to be in different polarization states, and the frequency is allowed to slightly differ.

The two-axis reference beam LBR, which is radiated from the wafer interferometer 170, is reflected by two-axis reflection units 176A, 176B as reference mirrors of the projection optical system PL, and it is reflected by the reflecting section 173. After that, the reference beam LBR is reflected by the reflection units 176A, 176B again, and it is returned to the beam splitter section 172. on the other hand, the multiple-axis measuring beam LBM, which is radiated from the beam splitter section 172, makes two round trips between the optical unit 174 and the Y axis movement mirror 48AY of the wafer stage 40A by the aid of a mirror M21, and then it is returned to the beam splitter section 172. An interference light beam of the returned reference beam LBR and the measuring beam LBM is received by the receiver 175. When the output signal of the receiver 175 is processed, the position of the wafer stage 40A in the Y direction, the angle of rotation about the Z axis, and the angle of rotation about the X axis are measured highly accurately on the basis of the projection optical system PL.

The wafer interferometer 170 may be provided independently as described above. However, in order to decrease the installation area of the sensor system including the wafer interferometer, the wafer interferometer may be provided integrally with the alignment sensor as shown in FIG. 22. In FIG. 22, components or parts corresponding to those shown in FIG. 20 are designated by the same reference numerals, detailed explanation of which will be omitted.

Figure 22A:
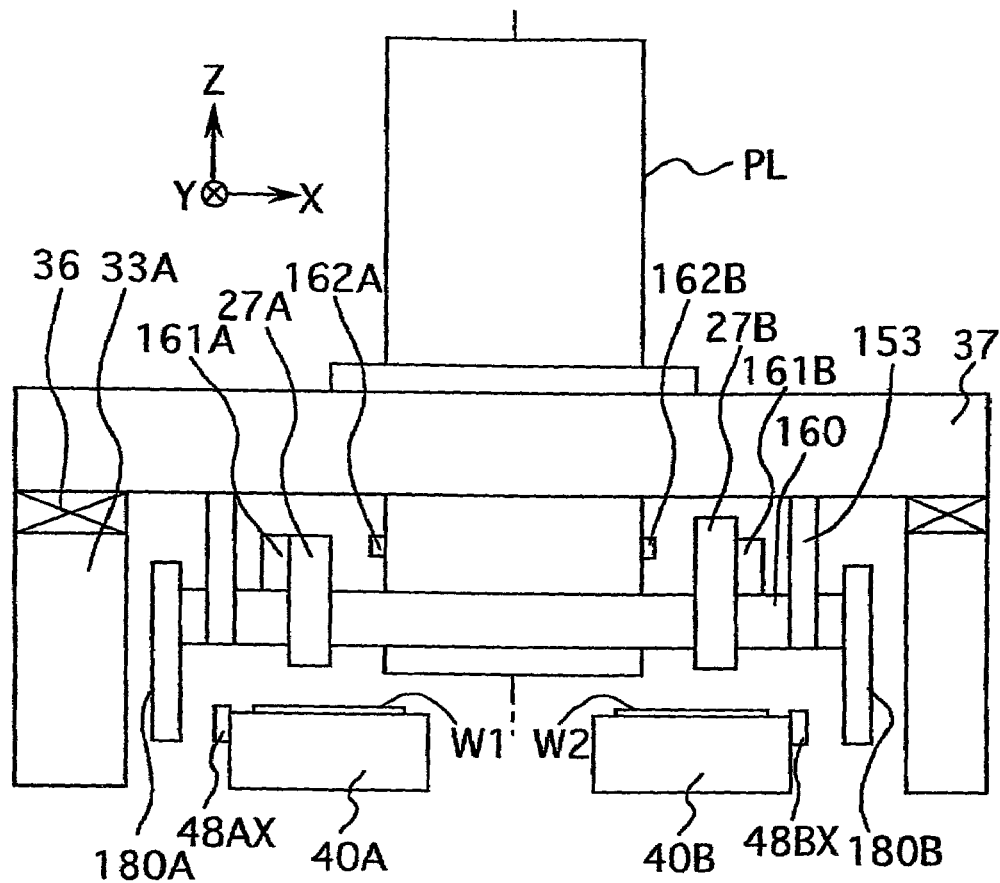
FIG. 22A shows a front view illustrating major parts of a modified embodiment of the projection exposure apparatus shown in FIG. 20.

FIG. 22A shows main components of a modified embodiment of the embodiment shown in FIG. 20. With reference to FIG. 22A, two alignment sensors 27A, 27B are installed to the sensor attachment plate 160 so that the projection optical system PL is interposed in the X direction. X axis wafer interferometers 161A, 161B are integrally installed to the alignment sensors 27A, 27B respectively. Two X axis reference mirrors 162A, 162B are installed to the side surface of the projection optical system PL. Interference units 180A, 180B are installed to the both ends of the sensor attachment plate 160. X axis movement mirrors 48AX, 48BX are fixed to the end in the −X direction and the end in the +X direction of the two wafer stages 40A, 40B arranged between the interference units 180A, 180B respectively. The wafers W1, W2 are held on the wafer stages 40A, 40B.

Figure 22B:
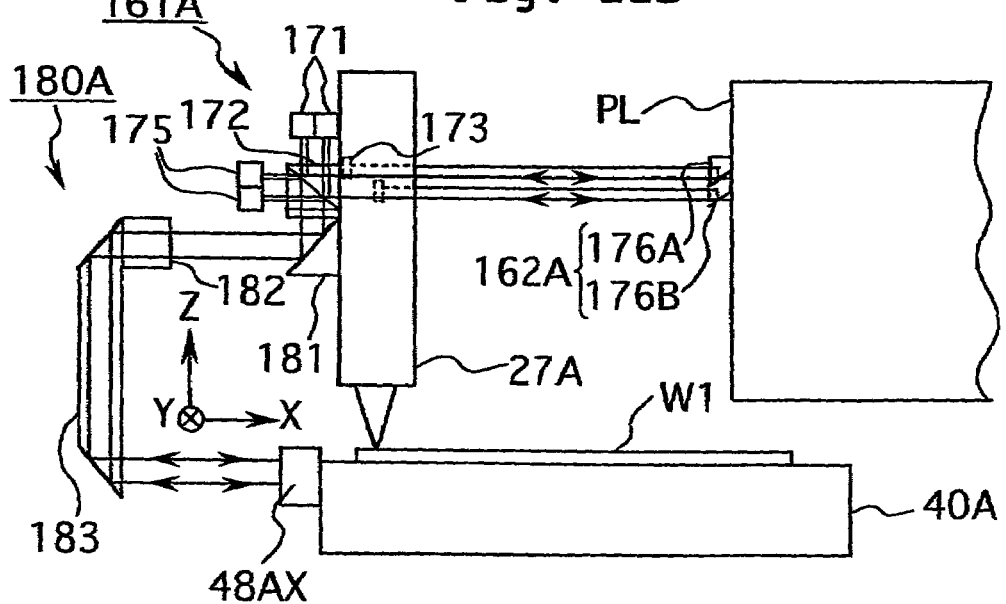
FIG. 22B shows a magnified front view illustrating an arrangement of an alignment sensor 27A and members disposed therearound shown in FIG. 22A.

FIG. 22B shows a magnified view illustrating circumferential portions of the alignment sensor 27A shown in FIG. 22A. As shown in FIG. 22B, the wafer interferometer 161A comprises a radiating section 171, a beam splitter section 172, a reflecting section 173, a receiver 175, and a mirror section 181 for reflecting the measuring beam in the −X direction, in the same manner as in the exemplary arrangement shown in FIG. 21. The reference mirror 162A of the projection optical system PL is constructed by reflection units 176A, 176B in the same manner as in the exemplary arrangement shown in FIG. 21. The interference unit 180A comprises the same optical unit 182 as the optical unit 174 for the double-pass shown in FIG. 21, and a reflecting system 183 for bending the optical path of the measuring beam into the +X direction. The measuring beam from the wafer interferometer 161A makes two round trips between the interference unit 180A and the movement mirror 48AX of the wafer stage 40A, and it is returned to the wafer interferometer 161A to cause interference with the reference beam therein. When the detection signal of the receiver 175 is processed, the position of the wafer stage 40A in the X direction, the angle of rotation about the Z axis, and the angle of rotation about the Y axis are measured on the basis of the projection optical system PL. In this arrangement, the wafer interferometer 161A is integrated into one unit together with the alignment sensor 27A. Therefore, this arrangement is advantageous in that the installation area of the sensor system is decreased, and the sensor system can be installed with ease.

In relation to the arrangement shown in FIG. 22, it is not necessarily indispensable that all parts of the wafer interferometer 161A are provided in the alignment sensor 27A. That is, for example, the radiating section 171 (measuring light source) and the receiver 175 (light-receiving section), which are parts of the wafer interferometer 161A, may be provided integrally with another member, for example, the sensor attachment plate 160 or the support plate 37. In this arrangement, it is possible to reduce the harmful influence on the alignment sensor 27A due to the heat generation therefrom.

Figure 23A:
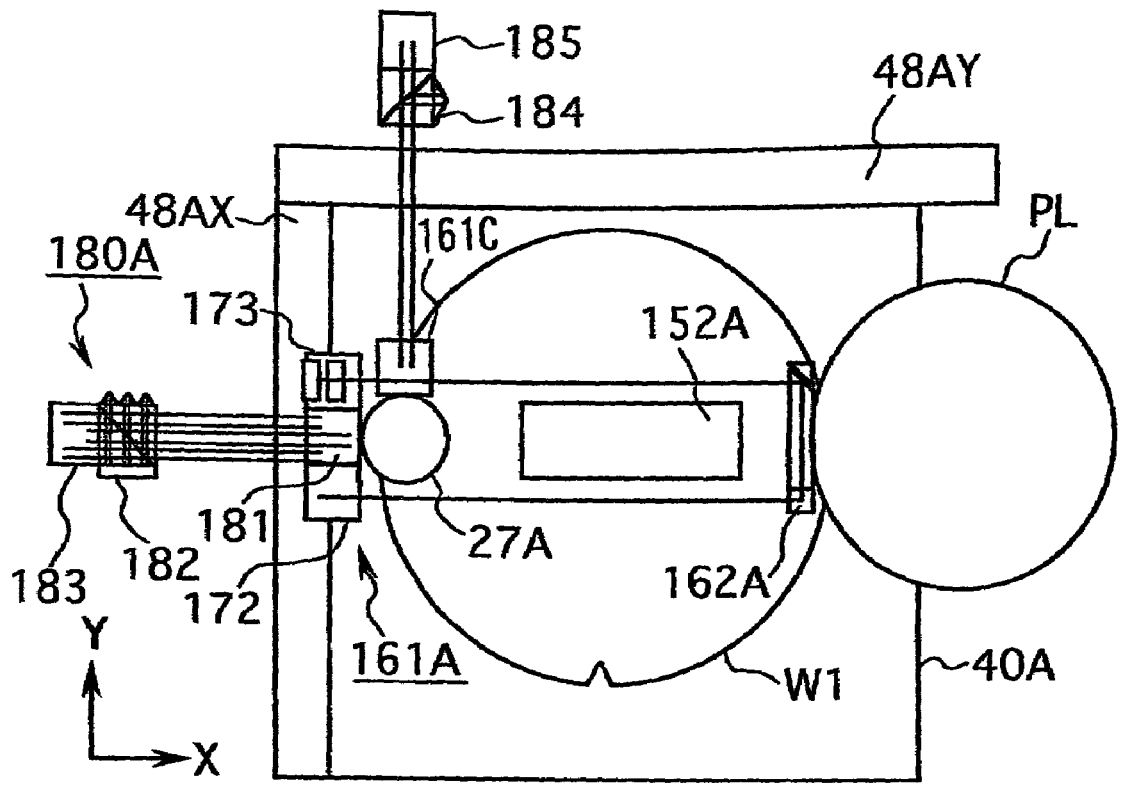
FIG. 23A shows a plan view illustrating a modified embodiment concerning wafer interferometers shown in FIG. 22.
Figure 23B:
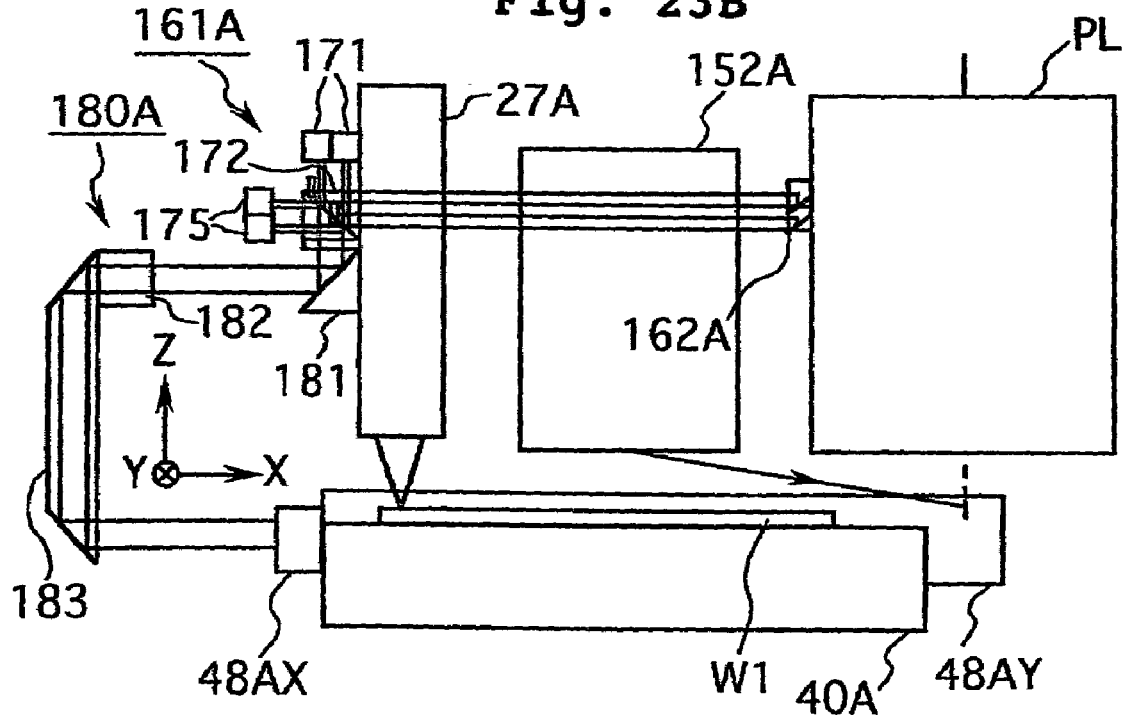
FIG. 23B shows a front view of those shown in FIG. 23A.

FIG. 23A shows a plan view illustrating an arrangement adopted when a radiating section (or light-receiving section) of the AF sensor is arranged between the projection optical system PL and the alignment sensor 27A shown in FIG. 22B. FIG. 23B shows a front view of FIG. 23A. With reference to FIG. 23A, the alignment sensor 27A is integrally installed with a Y axis wafer interferometer 161C for measuring the position of the Y axis movement mirror 48AY of the wafer stage 40A during the alignment. A measuring beam, which is radiated from the wafer interferometer 161C in the +Y direction, makes two round trips between an optical unit 184 for the double-pass and the Y axis movement mirror 48Y via a reflecting system 185 for returning the measuring beam in the Y direction, and it is returned to the wafer interferometer 161C. The measuring beam is combined with a reference beam which is generated at the inside, and it is photoelectrically converted. The position of the wafer stage 40A in the Y direction and the angle of rotation (yawing amount) about the Z axis are measured based on the detection signal on the basis of the alignment sensor 27A.

In this arrangement, the measuring beam, which is radiated from the wafer interferometer 161C, comes into the movement mirror 48AY at the same height as that of the surface of the wafer W1 (wafer surface) in the Z direction.

The arrangement is made so that no Abbe error is generated in the pitching direction about the X axis. Accordingly, when the position is measured in the Y direction on the basis of the alignment sensor 27A (27B as well), it is unnecessary to measure the pitching amount. The arrangement of the Y axis wafer interferometer 161C is simplified.

On the other hand, as shown in FIG. 23A, the upper surface of the X axis movement mirror 48AX is at approximately the same height as that of the wafer surface. It is difficult to radiate the X axis measuring beam onto the movement mirror 48AX at the same height as that of the wafer surface. Accordingly, as for the position measurement in the X direction, a measuring beam of two axes separated in the Z direction is supplied to measure the angle of rotation (rolling amount) about the Y axis. The Abbe error, which is caused by the rolling amount, is corrected on the basis of the obtained measured value.

In the exemplary arrangement shown in FIG. 23, the reference beam, which is supplied from the wafer interferometer 161A to the reference mirror 162A of the projection optical system PL, passes through the surrounding of the radiating section 152A of the AF sensor. Therefore, this arrangement is advantageous in that the alignment sensor 27A, the wafer interferometer 161A, and the AF sensor can be installed with an extremely small installation area.

Figure 24A:
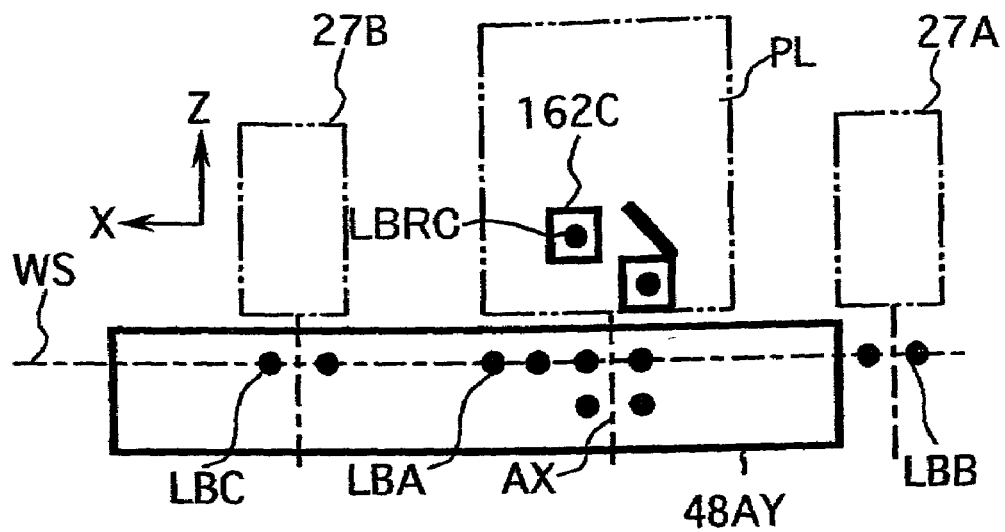
FIGS. 24A and 24B illustrate measuring axes of the wafer interferometers shown in FIG. 23.
Figure 24B:
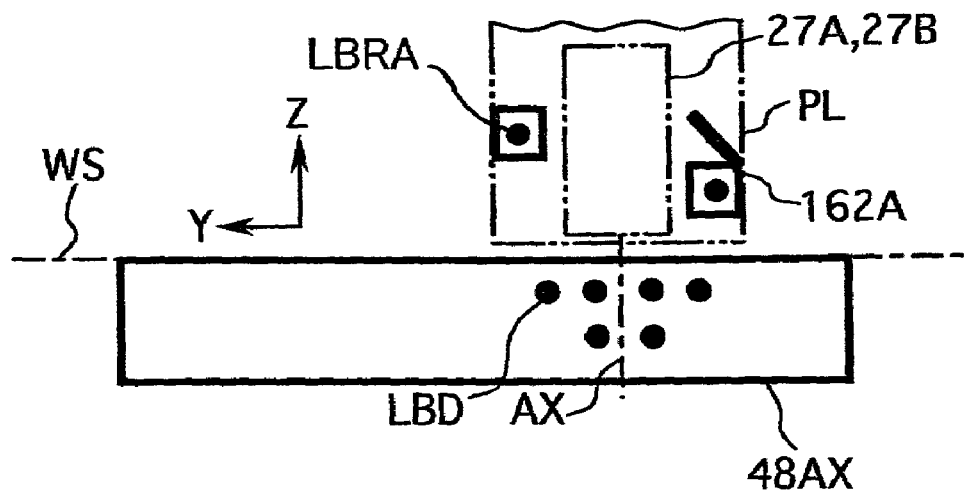

FIG. 24A shows the Y axis movement mirror 48AY shown in FIG. 23, and FIG. 24B shows the X axis movement mirror 48AX shown in FIG. 23. In the exemplary arrangement shown in FIG. 23, as shown in FIG. 24A, the measuring beams LBB, LBC, each of which has one axis, are supplied to the movement mirror 48AY at the same height as that of the wafer surface WS in order to measure the position in the Y direction on the basis of the alignment sensors 27A, 27B. In this arrangement, this embodiment resides in the double-pass system. Therefore, each of the measuring beams LBB, LBC is composed of two beams. This arrangement is equivalently adopted for the measuring beams described below. A three-axis (six individuals based on the double-pass system) measuring beam LBA is supplied to the movement mirror 48AY in order to measure the position in the Y direction on the basis of the projection optical system PL. A reference beam LBRC having one axis at the minimum is supplied to a reference mirror 162C of the projection optical system PL. The reference mirror 162C resides in the same optical system as the reflection unit 176A shown in FIG. 21. Tow axes of the measuring beam LBA are at the same height as that of the wafer surface WS.

As shown in FIG. 24B, a three-axis (six individuals based on the double-pass system) measuring beam LBD is supplied to the movement mirror 48AX in order to measure the position in the X direction on the basis of the projection optical system PL. A reference beam LBRA having one axis at the minimum is supplied to a reference mirror 162A of the projection optical system PL. The reference mirror 162A shown in FIG. 23 corresponds to the two axis. However, the reference mirror 162A shown in FIG. 24 is depicted as corresponding to one axis which is necessary to the minimum. Any of the X axis measuring beam LBD is radiated at a height lower than that of the wafer surface WS. Further, in this embodiment, a three-axis measuring beam is also radiated onto the X axis movement mirror 48BX of the second wafer stage 40B shown in FIG. 22. It is assumed that a measuring beam corresponding to one axis is used to measure the refractive index of the purge gas on the optical path of the laser interferometer. It is necessary for the entire wafer interferometer to use the measuring beams corresponding to twelve axes as follows, except for the reference beam.

(two axes for alignment sensor)+(three axes for projection optical system×3)+(one axis for refractive index measurement)=12 axes Next, a modified embodiment of the embodiment shown in FIG. 22 will be explained with reference to FIGS. 25 to 29. In FIGS. 25 to 29, components or parts corresponding to those shown in FIG. 22 are designated by the same reference numerals, detailed explanation of which will be omitted.

Figure 25:
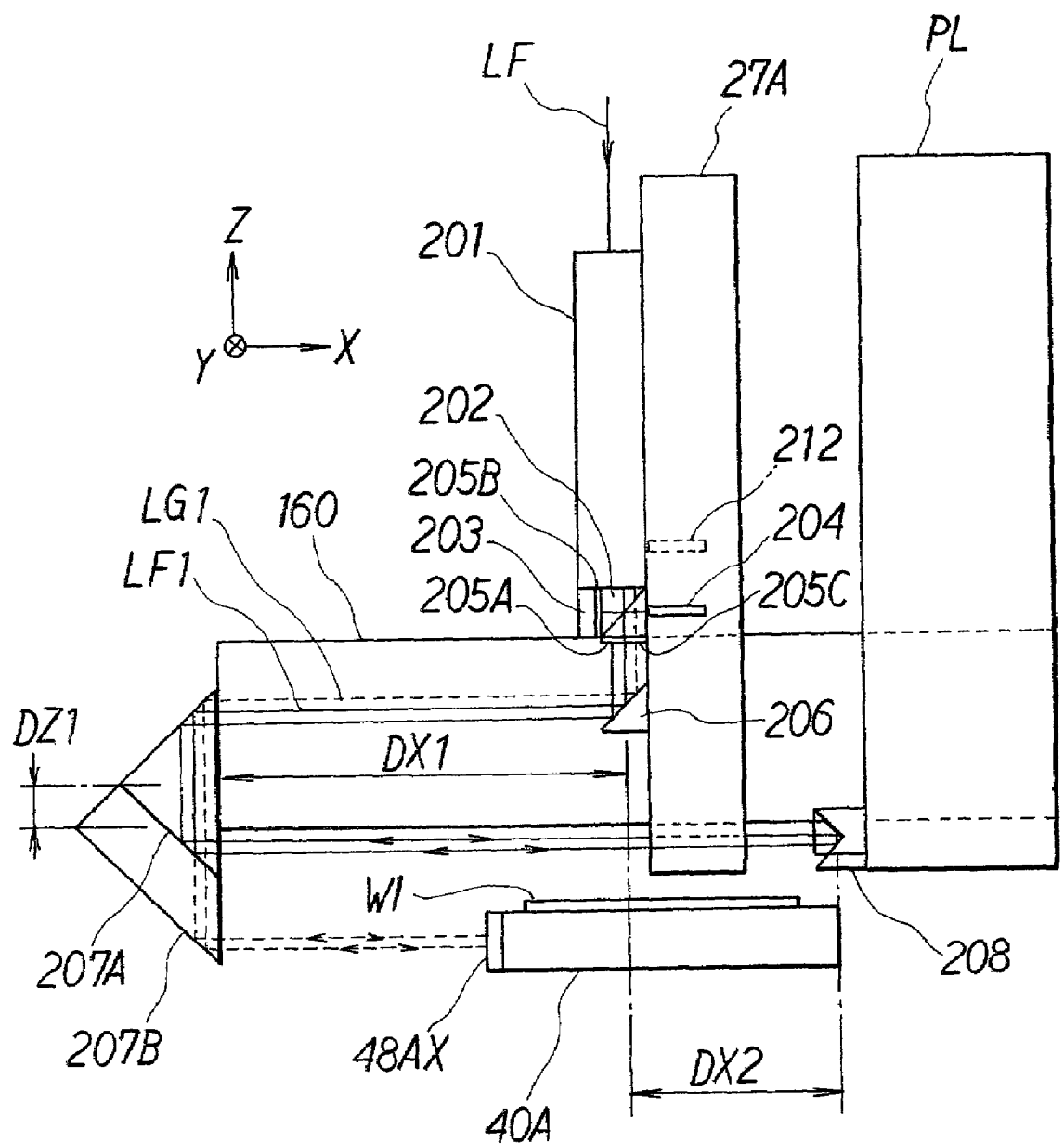
FIG. 25 shows an arrangement illustrating major parts of a modified embodiment of the embodiment shown in FIG. 22.

FIG. 25 shows main components of the modified embodiment. With reference to FIG. 25, an alignment sensor 27A is installed to a sensor attachment plate 160 attached to the lower end of the projection optical system PL. An X axis wafer interferometer 201 is integrally installed to the alignment sensor 27A. An X axis fixed mirror 208 (see FIG. 29A), which is the same as the reflection unit 176A shown in FIG. 22, is installed to the side surface of the projection optical system PL. A polarizing beam splitter 202, reference mirrors 203, 205A composed of plane mirrors, receivers 204, 212 composed of photoelectric detectors, ¼ wavelength plates 205B, 205C, and a mirror member 206 for bending the optical path of the laser beam by 90° are installed to the alignment sensor 27A. Two two-surface reflecting mirrors 207A, 207B for inverting the optical path of the laser beam in the X direction are installed at the end of the sensor attachment plate 160 in the −X direction. An X axis movement mirror 48AX is fixed to the end of the wafer stage 40A in the −X direction. Apexes of the two-surface reflecting mirrors 207A, 207B of this embodiment are deviated by DZ1 in the Z direction.

In this embodiment, the laser beam LF, which includes two polarized light components (orthogonal linearly polarized light beams) coming from an unillustrated laser light source, is divided in the wafer interferometer 201 into a first beam LF1 indicated by solid lines and a second beam LG1 indicated by dotted lines. A first polarized light component (reference beam) of the first beam LF1 is reflected by the polarizing beam splitter 202, it passes through the ¼ wavelength plate 205B, and it is reflected by the reference mirror 203. After that, the first polarized light component of the first beam LF1 passes through the polarizing beam splitter 202, and it comes into the receiver 204. Further, a second polarized light component (measuring beam) of the first beam LF1 passes along the polarizing beam splitter 202, the ¼ wavelength plate 205C, the mirror member 206, and the two-surface reflecting mirror 207A, and it comes into the fixed mirror 208 of the projection optical system PL. The second polarized light component, which is reflected by the fixed mirror 208, is reflected by the reference mirror 205A via the two-surface reflecting mirror 207A and the mirror member 206, and it is returned to the fixed mirror 208 again. The second polarized light component of the first beam LF1, which has been returned to the fixed mirror 208, passes along the two-surface reflecting mirror 207A, the mirror member 206, the ¼ wavelength plate 205C, and the polarizing beam splitter 202, and it is combined with the first polarized light component to come into the receiver 204. The detection signal of the receiver 204 can be used to measure the X coordinate of the fixed mirror 208 of the projection optical system PL on the basis of the double-pass system.

On the other hand, as for the second beam LG1, an optical unit (see FIG. 28) for making detection based on the double-pass system is incorporated in the wafer interferometer 201. A first polarized light component (reference beam)

of the second beam LG1 is reflected by an unillustrated reference mirror, and it comes into the receiver 212. A second polarized light component (measuring beam) of the second beam LG1 passes along the polarizing beam splitter 202, the ¼ wavelength plate 205C, the mirror member 206, and the two-surface reflecting mirror 207B, and it comes into the movement mirror 48AX of the wafer stage 40A. The second polarized light component, which is reflected by the movement mirror 48AX, passes along the two-surface reflecting mirror 207B, the mirror section 206, the ¼ wavelength plate 205C, and the polarizing beam splitter 202, and it is reflected by the unillustrated optical unit in the wafer interferometer 201 so that the optical path is shifted. After that, the second polarized light component makes round trip again among the polarizing beam splitter 202, the ¼ wavelength plate 205C, the mirror member 206, the two-surface reflecting mirror 207B, and the movement mirror 48AX, and it is returned into the wafer interferometer 201. The returned second polarized light component is combined with the first polarized light component to come into the receiver 212. The detection signal thereof can be used to measure the X coordinate of the movement mirror 48AX of the wafer stage 40A on the basis of the double-pass system. The X coordinate (relative coordinate) of the wafer stage 40A based on the projection optical system PL can be determined by subtracting the X coordinate of the fixed mirror 208 of the projection optical system PL from the X coordinate of the movement mirror 48AX of the wafer stage 40A.

In the exemplary arrangement shown in FIG. 25, even when the spacing distance DX1 in the X direction between the reflecting surface of the mirror member 206 fixed to the alignment sensor 27A and the reflecting surface of the two-surface reflecting mirror 270A, 270B is varied, the relative coordinate of the wafer stage 40A is not changed. On the contrary, when the spacing distance DX2 in the X direction between the reflecting surface of the mirror member 206 and the reflecting surface of the fixed mirror 208 of the projection optical system PL is varied due to any vibration or the like, the amount of vibration exactly causes the variation of the relative coordinate of the wafer stage 40A, and consequently the alignment error. Therefore, it is desirable that the spacing distance DX2 is set to be as short as possible.

If the spacing distance DZ1 in the Z direction between the apexes of the two two-surface reflecting mirrors 207A, 207B is not zero, when the sensor attachment plate 160 is slightly inclined due to any vibration or the like to tilt the two-surface reflecting mirrors 207A, 207B, then an error (so-called sine error) of approximately θ·DZL is generated in the relative coordinate of the wafer stage 40A assuming that the angle of inclination is θ (rad). Therefore, in order to avoid the generation of the sine error, it is desirable that the apexes of the two-surface reflecting mirrors 207A, 207B are allowed to coincide with each other, or the apexes of the two-surface reflecting mirrors 207 are arranged on the axis parallel to the X axis so that the spacing distance DZ1 is zero.

Explanation will now be made with reference to FIGS. 26 and 27 for the measurement error caused when the apexes of the two two-surface reflecting mirrors 207A, 207B are deviated from each other.

Figure 26A:
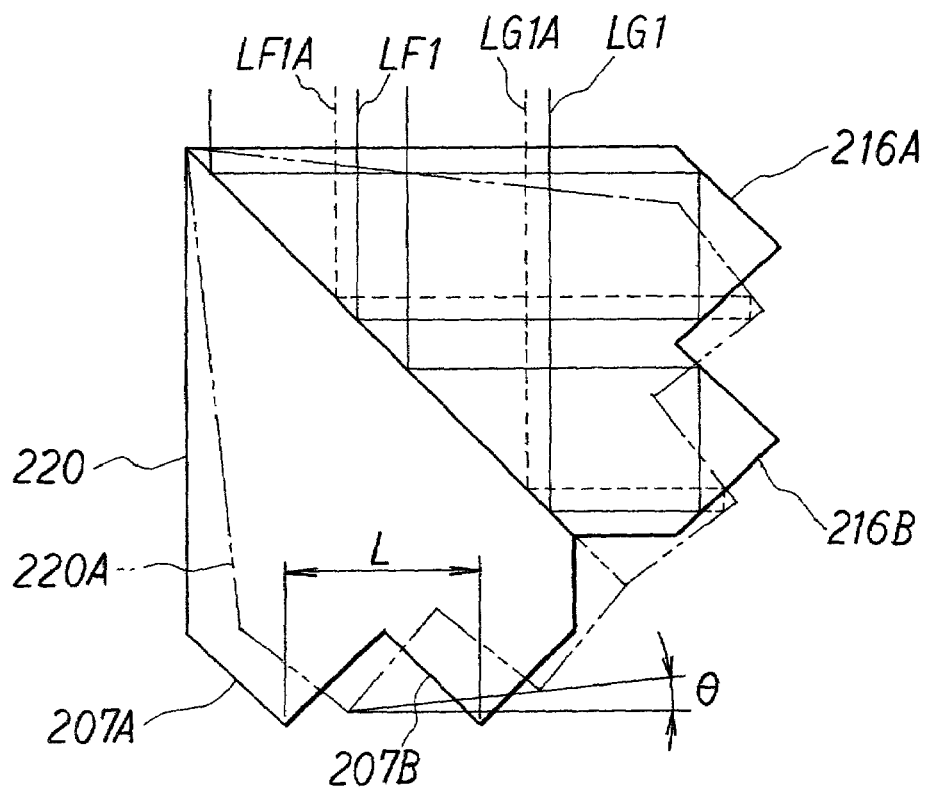
FIGS. 26A and 26B illustrate the measurement error concerning the embodiment shown in FIG. 25.

FIG. 26A virtually shows, with an integrated optical block 220, the two-surface reflecting mirrors 207A, 207B shown in FIG. 25 and the reference mirrors 216A, 216B composed of two-surface reflecting mirrors corresponding thereto. In FIG. 26A, it is assumed that L represents the spacing distance between the apexes of the two-surface reflecting mirrors 207A, 207B. In this arrangement, the variation amount of the spacing distance between the two-surface reflecting mirror 207A and the reference mirror 216A is measured by using the first beam LF1, and the variation amount of the spacing distance between the two-surface reflecting mirror 207B and the reference mirror 216B is measured by using the second beam LG1. Accordingly, as shown with a block 220A depicted by two-dot chain lines, if the spacing distance between the two-surface reflecting mirror 207B and the reference mirror 216B is contracted due to any vibration or the like to give a state in which the straight line for connecting the apexes of the two-surface reflecting mirrors 207A, 207B is inclined by an angle θ (rad), the optical paths of the first beam LF1 and the second beam LG1 are sifted to optical paths LF1A and LG1A depicted by dotted lines respectively. As a result, a measurement error of approximately L·θ is generated.

Figure 26B:
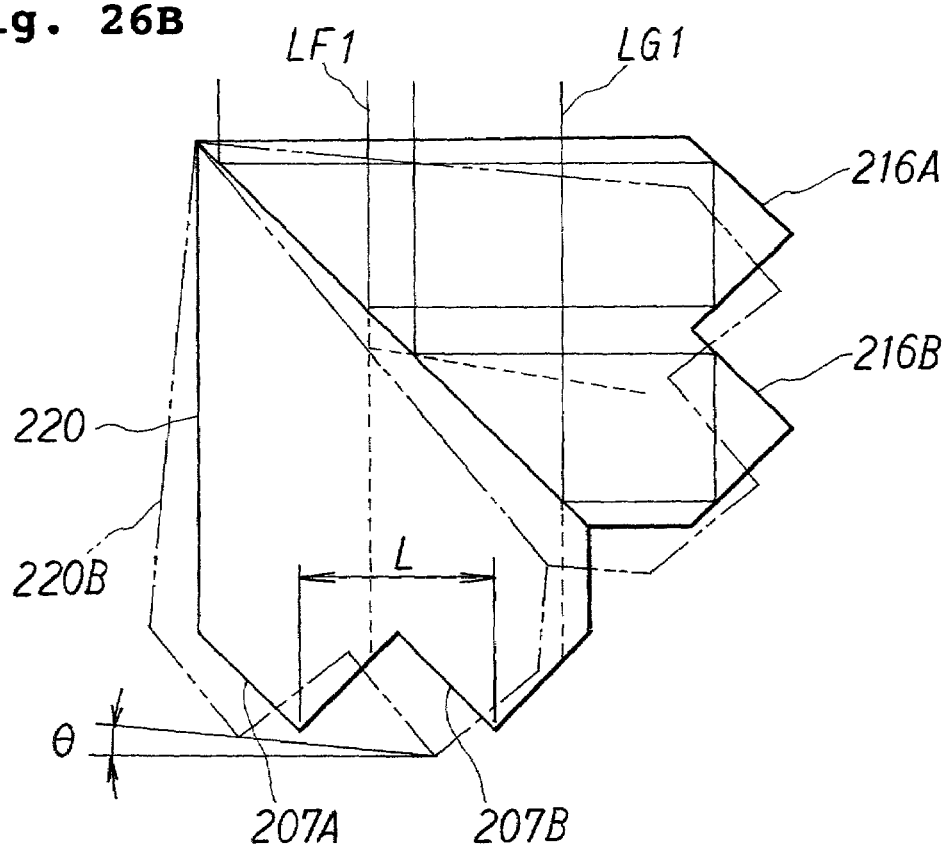

As shown with a block 220B depicted by two-dot chain lines in FIG. 26B, also when the optical block 220 is integrally inclined by an angle θ, a measurement error of approximately L·θ is generated in the same manner as described above.

Figure 27:
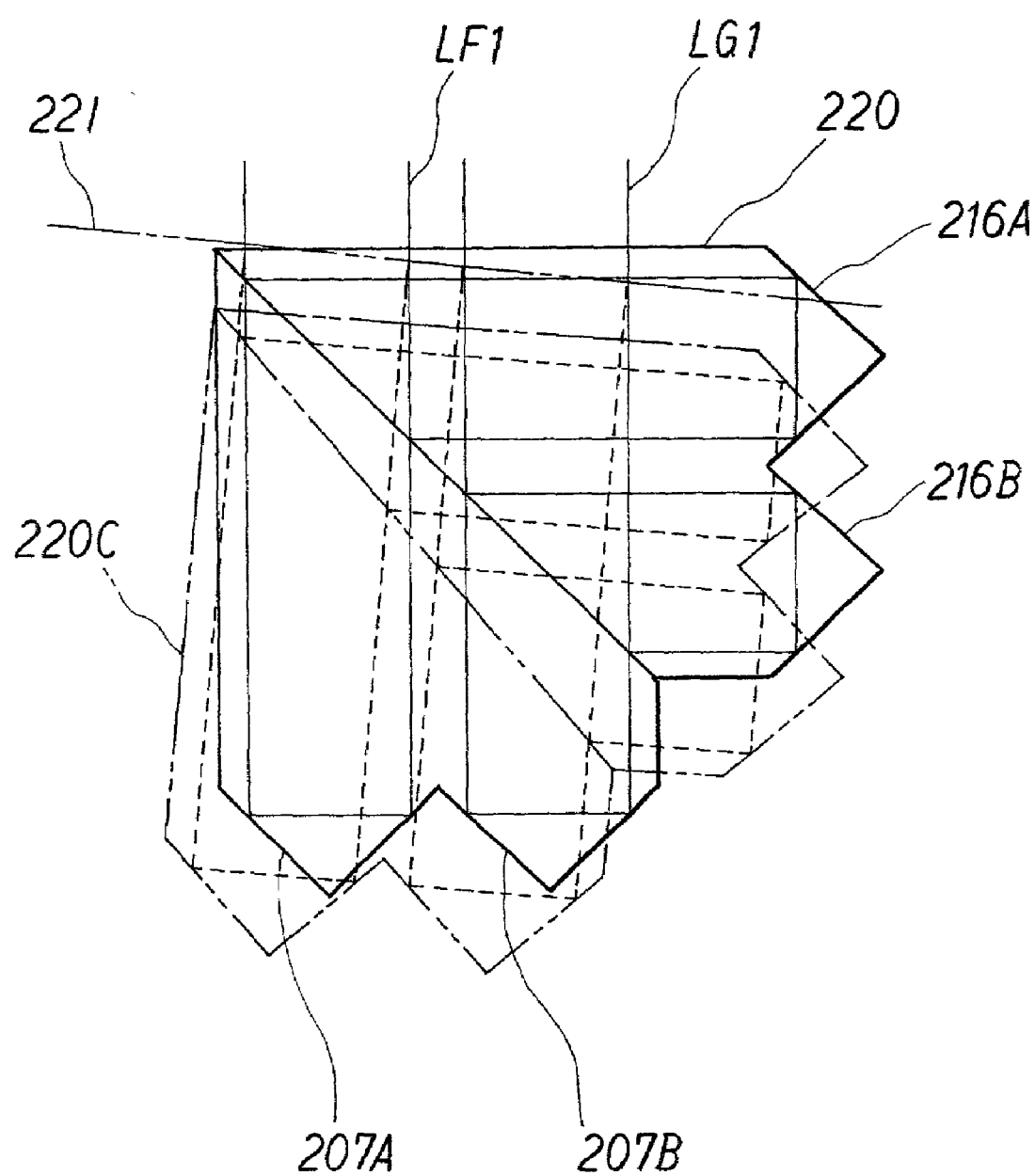
FIG. 27 shows an exemplary arrangement for dissolving the measurement error caused in the arrangement shown in FIG. 26.

In contrast to the above, FIG. 27 shows the following example. FIG. 27 is equivalent to FIG. 26A in that the two-surface reflecting mirrors 207A, 207B shown in FIG. 25 and the reference mirrors 216A, 216B are virtually depicted with an integrated optical block 220. However, the example shown in FIG. 27 differs from FIG. 26A in that each of the first beam LF1 and the second beam LG1 is branched into two beams on the plane 221 in the optical block 220. In this case, as shown with a block 220C depicted by two-dot chain lines, even when the optical block 220 is rotated in an integrated manner, no measurement error appears.

Figure 28:
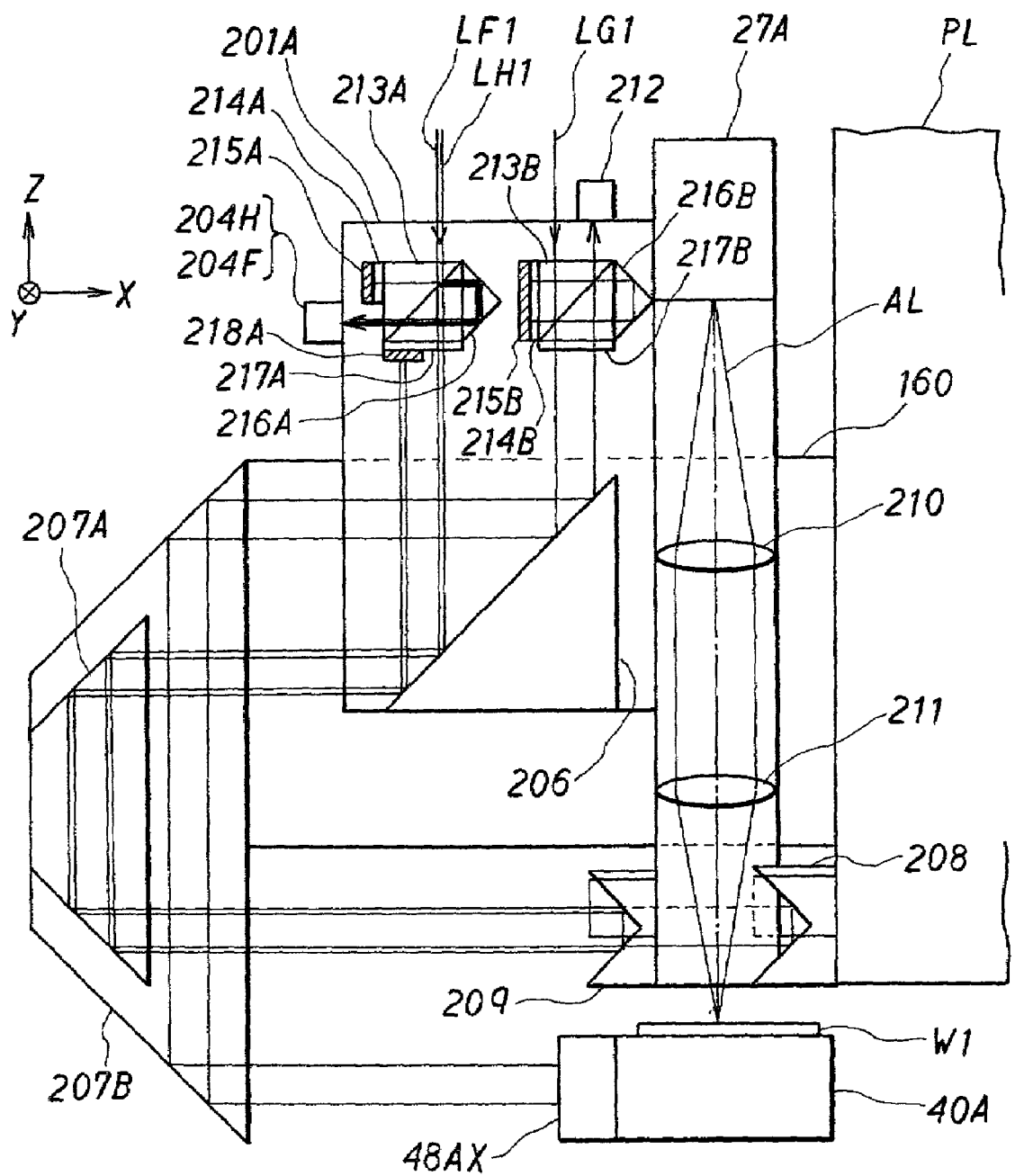
FIG. 28 shows an arrangement illustrating major parts of a modified embodiment of the embodiment shown in FIG. 25.

Next, a modified embodiment of the embodiment shown in FIG. 25 will be explained with reference to FIGS. 28 and 29. In FIGS. 28 and 29, components or parts corresponding to those shown in FIG. 25 are designated by the same reference numerals, detailed explanation of which will be omitted.

FIG. 28 shows major components of this modified embodiment. With reference to FIG. 28, an alignment sensor 27A is installed to the sensor attachment plate 160 which is attached to the lower end of the projection optical system PL. An X axis wafer interferometer 201A is integrally installed to the alignment sensor 27A. An X axis fixed mirror 208 (see FIG. 29A) is installed to the side surface of the projection optical system PL in the −X direction. An X axis fixed mirror 209 is also installed to the side surface of the alignment sensor 27A in the −X direction. A movement mirror 48AX is installed to the side surface of the wafer stage 40A. The alignment sensor 27A includes, for example, lens systems 210, 211 for forming an image of a detection objective mark under the illumination light beam AL having a wide band.

Figure 29A:
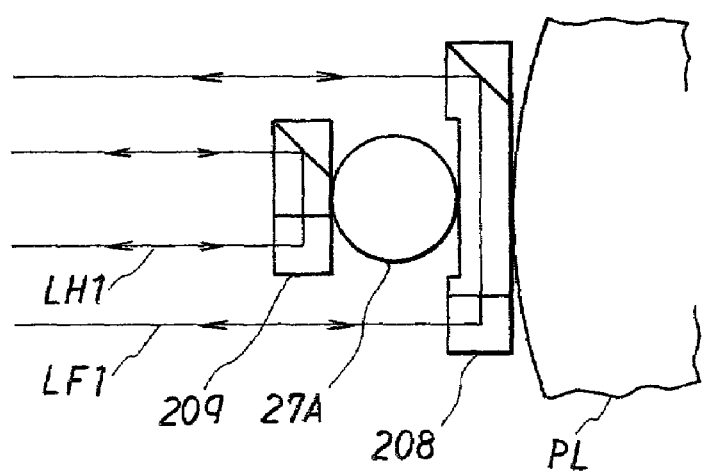
FIG. 29A shows a plan view illustrating fixed mirrors 208, 209 shown in FIG. 28.
Figure 29B:
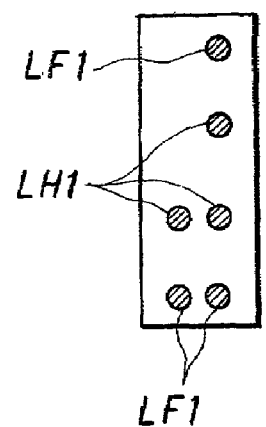
FIG. 29B shows a view in which beams LF1, LH1 shown in FIG. 29A are viewed from the side plane.

FIG. 29A shows a plan view illustrating an area in the vicinity of the alignment sensor 27A. As shown in FIG. 29A, the fixed mirror 209 has the function to allow the incoming laser beam to make round trip while giving a predetermined spacing distance, in the same manner as the fixed mirror 208. The width of the fixed mirror 209 is set to be narrower than the width of the fixed mirror 208. FIG. 29B shows a side view of FIG. 29A. As shown in FIG. 29B, the third beam LH1 is reflected by the fixed mirror 209, and the first beam LF1 is reflected by the fixed mirror 208 (details will be described later on).

With reference to FIG. 28 again, those arranged in the wafer interferometer 201A include a polarizing beam splitter 213A for the fixed mirrors 208, 209, and a polarizing beam splitter 213B for the movement mirror 48AX. The former polarizing beam splitter 213A is installed with ¼ wavelength plates 214A, 217A, reference mirrors 215A, 217A, and a two-surface reflecting mirror 216A. The latter polarizing beam splitter 213B is installed with ¼ wavelength plates 214B, 217B, a reference mirror 215B, and a two-surface reflecting mirror 216B. Those arranged in the wafer interferometer 201A also include three receivers 212, 204F, 204H, and a common mirror member 206 for bending, by 90°, laser beams from the two polarizing beam splitters 213A, 213B. Two two-surface reflecting mirrors 207A, 207B are arranged at the end of the sensor attachment plate 160 in the −X direction so that the height of the apex is an identical height in the Z direction.

In the exemplary arrangement shown in FIG. 28, the first beam LF1, the second beam LG1, and the third beam LH1, each of which contains two polarized light components (orthogonal linearly polarized light beams), are supplied from an unillustrated laser beam source to the wafer interferometer 201A. The first polarized light component (reference beam) of the first beam LF1 is reflected by the polarizing beam splitter 213A to make round trip via the ¼ wavelength plate 214A and the reference mirror 215A, and then it passes along the two-surface reflecting mirror 216A and the polarizing beam splitter 213A to come into the receiver 204F. The second polarized light component (measuring beam) of the first beam LF1 passes along the polarizing beam splitter 213A, the ¼ wavelength plate 217A, the mirror member 206, and the two-surface reflecting mirror 207A, and it comes into the fixed mirror 208 of the projection optical system PL. The second polarized light component, which is reflected by the fixed mirror 208, is reflected by the reference mirror 218A via the two-surface reflecting mirror 207A and the mirror 206, and it is returned to the fixed mirror 208 again. The second polarized light component of the first beam LF1, which is returned to the fixed mirror 208, is reflected by the polarizing beam splitter 213A via the two-surface reflecting mirror 207A, the mirror member 206, and the ¼ wavelength plate 217A, and it passes along the two-surface reflecting mirror 216A to be combined with the first polarized light component to come into the receiver 204F. The X coordinate of the fixed mirror 208 of the projection optical system PL can be measured from the detection signal of the receiver 204F in accordance with the double-pass system.

Similarly, the third beam LH1 also passes through the polarizing beam splitter 213A substantially in the same manner as the first beam LF1. However, the following point differs. That is, the second beam LH1 is reflected by the fixed mirror 209 disposed on the side surface of the alignment sensor 27A, and the two polarized light components (reference beam and measuring beam) are combined to come into the receiver 204H. The X coordinate of the fixed mirror 209 of the alignment sensor 27A can be measured from the detection signal of the receiver 204H in accordance with the double-pass system.

On the other hand, the first polarized light component (reference beam) of the second beam LG1 is reflected by the polarizing beam splitter 213B to make round trip via the ¼ wavelength plate 214B and the reference mirror 215B, and then it comes into the reference mirror 215B via the polarizing beam splitter 213B and the ¼ wavelength plate 214B. The first polarized light component, which is reflected by the reference mirror 215B, is reflected by the polarizing beam splitter 213B, and it comes into the receiver 212. The second polarized light component (measuring beam) of the second beam LG1 passes along the polarizing beam splitter 213B, the ¼ wavelength plate 217B, the mirror member 206, and the two-surface reflecting mirror 207B, and it comes into the movement mirror 48AX of the wafer stage 40A. The second polarized light component, which is reflected by the movement mirror 48AX, passes along the two-surface reflecting mirror 207B, the mirror member 206, and the ¼ wavelength plate 217B, and it is reflected by the polarizing beam splitter 213B. After that, the second polarized light component is reflected by the polarizing beam splitter 213B via the two-surface reflecting mirror 216B, and it is returned to the movement mirror 48AX via the mirror member 206 and the two-surface reflecting mirror 207B. The second polarized light component, which is reflected by the movement mirror 48AX, passes along the two-surface reflecting mirror 207B, the mirror member 206, the ¼ wavelength plate 217B, and the polarizing beam splitter 213B, and it is combined with the first polarized light component to come into the receiver 212. The X coordinate of the movement mirror 48AX of the wafer stage 40A can be measured from the detection signal of the receiver 212 in accordance with the double-pass system.

As described above, in the exemplary arrangement shown in FIG. 28, the three-axis interferometer is provided in order to measure the X coordinate XW1 of the wafer stage 40A (movement mirror 48AX), the X coordinate XA1 of the alignment sensor 27A (fixed mirror 209), and the X coordinate XPL1 of the projection optical system PL (fixed mirror 208). Therefore, when the position of the wafer stage 40A in the X direction is measured during the exposure on the basis of the projection optical system PL, the value (=XW1−XPL1), which is obtained after subtracting the X coordinate XPL1 of the projection optical system PL from the X coordinate XW1 of the wafer stage 40A, may be used for the new X coordinate of the wafer stage 40A.

On the other hand, when the position of the wafer stage 40A in the X direction is measured on the basis of the alignment sensor 27A during the alignment for the wafer W1, the value (=XW1−XPL1) described above may be used as it is, as a first method. In order to correct the variation amount of the spacing distance between the alignment sensor 27A and the projection optical system PL so that the position of the wafer stage 40A in the X direction is measured more highly accurately, the X coordinate XA1 of the alignment sensor 27A is firstly subtracted from the X coordinate XPL1 of the projection optical system PL to determine the spacing distance DX2 (=XPL1−XA1) in the X direction between the alignment sensor 27A and the projection optical system PL. Subsequently, the value (=XW1−DX2), which is obtained by subtracting the spacing distance DX2 from the X coordinate XW1 of the wafer stage 40A, is regarded to be the new X coordinate of the wafer stage 40A. Accordingly, even when the spacing distance DX2 is varied due to any vibration or the like, the position of the wafer stage 40A in the X direction can be measured highly accurately on the basis of the alignment sensor 27A.

In the exemplary arrangement shown in FIG. 28, the height in the Z direction of the apex is identical between the two two-surface reflecting mirrors 207A, 207B. Therefore, for example, even when the sensor attachment plate 160 is inclined, only the secondary error (so-called cosine error) of the angle of inclination θ is generated between the measured value of the X coordinate of the fixed mirror 208, 209 and the measured value of the X coordinate of the movement mirror 48AX. The measurement accuracy of the position of the wafer stage 40A is maintained to be high. Further, in the exemplary arrangement shown in FIG. 28, even when the alignment sensor 27A and the sensor attachment plate 160 (base pedestal for the interferometer) are inclined in an integrated manner, no measurement error is generated, because the angle of inclination of the alignment sensor 27A (collapse amount of telecentricity) is the same as the angle of inclination of the wafer interferometer 201A.

The reticle stage system RST and the wafer stage system WST of the embodiment described above are based on the double-holder system or the double-stage system, in which the high throughput is obtained. However, for example, when it is intended to further miniaturize the exposure apparatus, it is also preferable that at least one of the reticle stage system and the wafer stage system resides in a single stage based on the single-holder system. The present invention is also applicable to this case. Details of the double-stage system are disclosed, for example, in International Publication WO98/24115 filed by the present applicant. This patent document is incorporated herein by reference.

The frame mechanism of the present invention is not limited to the structure shown in FIG. 1. In place of the arrangement in which the wafer base 39 and the column 33 to install the projection optical system PL thereon are provided on the base plate 32 supported by the vibration-preventive pedestals 31A to 31D, for example, it is also preferable that the column 33 and the wafer base 39 are supported by different vibration-preventive pedestals respectively. In the embodiment described above, the wafer base 39 is arranged separately from the column 33. However, for example, the following arrangements may be also available. That is, the wafer base 39 is supported by the column 33 by the aid of the vibration-preventive pedestals 36, or the wafer base 39 is allowed to hang on the support plate 37 by the aid of a frame or the like. In this arrangement, the vibration-preventive pedestals 31A to 31D for supporting the base plate 32 may be omitted. In addition thereto or singly, a vibration-preventive mechanism may be provided between the wafer base 39 which is supported by the vibration-preventive pedestal 36 and the support plate 37 to which the projection optical system PL is fixed. Further, it is also preferable that only the finely movable stage of the reticle stage 24 is arranged on the support plate 35, and the coarsely movable stage is provided on another base member different from the column 33. In the embodiment described above, the substantially whole region of the optical path through which the exposure light beam IL passes is filled with the purge gas. However, only a part thereof, for example, only the projection optical system and the illumination optical system may be filled with the purge gas, depending on the exposure wavelength. Alternatively, it is unnecessary to provide the mechanism for recovering the purge gas. Further, in the embodiment described above, the reticle chamber 23 and the wafer chamber 38 are the air-tight chambers. However, they may be simple casings when the purge gas is not supplied to the inside thereof.

Next, explanation will be made with reference to FIG. 30 for an example of the process for producing a semiconductor device based on the use of the projection exposure apparatus of the embodiment described above.

Figure 30:
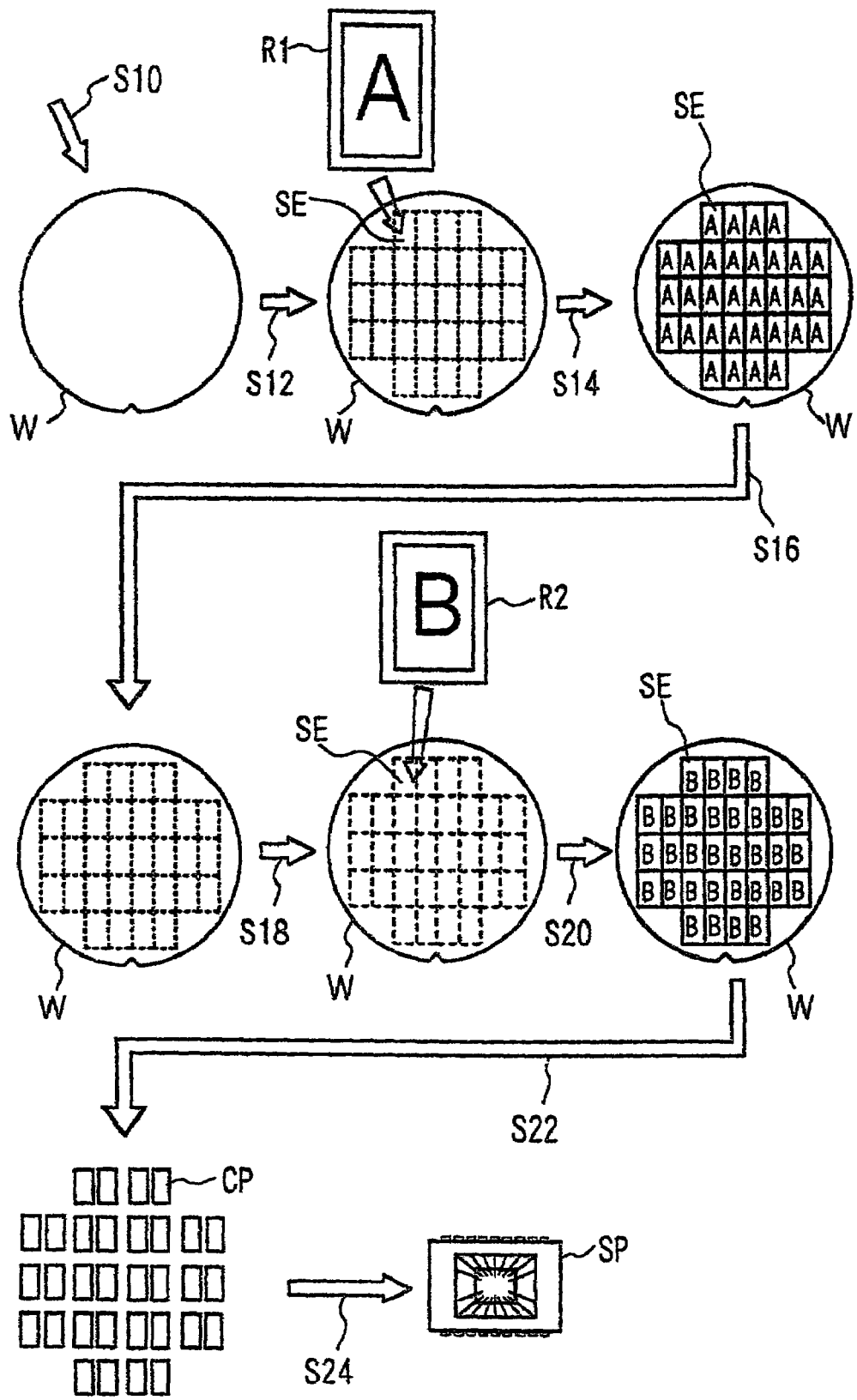
FIG. 30 shows exemplary production steps for a semiconductor device, based on the use of the exemplary projection exposure apparatus according to the embodiment of the present invention.

FIG. 30 shows exemplary steps for producing a semiconductor device. In FIG. 30, the wafer W is firstly produced, for example, from silicon semiconductor. After that, photoresist is applied onto the wafer W (step S10). In the next step S12, the reticle R1 shown in FIG. 1 is moved to the position under the illumination area so that all of the shot areas SE on the wafer W are subjected to scanning exposure with a pattern (indicated by the symbol A) on the reticle R1. The wafer W is, for example, a wafer having a diameter of 300 mm (12-inch wafer). The size of the shot area SE resides in, for example, a rectangular area having a width of 25 mm in the non-scanning direction and a width of 33 mm in the scanning direction. Subsequently, in the step S14, a predetermined pattern is formed on the respective shot areas SE on the wafer W by performing, for example, the development, the etching, and the ion implantation.

Subsequently, in the step S16, the photoresist is applied onto the wafer W. In the step S18 to be performed thereafter, the reticle R2 in place of the reticle R1 shown in FIG. 1 is moved to the position under the illumination area so that the respective shot areas SE on the wafer W are subjected to scanning exposure with a pattern (designated by the symbol B) on the reticle R2. In the step S20, for example, the development, the etching, and the ion implantation are performed for the wafer W. Thus, a predetermined pattern is formed on the respective shot areas on the wafer W.

The steps ranging from the exposure step to the pattern formation step described above (step S16 to step S20) are repeated in a necessary number of times required to produce a desired semiconductor device. For example, the dicing step (step S22) for separating one by one the respective chips CP on the wafer W, the bonding step, and the packaging step (step S24) are performed. Thus, the semiconductor device SP as a product is produced.

In the embodiment described above, the present invention is applied to the projection exposure apparatus based on the scanning exposure system. However, the present invention is not limited thereto. The present invention is equivalently applicable even in the case of the projection exposure apparatus of the full field exposure type (static exposure type) such as those based on the step-and-repeat system, the exposure apparatus based on the proximity system, the exposure apparatus to use the EUV light beam such as the X-ray as the exposure light beam, and the charged particle beam exposure apparatus to use the electron beam or the ion beam (energy beam) as the light source (energy source).

The way of the use of the exposure apparatus is not limited to the exposure apparatus for producing the semiconductor element. For example, the present invention is also widely applicable to the exposure apparatus for the liquid crystal element formed on the angular type glass plate and the display device such as the plasma display, and the exposure apparatus for producing a variety of devices such as the image pickup device (for example, CCD), the micromachine, the thin film magnetic head, and the DNA chip. Further, the present invention is also applicable to the exposure step (exposure apparatus) for producing the mask (for example, photomask and reticle) formed with the mask pattern for various devices by using the photolithography step.

When the linear motor is used for the wafer stage system or the reticle stage system, the movable stage may be held in accordance with any system including, for example, the air-floating type based on the use of the air bearing and the magnetically floating type.

It is a matter of course that the present invention is not limited to the embodiments described above, which may be embodied in other various forms without deviating from the gist or essential characteristics of the present invention.

According to the exposure method and the exposure apparatus of the present invention, even when the stage system is assembled in accordance with the module system, it is possible to deliver the first object or the second object to the stage system in the correct positional relationship.

Therefore, it is easy to assemble and adjust the stage system, and it is possible to assemble and adjust the entire exposure apparatus easily and quickly.

When the covering member for covering the space between the stage chamber and the transport chamber is provided, when the gas for transmitting the exposure light beam is supplied to the inside of the stage chamber, then the gas is effectively utilized, and thus it is possible to maintain a high concentration of the gas on the optical path thereof.

According to the exposure method and the exposure apparatus of the present invention, the positional adjustment is performed for the first object or the second object during the transport. Accordingly, the positional adjustment accuracy for the stage system is improved. Therefore, it is possible to construct the stage system in accordance with the module system, and it is possible to assemble and adjust the entire exposure apparatus easily and quickly.

According to the exposure method and the exposure apparatus of the present invention, it is possible to miniaturize the stage system or the measuring system. Therefore, when the stage system or the like is assembled by adopting the module system, it is possible to decrease the installation area of the exposure apparatus.

According to the exposure apparatus of the present invention, the following advantage is obtained. That is, it is possible to easily assemble the stage system, for example, in accordance with the module system, and it is possible to highly accurately measure the positional relationship between the stage system and the projection system.

According to the method for producing the device concerning the present invention, it is possible to produce a variety of devices at low cost or at a high throughput by using the exposure method of the present invention.

What is claimed is:

1. An exposure method for exposing one of a first object and a second object with an exposure light beam passing through the other of the first object and the second object by using an exposure apparatus provided with an airtight stage chamber in which a movable stage is provided, the exposure method comprising:
   importing the second object into the airtight stage chamber, wherein an inner wall of a member which forms the airtight stage chamber is formed of or coated with a material involving little gas release;
   detecting, before the second object is installed on the movable stage, a position of the second object with respect to the movable stage by using a detecting system provided in the airtight stage chamber;
   adjusting the position of the second object with respect to the movable stage in the airtight stage chamber based on a result of the detecting;
   installing, on the movable stage, the second object which has been adjusted;
   moving the movable stage to adjust the position of the second object with respect to an exposure position; and
   exposing one of the first object and the second object with the exposure light beam passing through the other of the first object and the second object.

2. The exposure method according to claim 1, wherein:
   the step of importing the second object into the airtight stage chamber is performed by a transport system of the exposure apparatus, the transport system being accommodated in an airtight transport chamber of the exposure apparatus; and further comprising:
   substantially isolating a space between the airtight stage chamber and the airtight transport chamber from outside air;
   supplying a gas, through which the exposure light beam is transmitted, into the airtight stage chamber and the airtight transport chamber; and
   managing the supply of the gas so that an allowable value of a concentration of an impurity in the gas is higher in the airtight transport chamber than in the airtight stage chamber.

3. The exposure method according to claim 1, wherein:
   the exposure apparatus includes another movable stage which is different from the movable stage, and another airtight stage chamber which is different from the airtight stage chamber and which accommodates the another stage; and
   the exposure method further comprises importing the first object into the another airtight stage chamber; adjusting a position of the first object with respect to the another movable stage in the another airtight stage chamber; installing, on the another movable stage, the first object which position has been adjusted; and moving the another movable stage to adjust the position of the first object with respect to the exposure position.

4. The exposure method according to claim 1, wherein the airtight stage chamber and the movable stage of the exposure apparatus are incorporated into the exposure apparatus in accordance with a module system.

5. The exposure method according to claim 1, wherein the first object is a mask on which a pattern is formed, and the second object is a substrate to which an image of the pattern is transferred.

6. A method for producing a device, comprising a step of transferring a mask pattern onto a workpiece by using the exposure method as defined in claim 1.

7. An exposure method for exposing one of a first object and a second object with an exposure light beam passing through the other of the first object and the second object, the exposure method comprising:
   transporting the second object to a movable stage by the aid of a transport system;
   adjusting a position of the second object with respect to the transport system on a contour basis in an airtight chamber in which the transport system is located during the transport of the second object to the movable stage by the aid of the transport system, wherein an inner wall of a member which forms the airtight chamber is formed of or coated with a material involving little gas release;
   transporting the second object, of which position has been adjusted in the airtight chamber, to the movable stage through a space in which air-tightness is maintained; and
   exposing one of the first object and the second object transported to the movable stage with the exposure light beam passing through the other of the first object and the second object.

8. The exposure method according to claim 7, further comprising adjusting a position of the second object with respect to the movable stage to place the second object on the movable stage after the positional adjustment with respect to the transport system; and adjusting of the second object placed on the movable stage with respect to the exposure light beam on the basis of a positional adjustment mark formed on the second object.

9. The exposure method according to claim 8, wherein the positional adjustment for the second object with respect to the transport system or the movable stage is performed on a contour basis of the second object.

10. The exposure method according to claim 7, wherein the first object is a mask formed with a pattern, the second object is a photosensitive substrate to which the pattern is transferred, and temperature adjustment is performed for the second object during a period between the positional adjustment for the second object with respect to the transport system and positional adjustment for the second object with respect to the movable stage.

11. The exposure method according to claim 7, wherein the movable stage is incorporated into an exposure apparatus in accordance with a module system.

12. A method for producing a device, comprising a step of transferring a mask pattern onto a workpiece by using the exposure method as defined in claim 7.

13. An exposure apparatus for exposing one of a first object and a second object with an exposure light beam passing through the other of the first object and the second object, the exposure apparatus comprising:
    a movable stage which adjusts a position of the second object; and
    a transport system which is arranged in an airtight transport chamber, an inner wall of which is formed of or coated with a material involving little gas release, and which transports the second object to the movable stage through a space in which air-tightness is maintained, wherein the transport system includes:
    a handling mechanism which has two or more degrees of freedom of displacement for incorporating the second object from the outside;
    a contour-detecting system which detects position information on a contour of the second object held by the handling mechanism; and
    an arm mechanism which has at least one degree of freedom of displacement for transporting the second object delivered from the handling mechanism in a direction toward the movable stage.

14. The exposure apparatus according to claim 13, wherein:
    the handling mechanism includes a rotary stand, a first hand which is rotatably fixed on the rotary stand, and a second hand which is rotatably provided at a tip of the first hand and which has its tip at which the second object is held; and
    the arm mechanism includes an arm which holds the second object, and a driving unit which drives the arm in a direction toward the movable stage.

15. The exposure apparatus according to claim 13, further comprising a temperature control system which adjusts temperature of the second object delivered from the handling mechanism.

16. The exposure apparatus according to claim 13, further comprising:
    an airtight stage chamber which is included in the airtight transport chamber and which accommodates the movable stage;
    an airtight first transport chamber which accommodates the handling mechanism; and
    an airtight second transport chamber which accommodates the arm mechanism, wherein:
    closable openings are formed respectively between the airtight second transport chamber and the airtight stage chamber, between the airtight first transport chamber and a transport line for the second object, and between the airtight first transport chamber and the airtight second transport chamber.

17. The exposure apparatus according to claim 16, wherein the closable opening formed between the airtight second transport chamber and the airtight stage chamber is smaller than the closable opening formed between the airtight first transport chamber and the airtight second transport chamber.

18. The exposure apparatus according to claim 16, further comprising, in the airtight second transport chamber, a temperature control unit which adjusts temperature of the second object.

19. The exposure apparatus according to claim 13, wherein the movable stage is incorporated into the exposure apparatus in accordance with a module system.

20. An exposure method for exposing a substrate with an exposure light beam by using an exposure apparatus provided with an airtight stage chamber in which a movable stage is provided, the exposure method comprising:
    importing the substrate into the airtight stage chamber, wherein an inner wall of a member which forms the airtight stage chamber is formed of or coated with a material involving little gas release;
    detecting, before the substrate is installed on the movable stage, a position of the substrate with respect to the movable stage by using a detecting system provided in the airtight stage chamber;
    adjusting the position of the substrate with respect to the movable stage in the airtight stage chamber based on a result of the detecting;
    installing, on the movable stage, the substrate which has been adjusted;
    moving the movable stage to adjust the position of the substrate with respect to an exposure position; and
    exposing the substrate with the exposure light beam.

21. An exposure method for exposing a substrate with an exposure light beam, the exposure method comprising:
    transporting the substrate to a movable stage by the aid of a transport system;
    adjusting a position of the substrate with respect to the transport system on a contour basis in an airtight chamber in which the transport system is located during the transport of the substrate to the movable stage by the aid of the transport system, wherein an inner wall of a member which forms the airtight chamber is formed of or coated with a material involving little gas release;
    transporting the substrate, of which position has been adjusted in the airtight chamber, to the movable stage through a space in which air-tightness is maintained; and
    exposing the substrate transported to the movable stage with the exposure light beam.

22. An exposure apparatus for exposing a substrate with an exposure light beam, the exposure apparatus comprising:
    a movable stage which adjusts a position of the substrate; and
    a transport system which is arranged in an airtight transport chamber, an inner wall of which is formed of or coated with a material involving little gas release, and which transports the substrate to the movable stage through a space in which air-tightness is maintained, wherein the transport system includes:

a handling mechanism which has two or more degrees of freedom of displacement for incorporating the substrate from the outside;

a contour-detecting system which detects position information on a contour of the substrate held by the handling mechanism; and an arm mechanism which has at least one degree of freedom of displacement for transporting the substrate delivered from the handling mechanism in a direction toward the movable stage.

* * * * *